(12) United States Patent
Nakazawa et al.

(10) Patent No.: US 7,135,387 B2
(45) Date of Patent: Nov. 14, 2006

(54) METHOD OF MANUFACTURING SEMICONDUCTOR ELEMENT

(75) Inventors: Haruo Nakazawa, Nagano (JP); Mitsuaki Kirisawa, Nagano (JP); Kazuo Shimoyama, Nagano (JP)

(73) Assignee: Fuji Electric Device Technology Co., Ltd. (JP)

( * ) Notice: Subject to any disclaimer, the term of this patent is extended or adjusted under 35 U.S.C. 154(b) by 128 days.

(21) Appl. No.: 10/876,788

(22) Filed: Jun. 24, 2004

(65) Prior Publication Data

US 2005/0059263 A1    Mar. 17, 2005

(30) Foreign Application Priority Data

Jun. 24, 2003  (JP)  ............................. 2003-179725
Jan. 7, 2004   (JP)  ............................. 2004-001670

(51) Int. Cl.
  *H01L 21/322*  (2006.01)
  *H01L 21/336*  (2006.01)
  *H01L 21/87*   (2006.01)
  *H01L 21/00*   (2006.01)

(52) U.S. Cl. .................. 438/473; 438/495; 438/510; 438/34; 438/35; 438/45; 438/308; 438/166; 438/466; 438/469; 438/535; 438/540; 438/795; 257/E21.043

(58) Field of Classification Search ............... 438/473, 438/495, 510, 34, 35, 45, 308, 166, 466, 438/469, 535, 540, 795
See application file for complete search history.

(56) References Cited

U.S. PATENT DOCUMENTS 5,569,624 A * 10/1996 Weiner ........................ 438/285
6,534,380 B1 * 3/2003 Yamauchi et al. .......... 438/455
6,759,301 B1   7/2004 Takei et al.
6,765,229 B1 * 7/2004 Zhang et al. ................. 257/57

(Continued)

FOREIGN PATENT DOCUMENTS

JP    5-62924 A    3/1993

(Continued)

OTHER PUBLICATIONS

Akira Nakada et al.; "Influence of flourine in $BF_2{}^+$ implantation on the formation of ultrashallow and low-leakage silicon $p^{30}n$ junction by 450-500° C. annealing"; J. Appl. Phys.; vol. 81, No. 6; Mar. 15, 1997; pp. 2560-2565.

(Continued)

*Primary Examiner*—Michael Lebentritt
*Assistant Examiner*—Mohsen Ahmadi
(74) *Attorney, Agent, or Firm*—Rossi, Kimms & McDowell, LLP

(57) ABSTRACT

A method for stably activating pn-successive layers in a semiconductor element in a short time is disclosed. Pulsed beams, each of which has a pulse shape that is approximately rectangular, are projected from respective laser irradiation devices and successively combined into a pulsed beam equivalent to one pulse, with which the doped layer region is irradiated. By successively projecting the pulsed beams onto the doped layer region in this way, an effect is obtained which is the same as that of irradiating the doped layer region with a single pulsed beam having a long full-width at half maximum. A high activation ratio from a shallow region to a deep region of the doped layer region is enabled. This can stably activate the semiconductor element having the pn-successive layers as the doped layer region in a short time, making possible the manufacture of semiconductor elements having superior device characteristics.

14 Claims, 41 Drawing Sheets

U.S. PATENT DOCUMENTS 6,818,568 B1 * 11/2004 Tanaka ................ 438/795

FOREIGN PATENT DOCUMENTS

| JP | 10-275781 A | 10/1998 |
| JP | 2000-349042 A | 12/2000 |
| JP | 2001-156018 A | 6/2001 |
| JP | 2001-177114 A | 6/2001 |
| JP | 2001-185504 A | 7/2001 |
| JP | 2002-520885 A | 7/2002 |
| JP | 2003-059856 * | 2/2003 |
| JP | 2003-59856 A | 2/2003 |
| JP | 2004-282060 * | 2/2003 |
| JP | 2003-109912 A | 4/2003 |
| JP | 2003-317412 A | 11/2003 |
| JP | 2006-005178 A | 1/2006 |
| WO | 00/04596 | 1/2000 |

OTHER PUBLICATIONS

Michio Nemoto et al.; "An Advanced FWD Design Concept with Superior Soft Reverse Recovery Characteristics", ISPSO, May 2000, pp. 119-122, France.

Related co-pending U.S. Appl. No. 11/464,489, Michio Nemoto et al.; Method of Manufacturing Semiconductor Device and Semiconductor Device Formed by the Method; Spec. pp. 1-21, Figs 1-8.

* cited by examiner

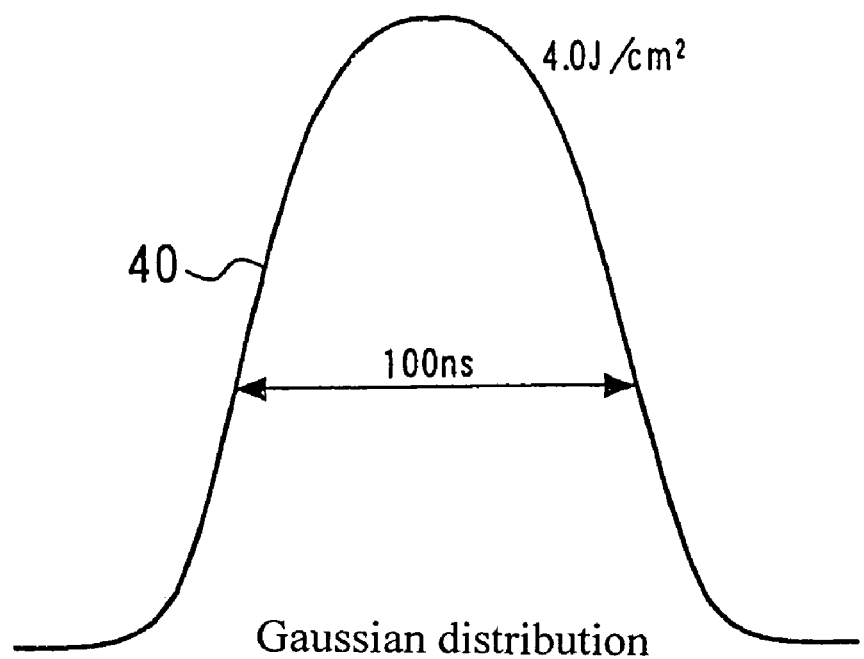
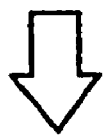
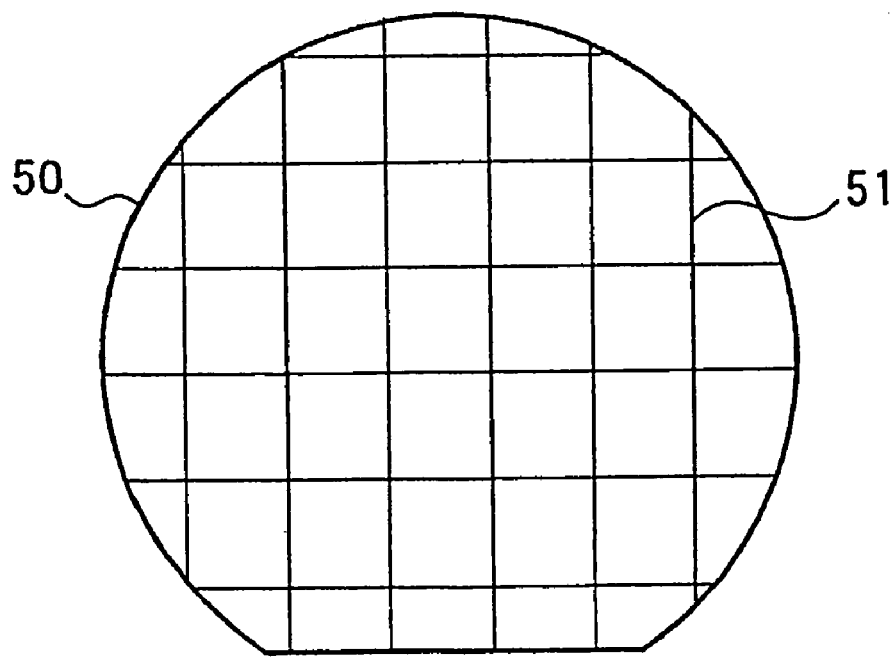
Fig. 16

METHOD OF MANUFACTURING SEMICONDUCTOR ELEMENT

CROSS REFERENCE TO RELATED APPLICATIONS

This application claims priority from application Serial No. JP 2003-179725 filed on Jun. 23, 2003 and JP 2004-001670, filed on Jan. 7, 2004, and the contents of these two documents are incorporated herein by reference in their entirety.

BACKGROUND OF THE INVENTION

A. Field of the Invention

The present invention relates to a method of manufacturing a semiconductor element, and more particularly to a method of manufacturing a semiconductor element such as an IC (integrated circuit), a MOS (metal oxide semiconductor) or an insulated gate bipolar transistor (hereinafter referred to as an "IGBT").

B. Description of the Related Art

In recent years, integrated circuits (ICs) have been most commonly used in important sections in a computer or a communication device. In such ICs, a number of transistors and resistors are connected so as to form electric circuits that are integrated onto one chip. Of these ICs, those including power semiconductor elements are referred to as power ICs.

An IGBT is a power element provided with both the high speed switching and voltage driving characteristics of a MOSFET and the low on-voltage characteristic of a bipolar transistor. The IGBT has been expanding from industrial applications, which include devices such as general-purpose inverters, AC servo devices, uninterruptible power sources (UPS) and switching power sources, to consumer applications, which include devices such as microwave ranges, electric rice cookers and strobes. Development directed to next generation IGBTs also is proceeding. An IGBT having a new chip structure with an even lower on-voltage has been developed, so that devices using such IGBTs have reduced loss and enhanced efficiency.

IGBT structures may be mainly classified into punch through (PT) type, non punch through (NPT) type and field stop (FS) type. Furthermore, almost all currently mass-produced IGBTs have an n-channel type vertical double diffused structure except for those having a p-channel type structure used for audio power amplifiers. In the following the term "IGBT" refers to as an n-type IGBT, unless otherwise specified.

A PT type IGBT has a structure in which an $n^+$-layer (n-buffer layer) is provided between a $p^+$-epitaxial substrate and an $n^-$-layer (n-type active layer) to allow a depletion layer in the n-type active layer to reach the n-buffer layer. This is the basic structure for main stream IGBTs. However, for an IGBT of 600V breakdown voltage series, although the n-type active layer need have a thickness only of the order of 70 µm, the total thickness including the $p^+$-epitaxial substrate part may become as thick as of the order of 200 µm to 300 µm. This leads to development of the NPT type IGBT and the FS type IGBT. In each type, no epitaxial substrate is used. Instead, an FZ substrate is used that is formed from a crystal prepared by the FZ (Floating Zone) method to form therein a shallow $p^+$-collector layer doped with a low dose for being thinned and provided at reduced cost.

FIG. 34 is a view showing an example of a cross sectional structure of an NPT type IGBT. NPT type IGBT 100 shown in FIG. 34 has a structure in which $n^-$-type FZ (FZ-N) substrate 101 has gate electrode 103 of a material such as polysilicon formed on the top surface and gate oxide film 102 of a material such as $SiO_2$ provided between the substrate and the gate electrode. In this structure, top surface electrode 105 of an aluminum silicon film, for example, is further formed on gate electrode 103 with interlayer insulator film 104 of a material such as BPSG (borophosphosilicate glass) provided between the top surface electrode and the gate electrode. On the top surface side of FZ-N substrate 101, $p^+$-base layer 106 and $n^+$-emitter layer 107 in $p^+$-base layer 106 are formed. On the bottom surface side of FZ-N substrate 101 is formed $p^+$-collector layer 108 on which bottom surface electrode 109 is formed by laminating several kinds of metal films.

In NPT type IGBT 100 with such a structure, for the $p^+$-collector layer 108, a shallow low-level injection $p^+$-collector is used which is doped with a low dose. In NPT type IGBT 100, no epitaxial substrate is used to make the total thickness thereof significantly less as compared with that of the above-described PT type IGBT.

In the NPT structure, hole injection rate can be controlled to enable high-speed switching without performing lifetime control of holes. The value of an on-voltage, being dependent on a thickness and specific resistance of an n-type active layer, becomes a little higher. The use of the FZ substrate instead of the above-described $p^+$-epitaxial substrate allows a chip with the NPT structure to be produced at reduced cost.

FIG. 35 is a view showing an example of a cross sectional structure of an FS type IGBT. In FIG. 35, the same constituents as those shown in FIG. 34 are denoted by the same reference numerals and signs with detailed explanations thereof omitted.

For FS type IGBT 200 shown in FIG. 35, as for the above-described NPT type IGBT, FZ-N substrate 101 is used instead of the above-described $p^+$-epitaxial substrate, with the total thickness thereof becoming on the order of 100 µm to 200 µm. As in the PT type IGBT, the n-type active layer is made to have a thickness on the order of 70 µm according to a breakdown voltage and is made depleted. For this purpose, in FS type IGBT 200, on the bottom surface of FZ-N substrate 101, an $n^+$-layer (n-buffer layer) 201 is formed, on which $p^+$-collector layer 108 and bottom surface electrode 109 are formed. In FS type IGBT 200, as in the above-described IGBT 100, lifetime control is unnecessary.

In order to lower on-voltage, a type of IGBT is used in which an IGBT with a trench structure, having a narrow and deep trench formed on the top surface of the IGBT together with a MOS gate formed on the side wall of the trench, is combined with an IGBT of an FS structure. Recently, total thickness reduction by design optimization also has been carried out.

Using the FS type IGBT 200 shown in the above-described FIG. 35 as an example, one example of a method of forming an IGBT will be explained with reference to FIG. 35 to FIG. 40. FIG. 36 is a cross sectional view taken after a top surface side process has been completed. FIG. 37 is a cross sectional view showing a substrate grinding process. FIG. 38 is a cross sectional view showing a bottom surface side ion implantation process. FIG. 39 is a cross sectional view showing a bottom surface annealing process. FIG. 40 is a cross sectional view showing a top surface electrode film forming process. In FIG. 36 to FIG. 40, the same constituents as those shown in FIG. 34 and FIG. 35 are denoted by the same reference numerals and signs with detailed explanations thereof omitted.

The processes of forming FS type IGBT 200 may be roughly classified into a top surface side process and a bottom surface side process. First, an explanation will be made about the top surface side process with reference to FIG. 36.

In the top surface side process, $SiO_2$ and polysilicon are first deposited in this order on the top surface side of FZ-N substrate 101. The deposited $SiO_2$ and polysilicon are then processed to form a window that penetrates gate oxide film 102 and gate electrode 103, respectively. Following this, BPSG is deposited on the surface thereof. The deposited BPSG is then processed to form a window into interlayer insulator film 104. This makes an insulated gate structure formed on the top surface side of FZ-N substrate 101.

Next, $p^+$-base layer 106 is formed on the top surface side of the FZ-N substrate 101 and $n^+$-emitter layer 107 is also formed. Furthermore, an aluminum silicon film is deposited so that it is in contact with $n^+$-emitter layer 107. This layer is top surface electrode 105 that is to become the emitter electrode. The aluminum silicon film is thereafter heat-treated at a low temperature on the order of 400° C. to 500° C. to realize an interconnection with stable compatibility and low resistance.

Although its illustration was omitted in FIG. 35 and FIG. 36, an insulator protective film is formed on the top surface electrode 105 using a material such as polyimide so as to cover the surface of electrode 105.

Next, an explanation will be made about the bottom surface side process with reference to FIG. 37 to FIG. 40. In the bottom surface side process, as shown in FIG. 37, FZ-N substrate 101 is first thinned from the bottom surface to a desired thickness by carrying out back grinding or etching to produce a thinned wafer.

Next, as shown in FIG. 38, phosphorus ions ($P^+$) and boron ions ($B^+$) are implanted in this order onto the bottom surface side of FZ-N substrate 101 to form $n^+$-layer 201a and $p^+$-layer 108a, which are thereafter heat-treated (annealed) at a low temperature of 350° C. to 500° C. in an electric furnace. This activates phosphorus-implanted $n^+$-layer 201a and boron-implanted $p^+$-layer 108a to form $n^+$-buffer layer 201 and $p^+$-collector layer 108, respectively, on the bottom surface side of FZ-N substrate 101, as shown in FIG. 39.

Thereafter, as shown in FIG. 40, bottom surface electrode 109 is formed on the surface of $p^+$-collector layer 108. It is made up of a combination of metal layers such as an aluminum layer, a titanium layer, a nickel layer and a gold layer.

Finally, the wafer is subjected to dicing into chip-like pieces. Then, in each of the chip-like pieces, aluminum wire electrodes are fixed by means of an ultrasonic wire bonder onto the surface of top surface electrode 105. Bottom surface electrode 109 is connected to a specified fixing piece with a solder layer provided between.

In recent years, a matrix converter that carries out direct AC to AC conversion without intervention of a direct current has been spotlighted. Unlike previous inverters, the matrix converter requires no capacitor to reduce supply harmonics. However, an alternating current input requires a semiconductor switch to have a high reverse breakdown voltage. Thus, use of an IGBT of this previous type needed a reverse-blocking diode connected in series thereto.

FIG. 41 is a view showing an example of a cross sectional structure of a reverse-blocking IGBT. In FIG. 41, the same constituents as those shown in FIG. 34 are denoted by the same reference numerals and signs with detailed explanations thereof omitted.

As shown in FIG. 41, reverse-blocking IGBT 300 is an IGBT which has the basic performance following that of the previous type with $p^+$-isolation layer 301 further formed so as to provide a high reverse breakdown voltage. For reverse-blocking IGBT 300 having such a structure, no diode connected in series is necessary to allow conduction loss to be reduced by half. This largely contributes to enhancement of the conversion efficiency of the matrix converter. The technology of forming a deep junction with a depth of 100 μm or more and the technology of producing a very thin wafer with a thickness of 100 μm or less are combined to enable manufacture of a high performance reverse-blocking IGBT.

In manufacturing such an IGBT, however, there are many technical aspects of the manufacturing process that must be addressed in order to realize a thin IGBT with a thickness of the order of 70 μm. These include elimination of warping of the wafer that is caused by necessary processes such as bottom surface grinding, ion implantation to the bottom surface and bottom surface heat-treatment.

One of the technical aspects of the manufacturing processes is the technique of activating a p-type doped layer (p-layer) or an n-type doped layer (n-layer), which is necessary in order to form various kinds of semiconductor elements including the IGBTs shown here as examples. Various methods have been tried previously for this activation. Besides the method of using an electric furnace as described above, activation of a doped layer has been carried out by annealing using a laser. In this technique, a wafer is secured on a supporting substrate by an adhesive sheet to prevent cracking of the wafer and the wafer is irradiated with a laser beam to activate the p-layer and the n-layer. Activation may be carried out using the third harmonic of YAG (Yttrium Aluminum Garnet) laser (YAG3ω laser), and so forth (see, for example, JP-A-2003-59856 (Paragraph Nos. 0014 to 0025, FIG. 6 and FIG. 7).

Such laser annealing was formerly carried out by irradiating a wafer with a single pulse laser beam at a fixed period for each irradiation area and some laser irradiation devices and some laser annealing methods for the annealing are proposed (see, for example, JP-A-2001-185504 (Paragraph Nos. 0009 to 0014, FIG. 1 and FIG. 2); JP-A-2003-109912 (Paragraph Nos. 0033 to 0034, FIG. 2 and FIG. 3); JP-A-10-275781 (Paragraph Nos. 0014 to 0018, FIG. 2 and FIG. 3); JP-A-5-62924 (Paragraph Nos. 0012 to 0016, FIG. 1 and FIG. 2); JP-A-2001-156018 (Paragraph Nos. 0040 to 0076, FIG. 4 and FIG. 5); and JP-A-2000-349042 (Paragraph Nos. 0026, 0027 and 0034, FIG. 2, FIG. 3 and FIG. 4)). In these methods, attempts are made to adjust the period of the single pulse using a plurality of laser oscillators for laser beam sources to synthesize laser beams lasing in the respective laser oscillators (JP-A-2001-185504 is and JP-A-2003-109912), to adjust a pulse width (half-width) of a pulsed beam having a plurality of peaks (JP-A-10-275781), to increase an area of an irradiated region by carrying out simultaneous irradiation with laser beams to the same region (JP-A-5-62924), to make the distribution of the irradiation energy of a YAG laser beam uniform (JP-A-2001-156018), and to reflect back a laser beam reflected from a laser irradiation specimen by a mirror to irradiate the irradiation specimen again with the reflected back laser beam (JP-A-2000-349042).

In activating the p-layer and the n-layer, the p-layer cannot be made highly activated in the case of previous electric furnace annealing. Furthermore, in the method of using an adhesive sheet for preventing cracking of wafer, the permissible temperature of the adhesive sheet being usually 200° C. or less makes the use of the sheet impossible when the electric furnace annealing needs to be performed at 300° C. or more.

Moreover, when the p-layer and the n-layer are to be activated by laser annealing instead of electric furnace annealing, irradiation with a short single pulsed laser beam with a half-width of 100 ns or less such as a pulsed beam of an excimer laser can activate only to a shallow region from the surface. For example, in pn-successive layers on the bottom surface side of an FS type IGBT where the p-layer and the n-layer are successively provided from the bottom surface in that order, sufficient activation up to the n-layer is impossible. When irradiation is carried out with a beam of an all solid-state laser such as the YAG3ω laser used in a form of a single pulse, the irradiation, being carried out with a beam spot with a diameter of the order of 0.9 mm, for example, necessitates a long irradiation time. Thus, processing time for one wafer can be several hours. For example, annealing of a five-inch wafer takes on the order of two hours. Moreover, when one irradiation area is irradiated with a laser beam in which irradiation energy has been increased, traces of work damage by the laser irradiation sometime remain on the surface of the wafer.

A laser irradiation device carrying out irradiation with a laser beam having a wavelength in the range of 300 nm to 600 nm can activate a substrate, having impurity ions implanted therein, to a deep region without making the laser beam pass through the substrate. It is, however, not easy to newly make up a laser irradiation device that can carry out irradiation with the above laser beam in a pulse having a full-width at half maximum as long as 100 ns or more.

The present invention is directed to overcoming or at least reducing the effects of one or more of the problems set forth above.

SUMMARY OF THE INVENTION

It is an object of the present invention to provide a method of manufacturing a semiconductor element which can stably activate in a short time a region such as a p-layer, an n-layer or pn-successive layers formed as a doped layer region in the semiconductor element.

In order to solve the above problems and achieve this object, a method of manufacturing a semiconductor element includes activating a doped layer region, into which impurities are introduced, using a laser beam. The method is characterized in that, when activating the doped layer region, a plurality of laser irradiation devices each carrying out irradiation with a pulsed laser beam are used for successively irradiating the doped layer region for each irradiation area thereof with a plurality of the pulsed beams thereby to activate the doped layer region.

According to such a method of manufacturing a semiconductor element, a plurality of laser irradiation devices are used to activate a doped layer region. The doped layer region in an irradiation area is successively irradiated with a plurality of pulsed beams projected from the respective laser irradiation devices. By successively irradiating the doped layer region with the pulsed beams from a plurality of the laser irradiation devices, an effect is obtained which is the same as that of irradiating the doped layer region with a single pulsed beam having a long full-width at half maximum. This results in an annealing effect that is exerted from a shallow region to a deep region in the doped layer region.

In one aspect, the invention provides a method of activating a doped layer region containing impurities in a semiconductor element, comprising successively irradiating areas in the doped layer region with a plurality of laser irradiation devices each carrying out irradiation with a pulsed laser beam, thereby to activate the doped layer region. The doped layer region may comprise pn-successive layers, in which a p-type doped layer into which p-type impurities have been introduced and an n-type doped layer into which n-type impurities have been introduced have been successively formed. Alternatively, the doped layer region may comprise successive layers of the same conductivity type into which the same conductivity type impurity ions have been introduced with differing doses and amounts of acceleration energy. In another arrangement, the doped layer region comprises successive layers of an argon introduced layer into which argon has been introduced and a p-type doped layer into which p-type impurities have been introduced. In yet another embodiment, the doped layer region comprises successive layers of an argon introduced layer into which argon has been introduced and an n-type doped layer into which n-type impurities have been introduced. In a further embodiment, the doped layer region comprises successive layers of a silicon introduced layer into which silicon has been introduced and a p-type doped layer into which p-type impurities have been introduced. In another embodiment, the doped layer region comprises successive layers of a silicon introduced layer into which silicon has been introduced and an n-type doped layer into which n-type impurities have been introduced.

The method of activating a doped layer region may use a pulsed beam that has an energy distribution that is approximately rectangular. The irradiation preferably is carried out with pulsed beams that are overlapped so that each irradiation area in the doped layer region is irradiated with approximately the same irradiation energy density. The pulsed beams are overlapped with an overlapping ratio between 50% and 98%, preferably with an overlapping ratio between 75% and 95%.

Preferably, the pulsed laser beam has a wavelength between 300 nm and 600 nm. It is also preferable to irradiate the doped layer region successively with pulsed beams with a total irradiation energy density between about 1.2 J/cm$^2$ and 4.0 J/cm$^2$. It also is preferred that the doped layer region be successively irradiated with pulsed beams with a delay time between about 0 ns and 5000 ns. Preferably the delay time is in the range from three times to five times a full-width at half maximum of the pulsed beam.

XeCl or YAG lasers can be used. In one embodiment, the pulsed laser beam is a second harmonic of a YAG laser.

BRIEF DESCRIPTION OF THE DRAWINGS

The foregoing advantages and features of the invention will become apparent upon reference to the following detailed description and the accompanying drawings.

FIG. 16 is a schematic diagram showing a pulse shape of the Gaussian distribution and a state of an FZ-N substrate when a pulsed laser beam with the pulse shape is used.

DETAILED DESCRIPTION OF SPECIFIC EMBODIMENTS

Figure 1:
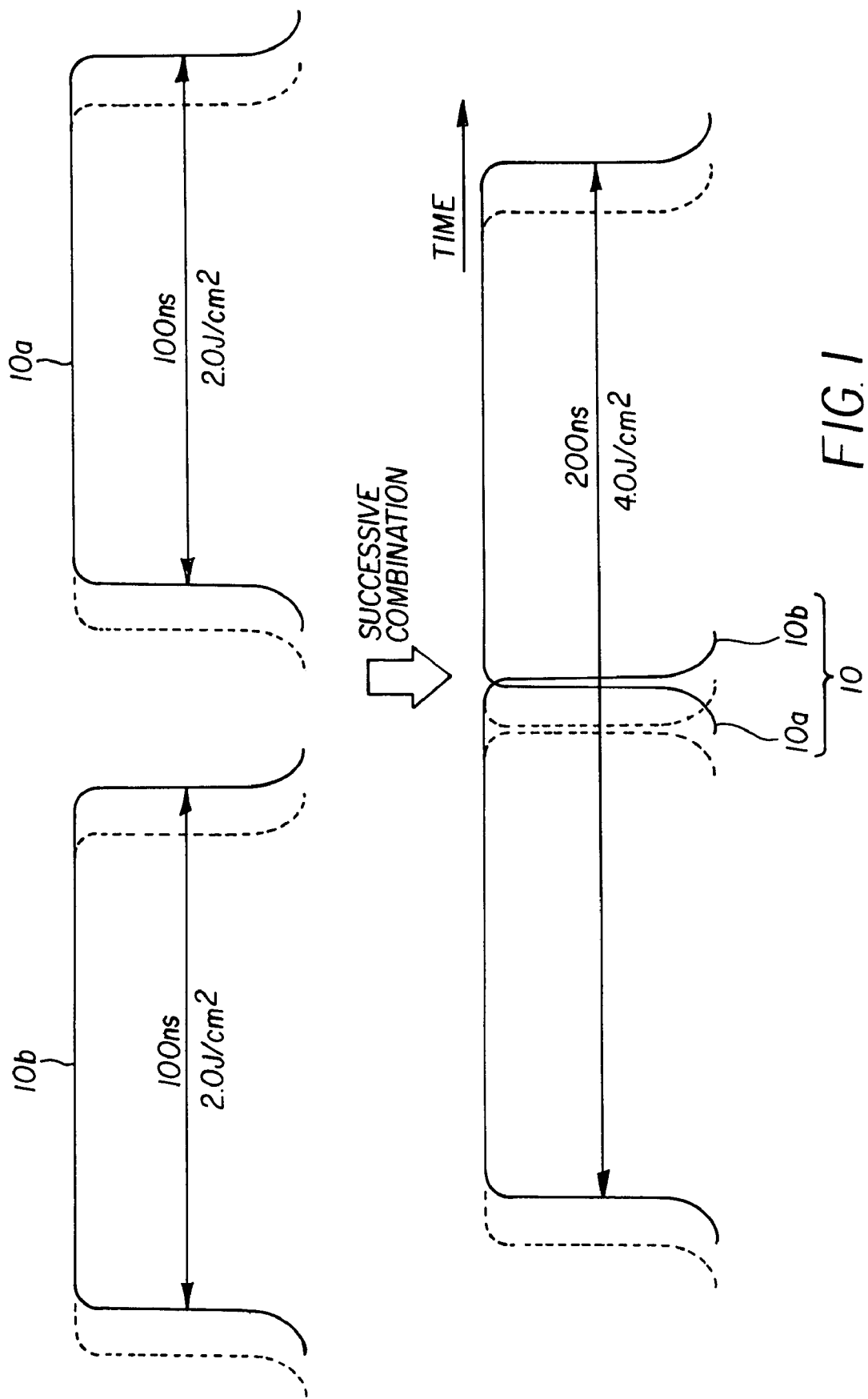
FIG. 1 is a view showing a pulse shape of equivalent one pulsed laser beam formed by successively combining in time respective pulsed laser beams projected from two laser irradiation devices.

A plurality of laser irradiation devices is used according to the present invention to laser activate a doped layer region. The doped layer region in an irradiation area is successively irradiated with a plurality of pulsed beams being projected from the respective laser irradiation devices in order to activate the doped layer region. The effect is the same as that obtained by irradiating the doped layer region with a single pulsed beam having a long full-width at half maximum to enable a high rate of activation from a shallow region to a deep region of the doped layer region. Therefore, a semiconductor element having a p-layer or an n-layer as the doped layer region and a semiconductor element having successive doped layers such as pn-successive layers as a doped layer region can be stably activated in a short time, on the order of nanoseconds, to make it possible to manufacture semiconductor elements having superior device characteristics.

In the following, modes for carrying out the invention will be explained in detail with reference to drawings.

According to a first mode, a detailed explanation will be made with the following case taken as an example. In this case, a p-type doped layer (p-layer), formed in a shallow region on the bottom surface side of an FZ-N substrate of the FS type IGBT, and an n-type doped layer (n-layer), formed in a deep region successively to the p-region, are activated by laser annealing.

Annealing of the layers is carried out by irradiating the FZ-N substrate with pulsed laser beams to activate the p-layer and the n-layer, which are doped layers formed by introducing p-type impurities and n-type impurities to the FZ-N substrate of the FS type IGBT on the bottom surface side thereof. The irradiation is carried out by successively combining (synthesizing) pulsed laser beams projected separately from a plurality of laser irradiation devices. Each of the pulsed laser beams has a wavelength between 300 nm and 600 nm. At this time, it is preferable that the pulsed laser beams are projected on the FZ-N substrate by a plurality of laser irradiation devices so that a full-width at half maximum of equivalent to one pulse, formed by successively combining the respective pulsed laser beams in time, becomes between 100 ns to 1000 ns.

Namely, a plurality of the laser irradiation devices are used so as to irradiate successively in time one irradiation area of the FZ-N substrate with a plurality of pulsed laser beams. This extends the full-width at half maximum of the equivalent one pulse formed by successively combining the respective pulsed laser beams. Thus, an effect is obtained which is the same as that when a single pulsed beam with a long full-width at half maximum is projected. As a result, the annealing effect can be exerted to a deep region of the FZ-N substrate to accelerate the activation of the doped layers, which can not only highly activate the p-layer in the shallow region but also sufficiently activate the n-layer in the deep region. Using the method, pn-successive layers in which the p-layer and the n-layer are successively formed can be activated instantaneously. Moreover, a plurality of existing devices can be used as the laser irradiation devices without requiring any special conversion.

The successive irradiation with a plurality of pulsed beams is to include, in addition to the case of irradiating one irradiation area of the FZ-N substrate with a preceding pulsed beam and a succeeding pulsed beam projected without leaving any time interval, the case of leaving a specified time interval from the projection of the preceding pulsed beam to the projection of the succeeding pulsed beam. With a time interval left between the preceding and the succeeding pulsed beams being within the specified range, it becomes possible to obtain the same effect as that obtained when the irradiation is carried out with a single pulsed beam having a long full-width at half maximum.

The reason to take the range of the wavelength of each pulsed laser beam as being from 300 nm to 600 nm is that a pulsed laser beam with a wavelength shorter than 300 nm can not activate the deep region in the FZ-N substrate, while a beam with a wavelength longer than 600 nm passes through the FZ-N substrate (630 μm thick, for example) to cause no activation. Moreover, when the full-width at half maximum of the equivalent one pulsed beam, formed by successively combining respective pulsed laser beams is 100 ns or more, enhancement in the activation ratio is possible. The reason to make the full-width at half maximum 1000 ns or less is due to a problem of providing the adequate number of laser irradiation devices required for realization of the above value of the full-width at half maximum. Namely, to increase the full-width at half maximum of the equivalent one pulsed beam formed by successively combining respective pulsed laser beams, many more laser irradiation devices are required. Therefore, extension of the full-width at half maximum to 1000 ns or more is in principle possible.

Either XeCl laser as an excimer laser or a second harmonic of the YAG laser (YAG2ω laser) as an all solid-state laser is used as the pulsed laser to carry out the annealing. Both of these lasers have pulsed outputs as large as several tens mJ/pulse (in the above-described YAG3ω laser, on the order of 1 mJ/pulse). Thus, an irradiation area of 1 mm square or more can be formed. For example, with the YAG2ω laser, an irradiation area of the order of 10 mm square can be formed, which makes a time required for annealing a five-inch wafer on the order of five minutes. This is a large difference from the YAG3ω laser.

Next, an explanation will be made about an effect of the half-value of the projected pulsed beam of the laser exerted on the activation when the pn-successive layers are activated using the XeCl laser or the YAG2ω laser. In both of the XeCl laser and the YAG2ω laser, each of the pulsed laser beams projected from a plurality of the laser irradiation devices is optically adjusted so that its pulse shape is approximately rectangular. The respective pulsed laser beams in the laser irradiation are to be projected onto the FZ-N substrate while spatially overlapped with a specified overlapping ratio so as not to cause unirradiated regions on the substrate. Here, pulsed laser beams each having an approximately rectangular spatial irradiation energy distribution are projected with a 90% overlapping ratio. Explanations will be provided later about the pulse shape and the overlapping ratio.

Figure 2:
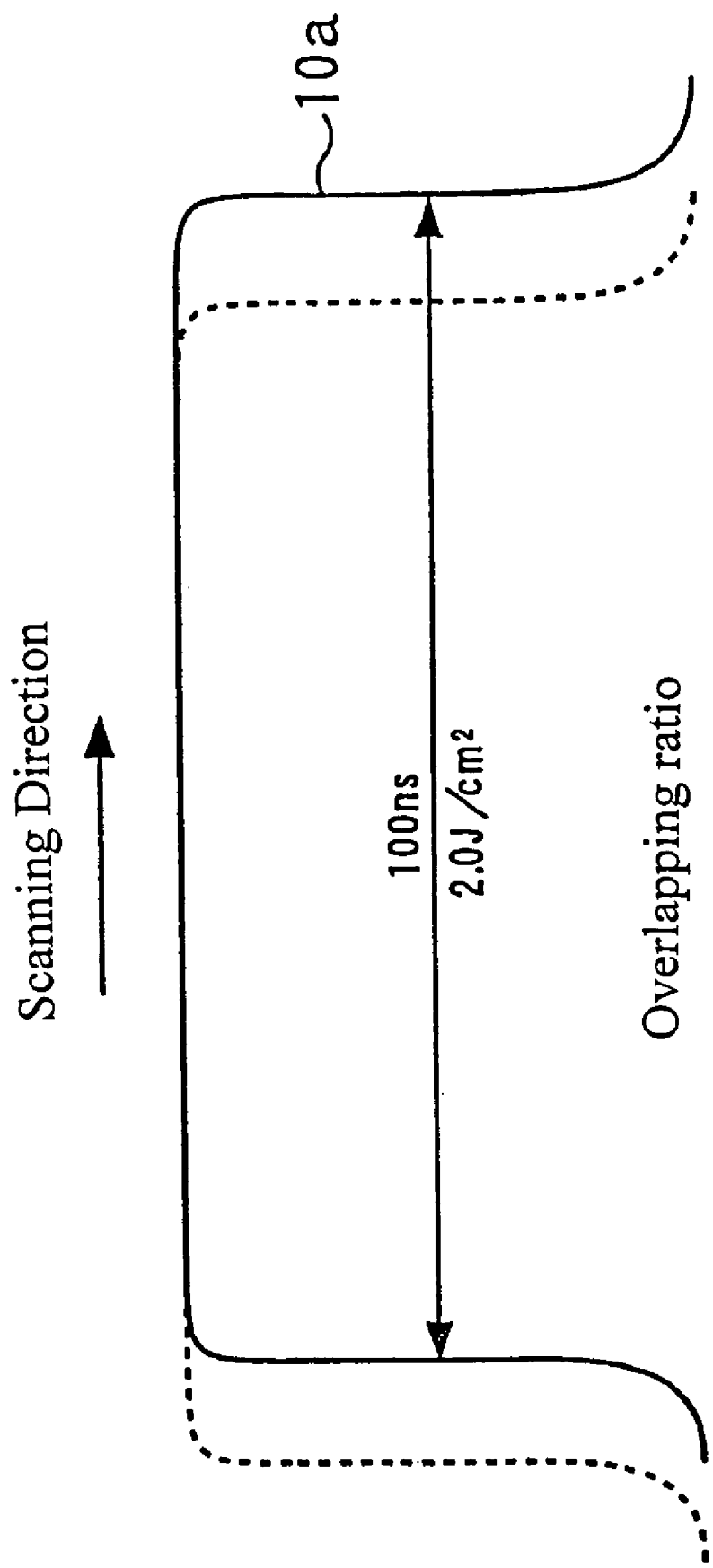
FIG. 2 is a view showing a pulse shape of a pulsed laser beam projected from a laser irradiation device.

FIG. 2 is a view showing a pulse shape of a pulsed laser beam projected from a laser irradiation device. As shown in FIG. 2, a pulsed laser beam 10a projected from one laser irradiation device is approximately rectangular both in space and in time. With such pulsed laser beam being spatially overlapped with an overlapping ratio of 90% as shown by a dotted line and a solid line, the FZ-N substrate is scanned in two directions (X and Y directions).

FIG. 1 is a view showing a pulse shape of equivalent one pulsed laser beam formed by successively combining in time respective pulsed laser beams projected from two laser irradiation devices. When two laser irradiation devices are used for projecting respective pulsed laser beams, as shown in FIG. 1, an approximately rectangular pulsed laser beam 10a from a first device and an approximately rectangular pulsed laser beam 10b from a second device are successively combined in time so as to form a pulsed laser beam 10 equivalent to one long and approximately rectangular pulse. That is, a time (delay time) from the projection of the pulsed laser beam 10a from the first device to the projection of the pulsed laser beam 10b is taken so as to be approximately the same as the full-width at half maximum of the pulsed laser beam 10a.

For example, as shown in FIG. 1, the respective pulsed laser beams 10a and 10b projected from two laser irradiation devices are equally to have a full-width at half maximum of 100 ns and an irradiation energy density of 2.0 J/cm$^2$. In this case, irradiation is carried out with a delay time between the pulsed laser beams 10a and 10b, projected from the first and second laser irradiation devices, respectively, of 100 ns. This makes the pulsed laser beam 10 equivalent to one pulsed laser beam with a full-width at half maximum of 200 ns and an irradiation energy density of 4.0 J/cm$^2$ projected onto a doped layer region in the FZ-N substrate while being made to scan the substrate in the specified direction with an overlapping ratio of 90%. The same is true when three or more laser irradiation devices are used.

In the case of using the XeCl laser for the activation, a total irradiation energy density when pulsed beams projected from a plurality of the XeCl laser irradiation devices are successively combined in time is made to become 4.0 J/cm$^2$. At this time, using two of the laser irradiation devices each carrying out irradiation with pulsed beams of the XeCl laser having a full-width at half maximum of 50 ns for one pulse, the full-width at half maximum of equivalent one pulsed beam obtained after successively combining the respective pulsed beams from the irradiation devices is made 100 ns. Using four of the laser irradiation devices, irradiation is to be carried out with pulsed beams of the XeCl laser having a full-width at half maximum of 200 ns for equivalent one pulse obtained after successively combining in time the respective pulsed beams of the XeCl laser from the irradiation devices. Moreover, using eight of the laser irradiation devices, irradiation is carried out with pulsed beam of the XeCl laser having a full-width at half maximum of 400 ns for equivalent one pulse obtained after successively combining in time the respective pulsed beams of the XeCl laser from the irradiation devices.

In the case of using the YAG2ω laser for the activation, a total irradiation energy density when pulsed beams projected from a plurality of the YAG2ω laser irradiation devices are successively combined in time to become 4.0 J/cm$^2$. Using one laser irradiation device, irradiation is carried out with pulsed beams of the YAG2ω laser having a full-width at half maximum of 100 ns for one pulse. Using two of the laser irradiation devices, irradiation is to be carried out with pulsed beams of the YAG2ω laser having a full-width at half maximum of 200 ns for equivalent one pulse obtained after successively combining in time the respective pulsed beams of the YAG2ω laser from the irradiation devices. Moreover, using four of the laser irradiation devices, irradiation is to be carried out with pulsed beams of the YAG2ω laser having a full-width at half maximum of 400 ns for equivalent one pulse obtained after successively combining in time the respective pulsed beams of the YAG2ω laser from the irradiation devices.

In both the XeCl laser and YAG2ω laser, the value of an irradiation energy density shared by one laser irradiation device is taken as a value obtained by dividing the total irradiation energy density by the number of devices. For example, for obtaining a total irradiation energy density of 4.0 J/cm$^2$ with the XeCl laser by two laser irradiation devices, the XeCl laser is projected with an irradiation energy density of 2.0 J/cm$^2$ by one laser irradiation device.

Figure 3:
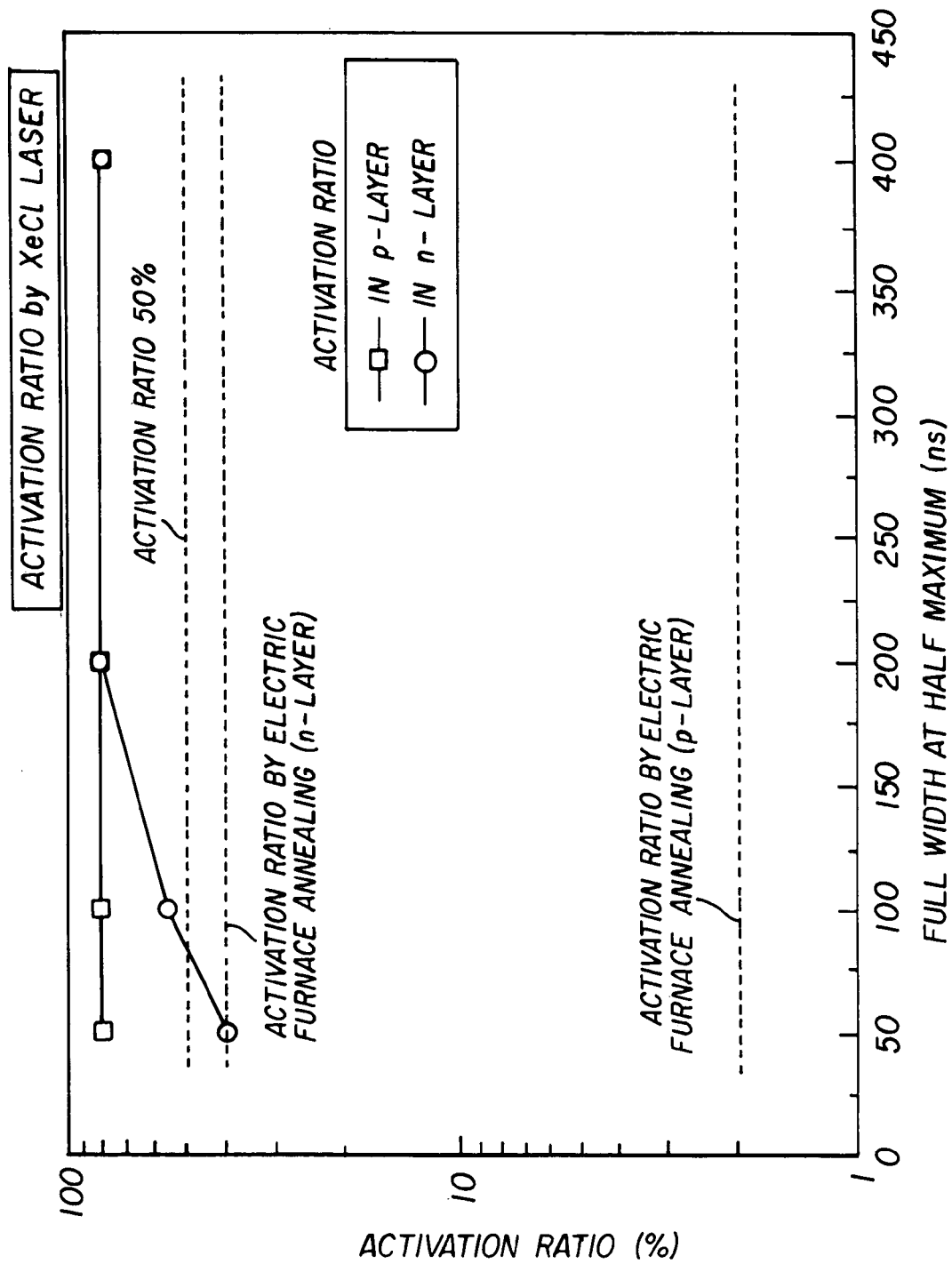
FIG. 3 is a diagram showing relationship between a full-width at half maximum of a pulsed laser beam and a rate of activation when activation is carried out using the XeCl laser.
Figure 4:
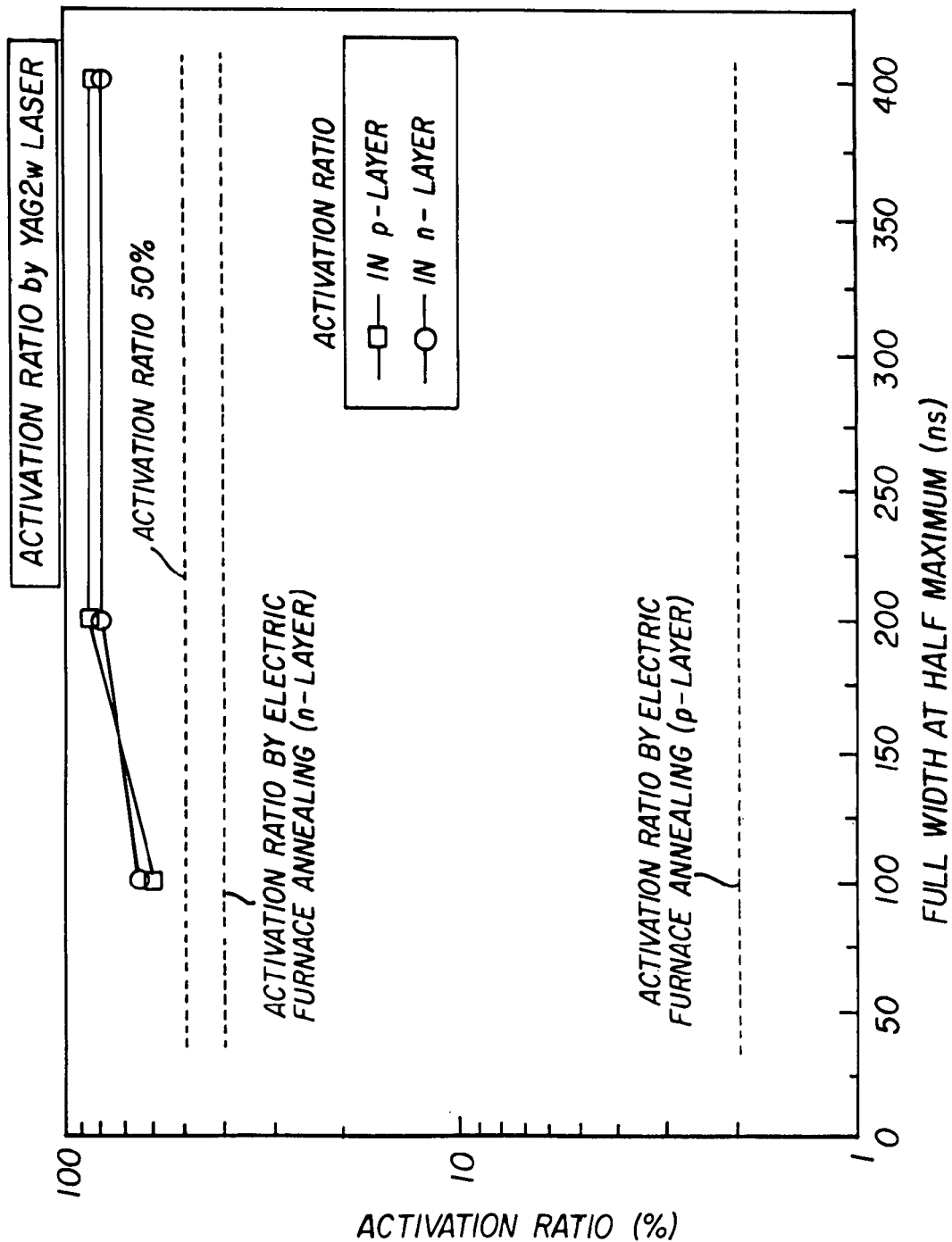
FIG. 4 is a diagram showing relationship between a full-width at half maximum of a pulsed laser beam and an activation ratio when activation is carried out using the YAG2ω laser.

FIG. 3 is a diagram showing the relationship between a full-width at half maximum of the pulsed laser beam and an activation ratio when activation is carried out using the XeCl laser. FIG. 4 is a diagram showing the relationship between a full-width at half maximum of the pulsed laser beam and an activation ratio when activation is carried out using the YAG2ω laser. In FIG. 3 and FIG. 4, the horizontal axis represents the full-width at half maximum (ns) and the vertical axis represents the activation ratio (%). In this case, the p-layer is formed by implanting boron ions onto a bottom surface of the FZ-N substrate with a dose of 1×10$^{15}$ cm$^{-2}$ and acceleration energy of 50 keV. Furthermore, the n-layer is formed by implanting phosphorus ions onto the FZ-N substrate with a dose of 1×10$^{13}$ cm$^{-2}$ and acceleration energy of 240 keV. This makes the FZ-N substrate formed with the p-layer in its shallow region and the n-layer in its deep region.

In the case of the activation of the pn-successive layers using the XeCl laser, the number of the laser irradiation devices is increased to make the full-width at half maximum of the pulsed laser beam projected onto the FZ-N substrate increased to 50 ns, 100 ns, 200 ns and 400 ns. This makes, as shown in FIG. 3, the activation ratio in the p-layer show a high value exceeding 50% for the full-width at half maximum of 50 ns (with one laser irradiation device) or more. The activation ratio in the n-layer comes to show a value exceeding 50% for the full-width at half maximum of 100 ns (with two laser irradiation devices) or more, as shown also in FIG. 3. In addition, in the case of the activation of the pn-successive layers using the YAG2ω laser, the full-width at half maximum of the pulsed laser beam is made increased to 100 ns, 200 ns and 400 ns. This makes the activation ratios in both the p-layer and n-layer show high values exceeding 50% for the full-width at half maximum of 100 ns (with one laser irradiation device) or more, as shown in FIG. 4. The reason that the activation ratio when the YAG2ω laser is used becomes higher than the rate when the XeCl laser is used is an effect of a wavelength, which is 308 nm in the XeCl laser, shorter than the 532 nm in the YAG2ω laser.

From the results shown in FIG. 3 and FIG. 4, it is known that the p-layer formed in the shallow region in the FZ-N substrate can be sufficiently activated by one or two laser irradiation devices using the XeCl laser or the YAG2ω laser. The activation of the n-layer in the deep region in the FZ-N substrate can be carried out effectively by increasing the number of the laser irradiation devices to increase the full-width at half maximum of a pulsed beam equivalent to one pulse.

When electric furnace annealing is carried out at a temperature of 400° C. as in the past, as also shown in FIG. 3 and FIG. 4, the activation ratio in the p-layer is 2% and the activation ratio in the n-layer is 40%. Thus, both the p-layer and the n-layer can be activated with a higher activation ratio compared with that previously obtained by electric furnace annealing by irradiating the pn-successive layers with a pulsed laser beam equivalent to one approximately rectangular pulse having the full-width at half maximum of 100 ns or more with either a XeCl laser or YAG2ω laser.

The activation of the p-layer and the n-layer also can be realized in a very short time, on the order of nanoseconds, in the technology of forming a thin wafer by the method of securing a wafer on a supporting substrate by an adhesive sheet with such an irradiation method. Moreover, in forming a semiconductor element such as an IGBT, a deep doped layer can be formed in an FZ substrate without using an epitaxial substrate. Furthermore, in forming the FS type IGBT, the p-layer and the n-layer formed on the bottom surface side can be activated without exerting any thermal effect on the top surface side on which element structures such as transistors are already formed. When no adhesive sheet is used, it is also possible to carry out the activation according to the invention in combination with the activation by an electric furnace.

In the foregoing, explanation was made about the case in which irradiation was carried out with the pulsed beams, each having irradiation energy distribution equivalent to one approximately rectangular pulse, overlapped with an overlapping ratio of 90%. In the irradiation, the total irradiation energy density was 4.0 J/cm$^2$ and the delay time for successive combination of the pulsed beams was equal to the full-width at half maximum of one pulse before being combined. In the following, more detailed explanations will be made about effects of the overlapping ratio of the pulsed laser beam, the irradiation energy density and the delay time, which effects are exerted on the activation of the pn-successive layers.

Figure 5:
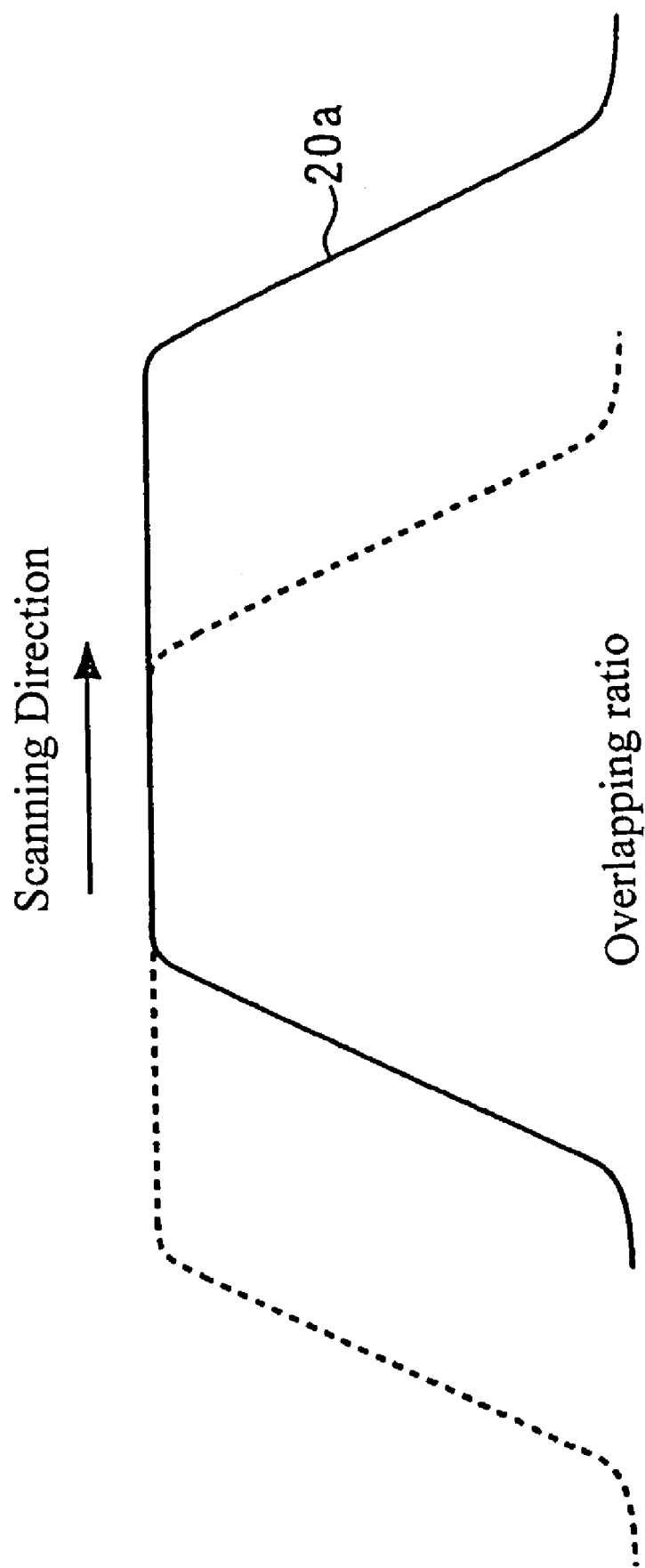
FIG. 5 is a view showing a pulse shape of a pulsed laser beam projected from a laser irradiation device with a low overlapping ratio.
Figure 6:
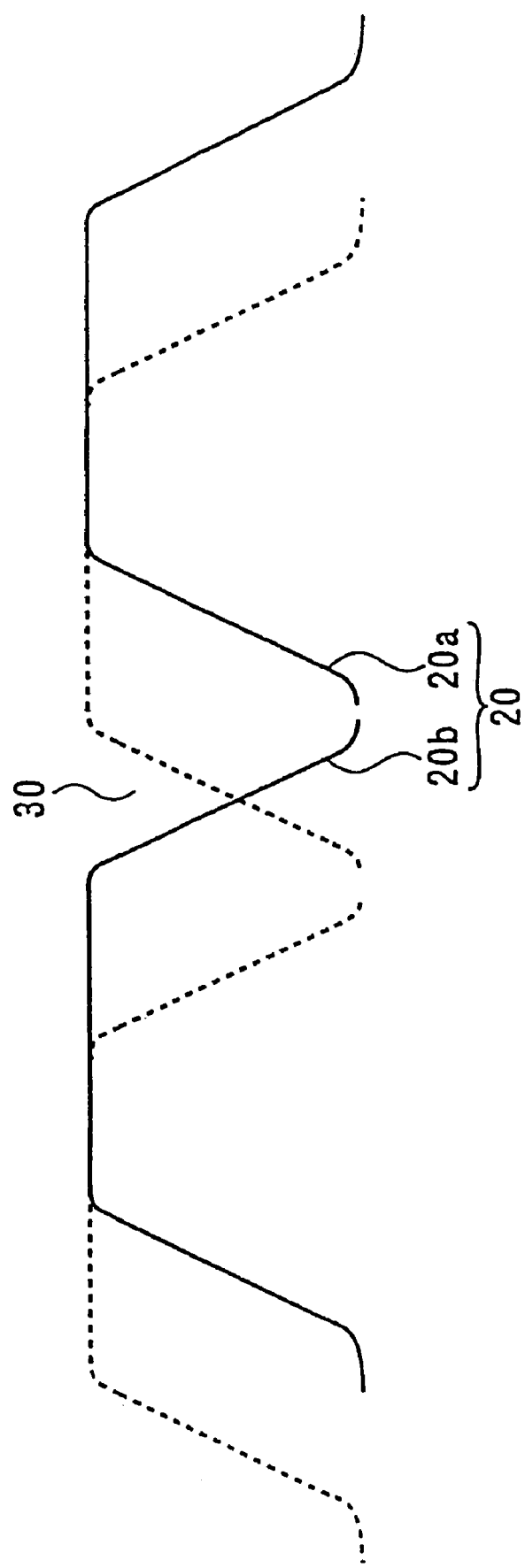
FIG. 6 is a view showing pulse shapes formed by successively combining respective pulsed laser beams projected from two laser irradiation devices with a low overlapping ratio.

First an explanation will be made about the overlapping ratio in the laser irradiation. FIG. 5 is a view showing a pulse shape of a pulsed laser beam projected from a laser irradiation device with a low overlapping ratio. FIG. 6 is a view showing pulse shapes formed by successively combining respective pulsed laser beams projected from two laser irradiation devices with a low overlapping ratio. As shown in FIG. 5, a pulsed beam 20a projected from one laser irradiation device has a trapezoidal shape in space and time and the FZ-N substrate is scanned by such a pulsed laser beam in two directions (X and Y directions) with an overlapping ratio of 50%. In FIG. 6, in a pulsed beam 20 formed by successively combining respective pulsed beams 20a and 20b projected from two laser irradiation devices, a discontinuous portion 30 appears even though the pulsed beams 20a and 20b are successively combined. Therefore, the irradiation of the FZ-N substrate with such a pulsed beam 20 causes variation in the irradiation energy given to the doped layer region, which results in production of unevenly irradiated portions.

Contrary to this, when the irradiation is carried out with the rectangular pulsed beams 10a and 10b with a high overlapping ratio, as shown in FIG. 1 and FIG. 2, the FZ-N substrate is irradiated by the pulsed beam 10 equivalent to one pulse formed by successively combined pulsed beams 10a and 10b. Therefore, in any region the irradiation energy given to the doped layer region is uniform so that no unevenly irradiated portions are produced.

Figure 7:
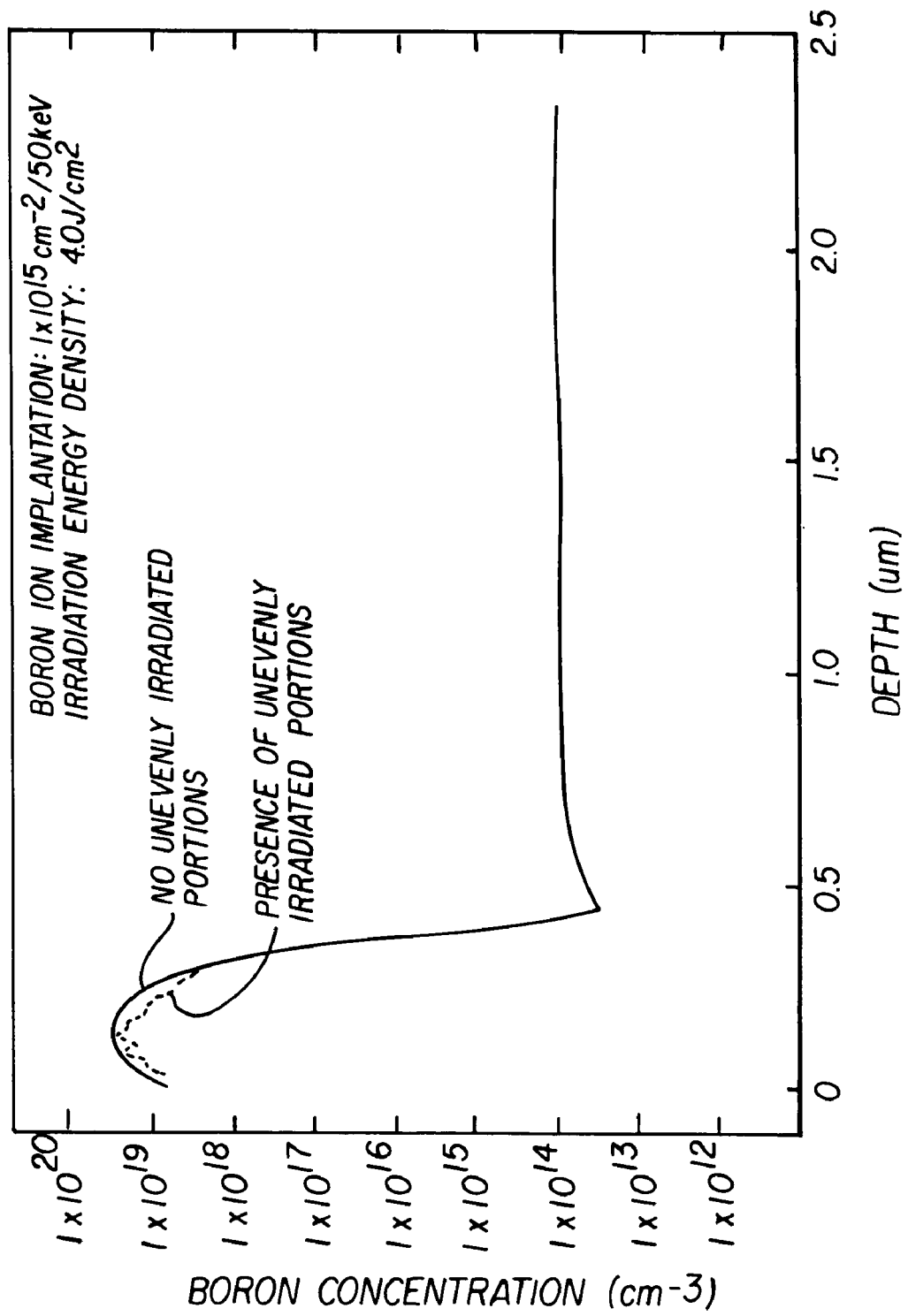
FIG. 7 is a diagram showing boron concentration distributions in a p-layer.

FIG. 7 is a diagram showing boron concentration distributions in the p-layer. In FIG. 7, the horizontal axis represents the depth (μm) from the bottom surface of the FZ-N substrate and the vertical axis represents the boron concentration ($cm^{-3}$). In FIG. 7, the boron concentration distribution when no unevenly irradiated portion is produced is shown by a solid line and the boron concentration distribution when unevenly irradiated portions are produced is shown by a dotted line. Implantation of boron ions is carried out onto the bottom surface of the FZ-N substrate under the conditions with the above-explained dose of $1\times10^{15}$ $cm^{-2}$ and acceleration energy of 50 keV. Furthermore, the irradiation energy density at activation of the p-layer is 4.0 $J/cm^2$. The boron concentration distribution is measured by the spreading resistance method (SR method).

When the irradiation is carried out with the pulsed beam 20 having the trapezoidal shape as shown in the above FIG. 6 with a low overlapping ratio, unevenly irradiated portions are produced to make it impossible to obtain a stable boron concentration distribution about the p-layer as shown in FIG. 7. Compared with this, when the irradiation is carried out with the pulsed beam 10 having a rectangular shape as shown in the above FIG. 1 with a high overlapping ratio, no unevenly irradiated portion is produced to make it possible to obtain a stable boron concentration distribution. This enables stable desired device characteristics, so that it becomes possible to enhance the mass productivity of the FS type IGBT.

Figure 8:
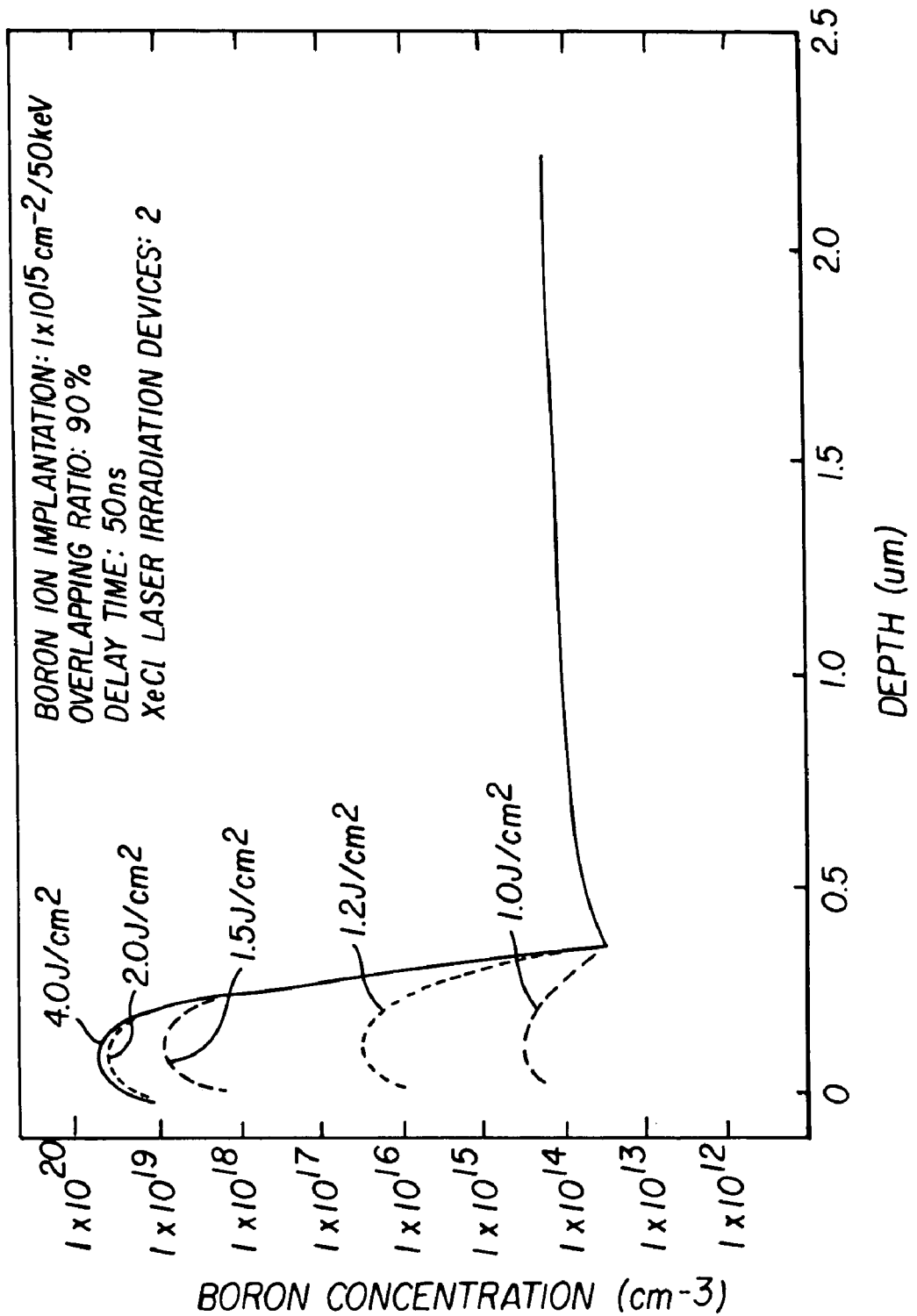
FIG. 8 is a diagram showing boron concentration distributions when the irradiation is carried out with the XeCl laser with the irradiation energy density made varied.

Next, an explanation will be made about the energy density in the laser irradiation. FIG. 8 is a diagram showing boron concentration distributions when the irradiation is carried out with the XeCl laser with the irradiation energy density varied. In FIG. 8, the horizontal axis represents the depth (μm) from the top surface of the FZ-N substrate and the vertical axis represents the boron concentration ($cm^{-3}$). FIG. 8 shows results when the laser irradiation was carried out using two laser irradiation devices of the XeCl laser with a delay time of 50 ns, equal to the full-width at half maximum of the pulsed beam of the XeCl laser projected from one laser irradiation device. Moreover, the overlapping ratio in the laser irradiation was 90%. In addition, implantation of boron ions was carried out onto the FZ-N substrate with a dose of $1\times10^{15}$ $cm^{-2}$ and acceleration energy of 50 keV. The boron concentration distribution is measured by the SR method.

In the irradiation with the results shown in FIG. 8, the total irradiation energy density at the XeCl laser irradiation is varied between 1.0 $J/cm^2$ to 4.0 $J/cm^2$. As shown in FIG. 8, the boron concentration increases with an increase in the total irradiation energy density of 1.0 $J/cm^2$, 1.2 $J/cm^2$, 1.5 $J/cm^2$, 2.0 $J/cm^2$ and 4.0 $J/cm^2$.

Usually, in the case of the FS type IGBT, the surface concentration of the p-layer is preferably $5\times10^{16}$ $cm^{-3}$ or more, and more preferably $1\times10^{18}$ $cm^{-3}$ or more in consideration of ohmic contact (contact resistance) with the bottom surface electrode layer. From the results shown in FIG. 8, it is known that, at the total irradiation energy density of 1.0 $J/cm^2$, the boron concentration falls below $5\times10^{16}$ $cm^{-3}$ and activation is low. Contrary to this, at the total irradiation energy density of 1.5 $J/cm^2$ or more, the boron concentration is over $1\times10^{18}$ $cm^{-3}$ and is almost saturated. Therefore, sufficient activation is provided. Moreover, a total irradiation energy density exceeding 4.0 $J/cm^2$ or more is too large as the irradiation energy density given to one irradiation area by the laser irradiation to cause the surface temperature of the FZ-N substrate to exceed the melting point of silicon (1415° C.). This causes the surface of the substrate to be molten before being solidified, which results in large variation in the boron concentration distribution.

From the above, the total irradiation energy density in the XeCl laser irradiation for activating the pn-successive layers is determined preferably to fall within the range from 1.2 $J/cm^2$ to 4.0 $J/cm^2$, and more preferably within the range from 1.5 $J/cm^2$ to 4.0 $J/cm^2$. Furthermore, when two laser irradiation devices carrying out irradiation with the XeCl laser, for example, are used to obtain a total irradiation energy density of 4.0 $J/cm^2$, as explained above, the XeCl laser beam with an irradiation energy density of 2.0 $J/cm^2$ is projected from each laser irradiation device. In the case of using a plurality of laser irradiation devices in this way, it is desirable that the irradiation energy density of the XeCl laser beam projected from each laser irradiation device be uniformly distributed thereto.

Figure 9:
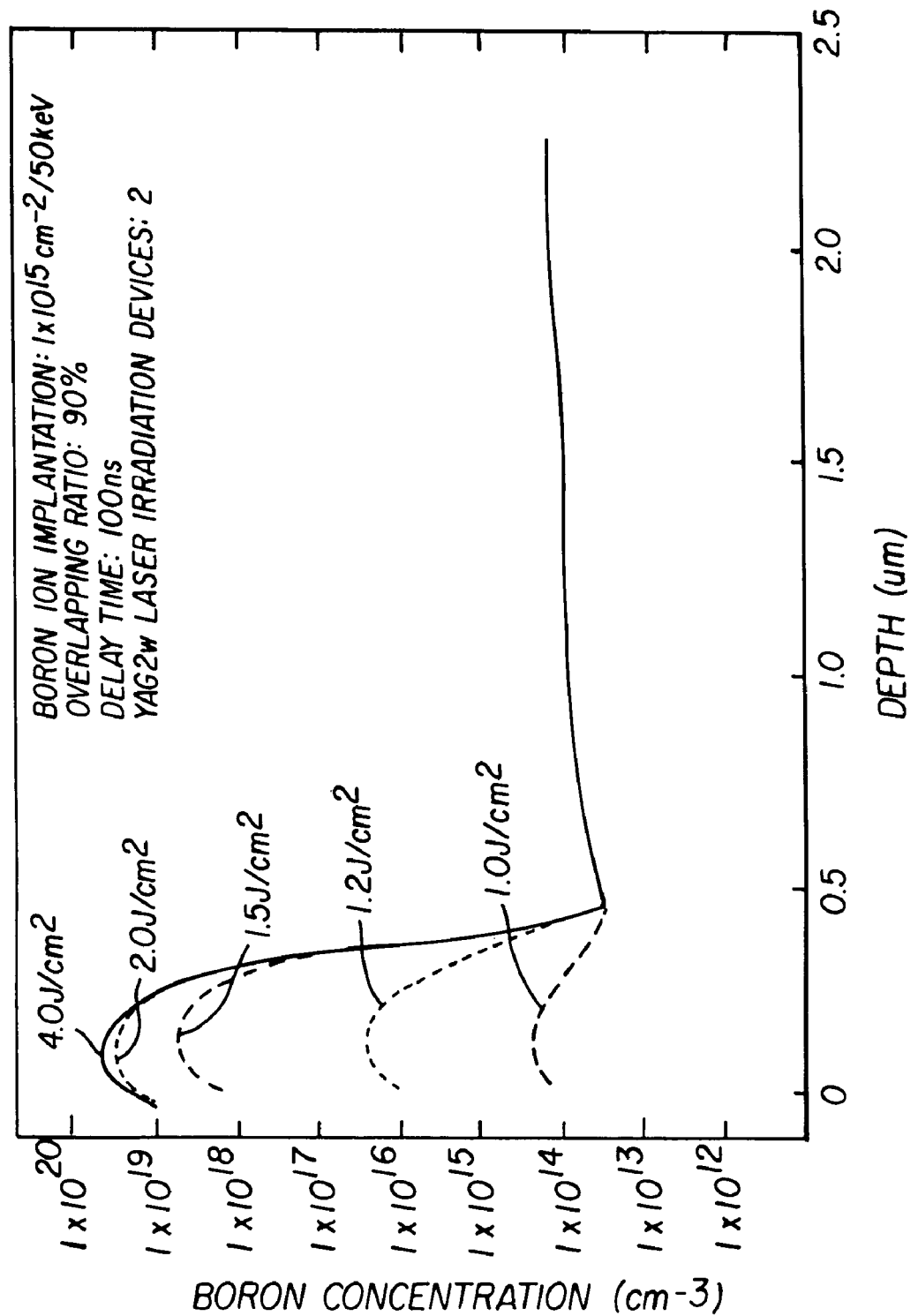
FIG. 9 is a diagram showing boron concentration distributions when the irradiation is carried out with the YAG2ω laser with the irradiation energy density made varied.

FIG. 9 is a diagram showing boron concentration distributions when the irradiation is carried out with a YAG2ω laser with variation in the irradiation energy density. In FIG. 9, the horizontal axis represents the depth (μm) from the top surface of the FZ-N substrate and the vertical axis represents the boron concentration ($cm^{-3}$). FIG. 9 shows results when the laser irradiation was carried out using two laser irradiation devices of the YAG2ω laser with a delay time of 100 ns that is equal to the full-width at half maximum of the pulsed beam of the YAG2ω laser projected from one laser irradiation device. Moreover, the overlapping ratio in the laser irradiation was 90%. In addition, implantation of boron ions onto the FZ-N substrate was carried out with a dose of $1\times10^{15}$ $cm^{-2}$ and an acceleration energy of 50 keV. The boron concentration distribution is measured by the SR method.

In the irradiation with the results shown in FIG. 9, the total irradiation energy density of the YAG2ω laser irradiation is varied between 1.0 $J/cm^2$ to 4.0 $J/cm^2$. As shown in FIG. 9, the boron concentration increases with an increase in the total irradiation energy density as 1.0 $J/cm^2$, 1.2 $J/cm^2$, 1.5 $J/cm^2$, 2.0 $J/cm^2$ and 4.0 $J/cm^2$.

From the results shown in FIG. 9, as in the case of using the XeCl laser, it is known that at the total irradiation energy density of 1.0 $J/cm^2$, the boron concentration is low and activation is low. Contrary to this, at the total irradiation energy density of 1.5 $J/cm^2$ or more, the boron concentration is high and almost saturated. The reason that the total irradiation energy density exceeding 4.0 $J/cm^2$ or more causes a large variation in the boron concentration distribution is the same as the reason for the XeCl laser.

From the above, the total irradiation energy density in the YAG2ω laser irradiation for activating the pn-successive layers is determined preferably to fall within a range from 1.2 J/cm² to 4.0 J/cm², and is more preferably determined as being within the range from 1.5 J/cm² to 4.0 J/cm². Furthermore, to obtain a total irradiation energy density of 4.0 J/cm² using two laser irradiation devices carrying out irradiation with the YAG2ω laser, for example, the YAG2ω laser beam with an irradiation energy density of 2.0 J/cm² is equally projected from each laser irradiation device.

In FIG. 8 and FIG. 9, the reason that the diffusion depth of boron when the YAG2ω laser is used becomes on the order of 0.1 μm more compared with the diffusion depth when the XeCl laser is used is due to a difference between the wavelengths of the two lasers. Namely, in contrast with the YAG2ω laser having a wavelength of 532 nm, the XeCl laser has a shorter wavelength of 308 nm.

Figure 10:
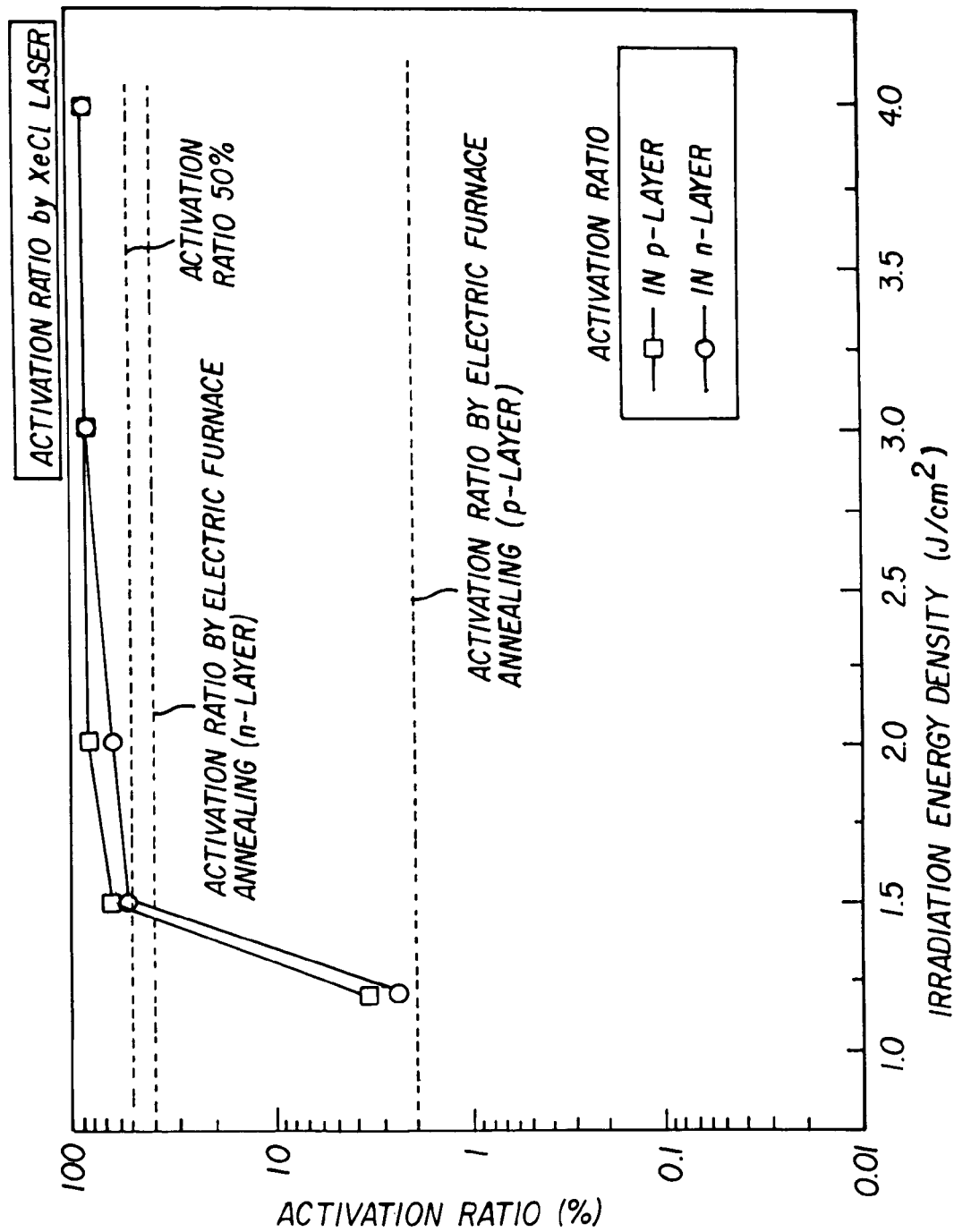
FIG. 10 is a diagram showing relationship between an irradiation energy density and an activation ratio when activation is carried out using the XeCl laser.
Figure 11:
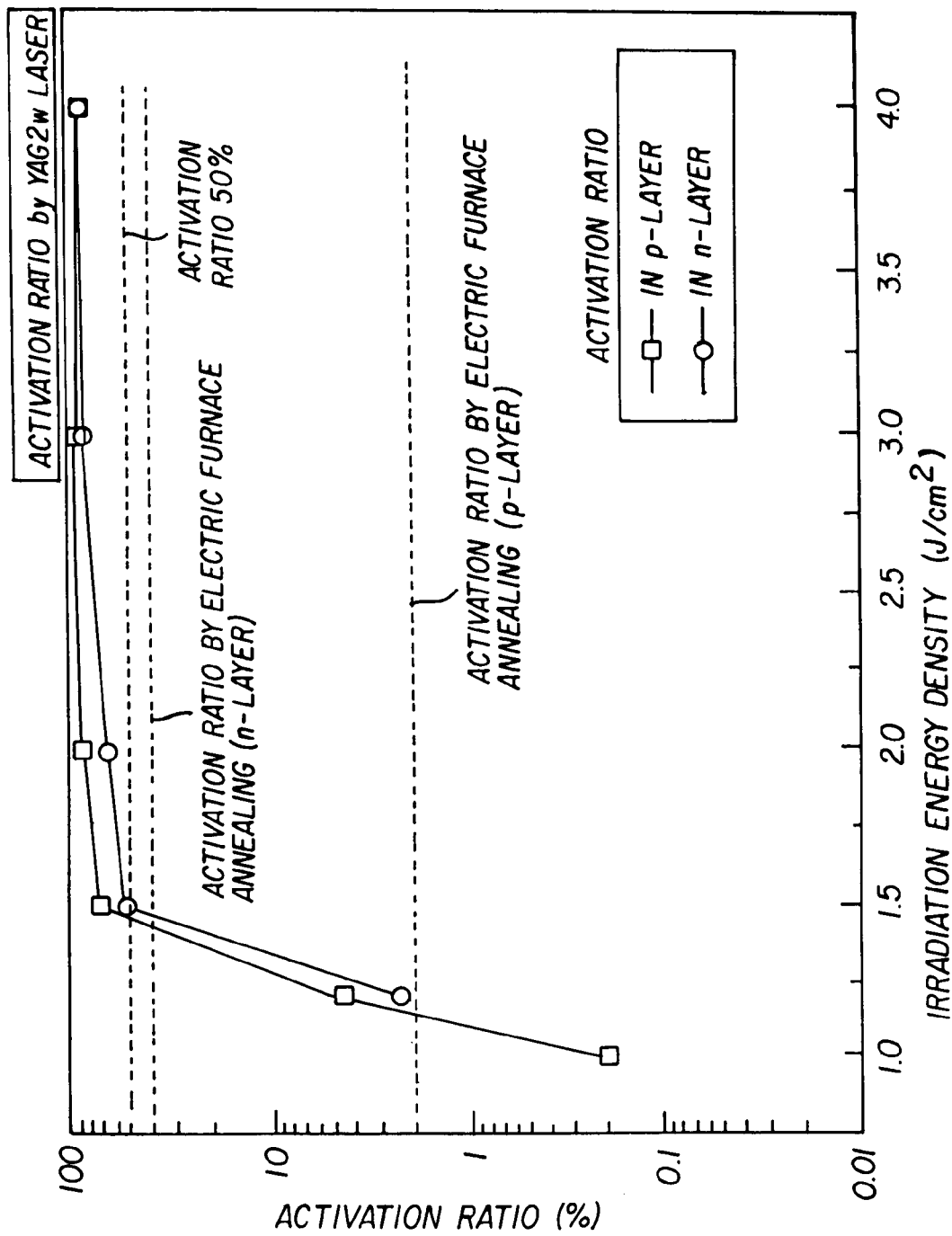
FIG. 11 is a diagram showing relationship between an irradiation energy density and an activation ratio when activation is carried out using the YAG2ω laser.

FIG. 10 is a diagram showing the relationship between irradiation energy density and activation ratio when activation is carried out using the XeCl laser. FIG. 11 is a diagram showing the relationship between an irradiation energy density and activation ratio when activation is carried out using the YAG2ω laser. In FIG. 10 and FIG. 11, the horizontal axis represents the total irradiation energy density (J/cm²) and the vertical axis represents the activation ratio (%). In this case, the p-layer is formed by implanting boron ions onto the bottom surface of the FZ-N substrate with a dose of 1×10¹⁵ cm⁻² and acceleration energy of 50 keV. Furthermore, the n-layer is formed by implanting phosphorus ions onto the FZ-N substrate with a dose of 1×10¹³ cm⁻² and acceleration energy of 240 keV. This makes the FZ-N substrate formed with the p-layer in its shallow region and the n-layer in its deep region.

In the case of the activation of the pn-successive layers using the XeCl laser, as the total irradiation energy density is gradually varied, the activation ratios in both the p-layer and the n-layer show a high value exceeding 50% for the total irradiation energy density within the range from 1.5 J/cm² to 4.0 J/cm², as shown in FIG. 10. In addition, also in the case of the activation of the pn-successive layers using the YAG2ω laser, the activation ratios in both the p-layer and the n-layer show a high value exceeding 50% for the total irradiation energy density within the range from 1.5 J/cm² to 4.0 J/cm², as shown in FIG. 11. The reason that the activation ratio when the YAG2ω laser is used becomes higher compared with the rate when the XeCl laser is used is that, in contrast with the YAG2ω laser having a wavelength of 532 nm, the XeCl laser has a shorter wavelength of 308 nm.

When electric furnace annealing is carried out at a temperature of 400° C., the activation ratio in the p-layer is 2% and the activation ratio in the n-layer is 40% as shown in FIG. 10 and FIG. 11. In the case of using the XeCl laser, with a total irradiation energy density from 1.2 J/cm² to 4.0 J/cm², the activation ratios in both the p- and n-layers or that in either one of the layers can be brought above the activation ratios obtained by the electric furnace annealing. Also in the case of using the YAG2ω laser, with a total irradiation energy density from 1.2 J/cm² to 4.0 J/cm², the activation ratios in both the p- and n-layers or that in either one of the layers can be brought above the activation ratio obtained by the electric furnace annealing.

From the results shown in FIG. 10 and FIG. 11, it is known that the p-layer and the n-layer in the pn-successive layers formed in the FZ-N substrate can be activated using either the XeCl laser and the YAG2ω laser with a higher activation ratio compared with that in the past when the total irradiation energy density is within the range from 1.2 J/cm² to 4.0 J/cm².

Figure 12:
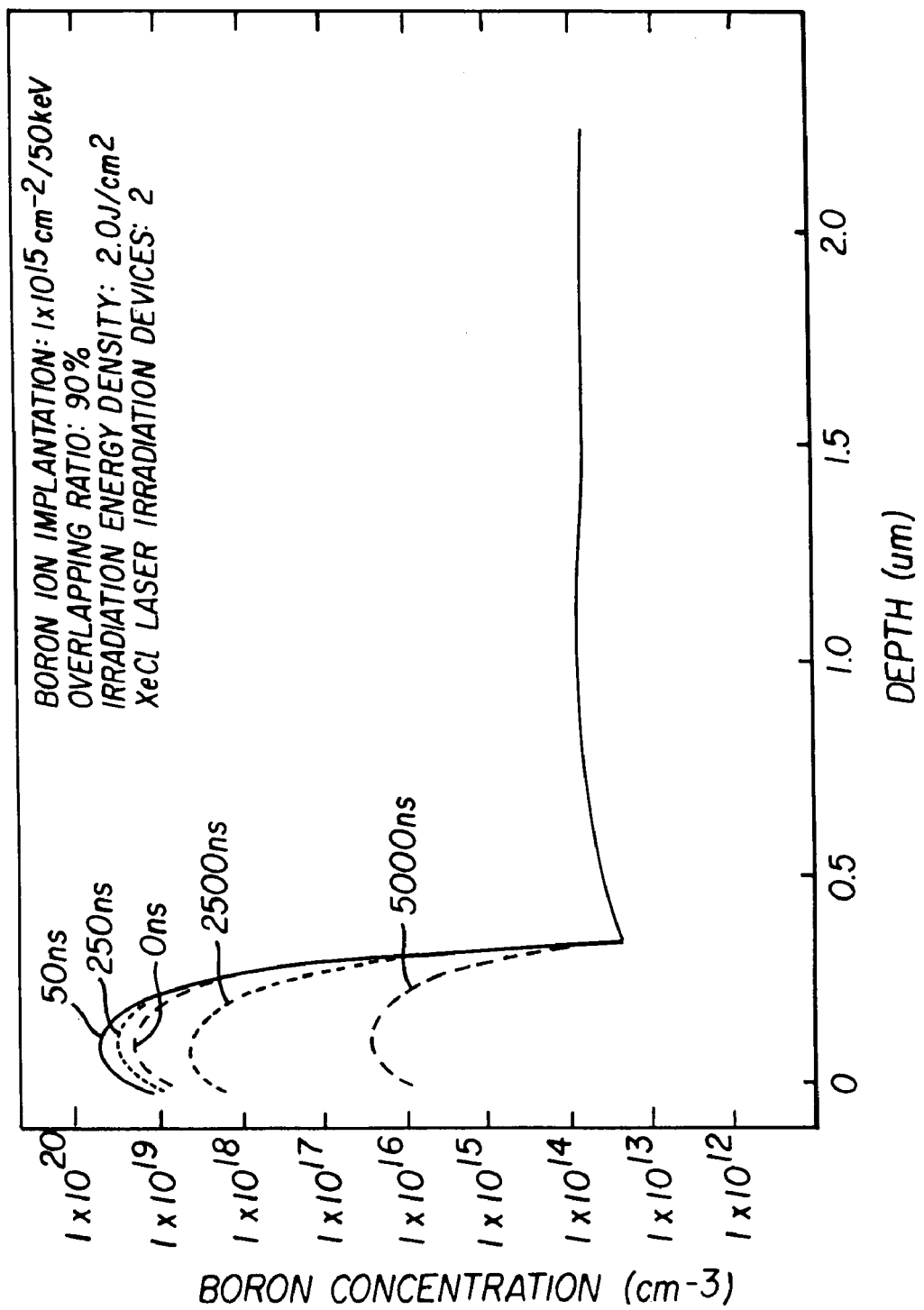
FIG. 12 is a diagram showing boron concentration distributions when the irradiation is carried out with the XeCl laser with the delay time made varied.

Next, an explanation will be made about the delay time in the laser irradiation. FIG. 12 is a diagram showing boron concentration distributions when the irradiation is carried out with the XeCl laser with the delay time varied. In FIG. 12, the horizontal axis represents the depth (μm) from the top surface of the FZ-N substrate and the vertical axis represents the boron concentration (cm⁻³). FIG. 12 shows results when the laser irradiation was carried out using two laser irradiation devices of the XeCl laser with the total irradiation energy density of 2.0 J/cm². Moreover, the overlapping ratio in the laser irradiation was 90%. In addition, implantation of boron ions was carried out onto the FZ-N substrate with a dose of 1×10¹⁵ cm⁻² and acceleration energy of 50 keV. The boron concentration distribution is measured by the SR method.

In the irradiation with the results shown in FIG. 12, the delay time between the pulsed laser beams of the XeCl laser separately projected from two laser irradiation devices is varied between 0 ns and 5000 ns. As shown in FIG. 12, the boron concentration increases when the delay time is increased from 0 ns (no delay) to 50 ns, and decreases with an increase in the delay time for the delay times of 250 ns, 2500 ns and 5000 ns which are longer than 50 ns. It can be easily predicted that, when the delay time exceeds 5000 ns, it becomes impossible to obtain the boron concentrations of 1×10¹⁶ cm⁻³ or more, which are required to prepare an ohmic contact.

This is because when the delay time is short to make a time from the projection of a preceding pulsed beam to the projection of a succeeding pulsed beam short, the pulsed beams become equivalent to a single pulsed beam with a large full-width at half maximum as shown in the above FIG. 1. Therefore, the temperature of the FZ-N substrate irradiated with the laser can be kept at a substrate temperature necessary for activation for a comparably long time. Contrary to this, when the delay time is long, some interval is left from the projection of a preceding pulsed beam to the projection of a succeeding pulsed beam. Therefore, when the delay time is too long, it is impossible to keep the substrate temperature necessary for activation during the delay time. Some values of the delay time only allow an effect to be obtained which is the same as that obtained when one laser irradiation device is used for carrying out laser irradiation. In this case, the boron concentration decreases and the activation ratio is lowered. The delay time in the XeCl laser irradiation is preferably determined to be within the range of 0 ns to 5000 ns, and is more preferably determined to be within the range of 0 ns to 2500 ns.

Figure 13:
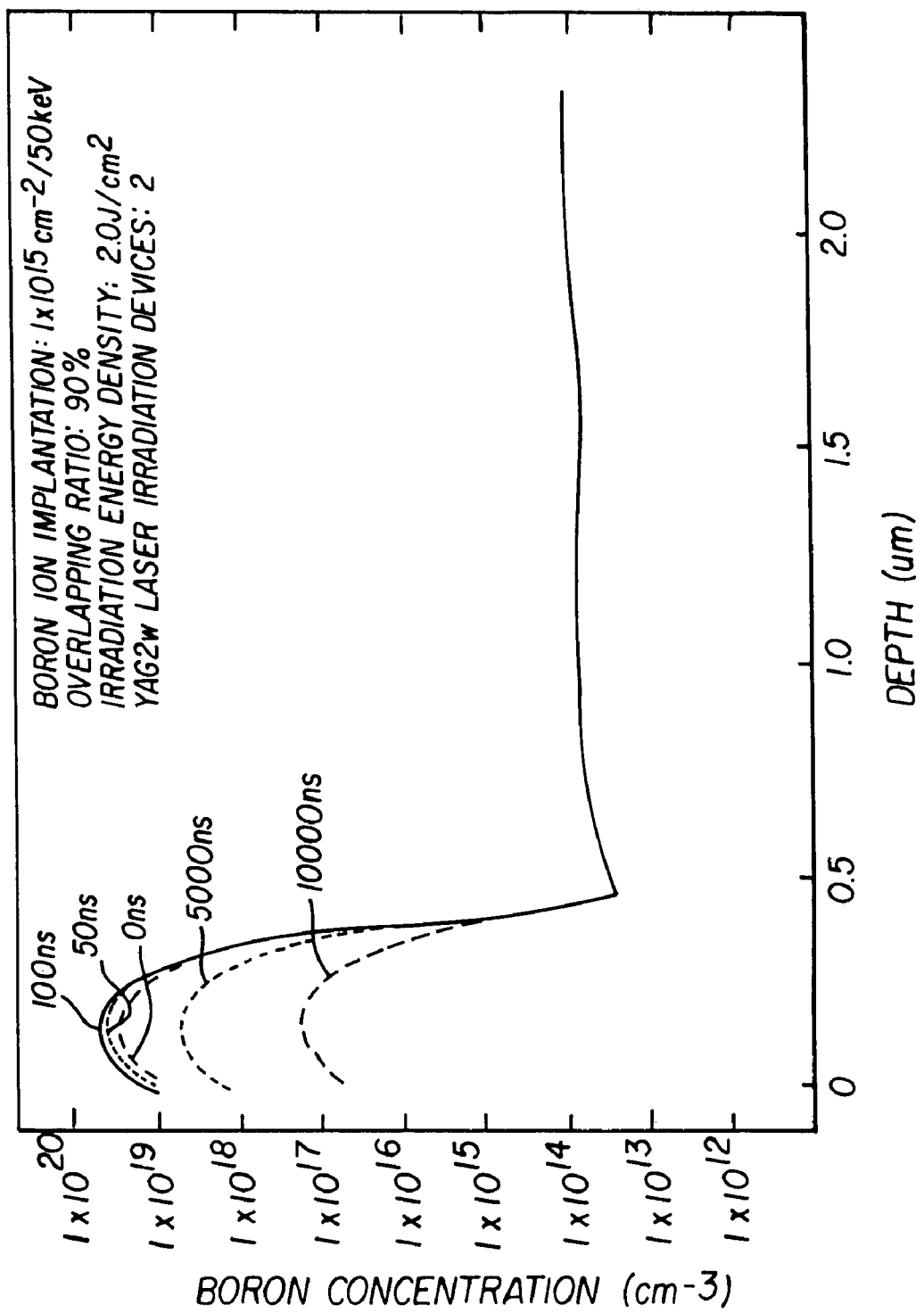
FIG. 13 is a diagram showing boron concentration distributions when the irradiation is carried out with the YAG2ω laser with the delay time made varied.

FIG. 13 is a diagram showing boron concentration distributions when the irradiation is carried out with the YAG2ω laser with the delay time varied. In FIG. 13, the horizontal axis represents the depth (μm) from the top surface of the FZ-N substrate and the vertical axis represents the boron concentration (cm⁻³). FIG. 13 shows results when the laser irradiation was carried out using two laser irradiation devices of the YAG2ω laser with the total irradiation energy density of 2.0 J/cm². Moreover, the overlapping ratio in the laser irradiation was 90%. In addition, implantation of boron ions was carried out onto the FZ-N substrate with a dose of 1×10¹⁵ cm⁻² and acceleration energy of 50 keV. The boron concentration distribution is measured by the SR method.

In the irradiation with the results shown in FIG. 13, the delay time between the pulsed laser beams of the YAG2ω laser separately projected from two laser irradiation devices is varied between 0 ns and 10000 ns. As shown in FIG. 13, the boron concentration increases when the delay time is increased from 0 ns to 100 ns, and decreases with an increase in the delay time for the delay times of 5000 ns and 10000 ns which are longer than 100 ns. When the delay time exceeds 10000 ns, it is virtually impossible to obtain boron concentrations of $5\times10^{16}$ cm$^{-3}$ or more. The reason that the boron concentration decreases in this way as the delay time becomes longer is the same as the reason explained about FIG. 12 when the XeCl laser is used. Therefore, from the results shown in FIG. 13, it is known that the delay time in the irradiation with the YAG2ω laser is determined preferably to fall within the range of 0 ns to 10000 ns, and is more preferably determined to fall within the range of 0 ns to 5000 ns.

Figure 14:
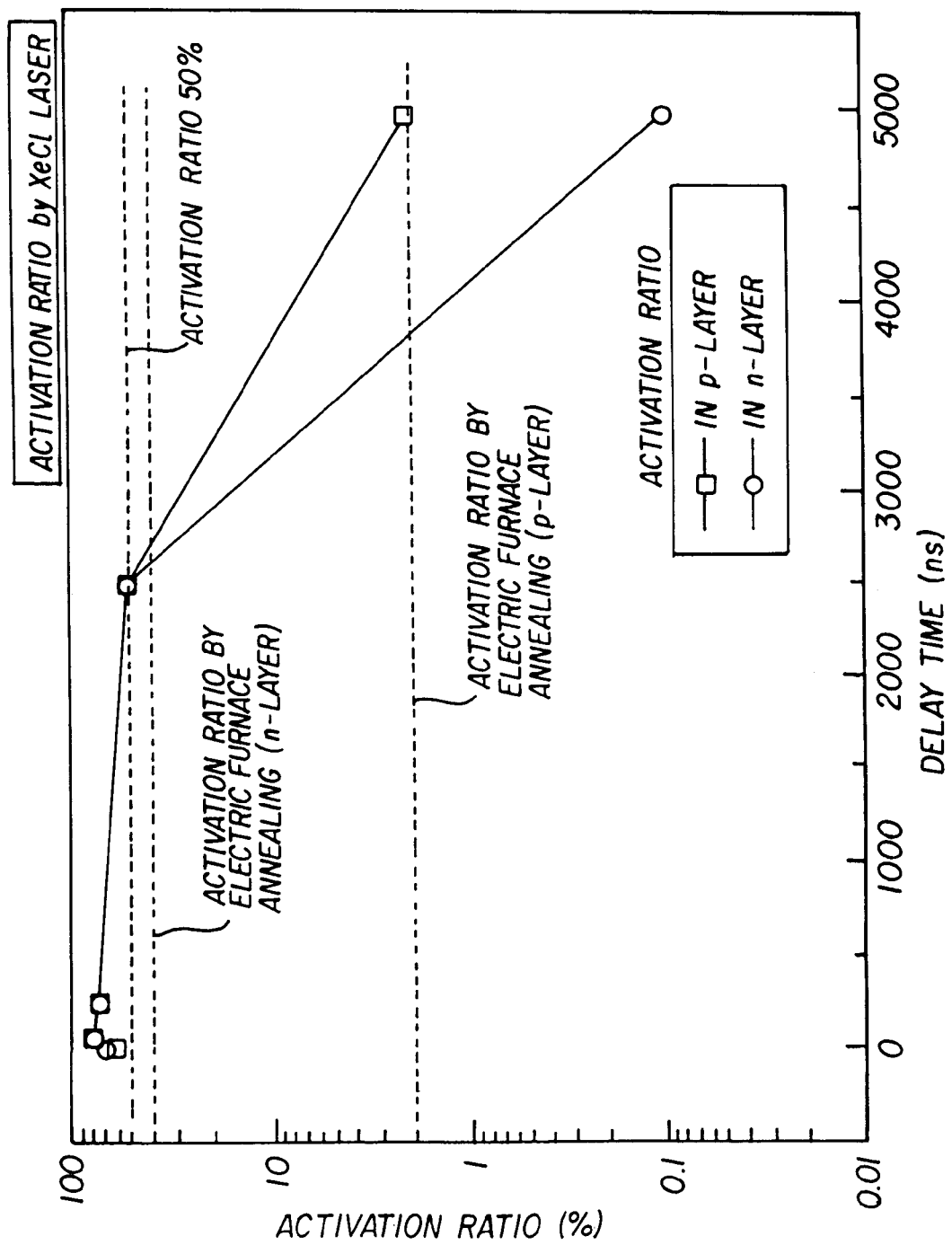
FIG. 14 is a diagram showing relationship between a delay time and an activation ratio when activation is carried out using the XeCl laser.
Figure 15:
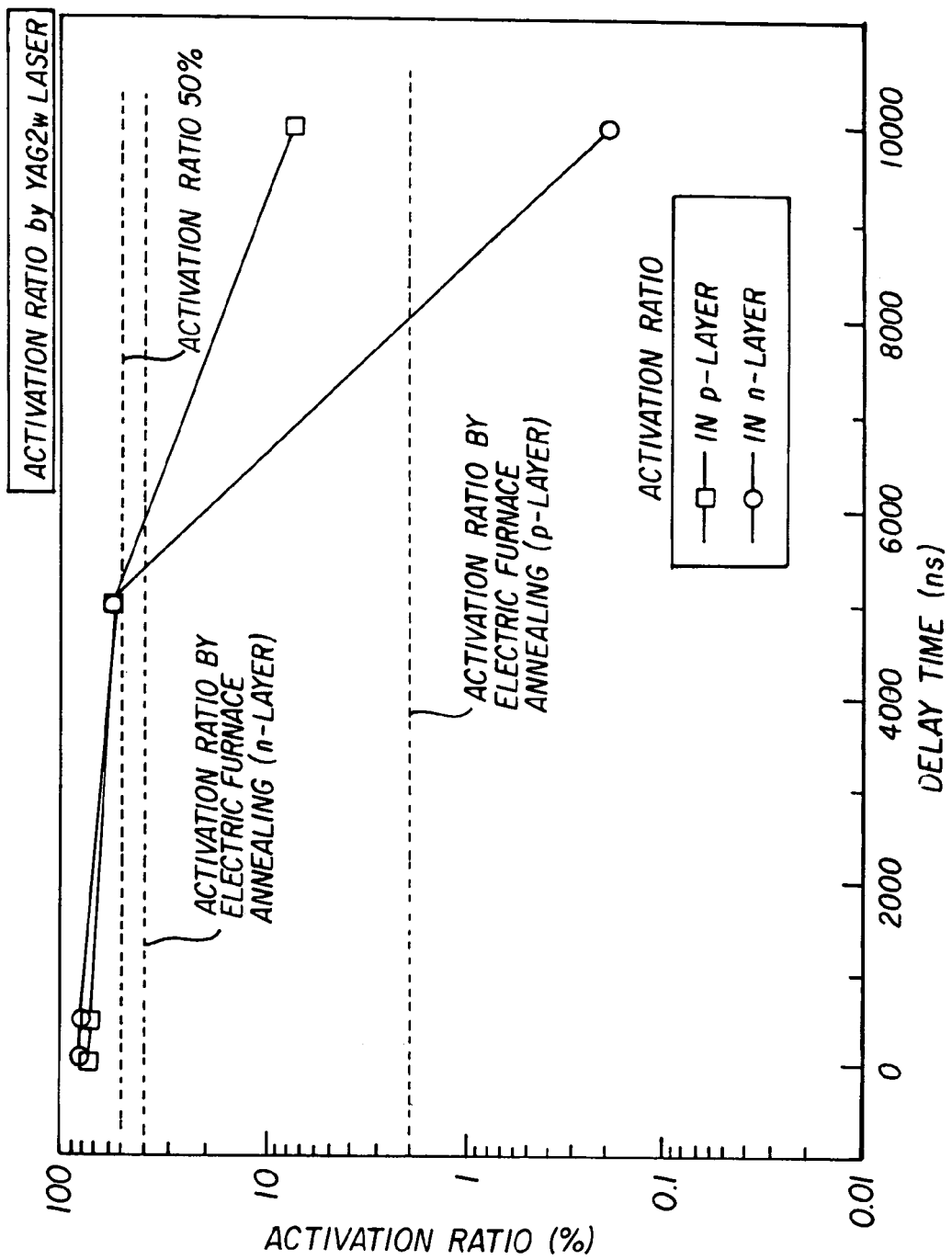
FIG. 15 is a diagram showing relationship between a delay time and an activation ratio when activation is carried out using the YAG2ω laser.

FIG. 14 is a diagram showing the relationship between a delay time and an activation ratio when activation is carried out using the XeCl laser. Moreover, FIG. 15 is a diagram showing the relationship between a delay time and an activation ratio when activation is carried out using the YAG2ω laser. In FIG. 14 and FIG. 15, the horizontal axis represents the delay time (ns) and the vertical axis represents the activation ratio (%). In this case, the p-layer is formed by implanting boron ions onto the bottom surface of the FZ-N substrate with a dose of $1\times10^{15}$ cm$^{-2}$ and acceleration energy of 50 keV. Furthermore, the n-layer is formed by implanting phosphorus ions onto the FZ-N substrate with a dose of $1\times10^{13}$ cm$^{-2}$ and acceleration energy of 240 keV. This makes the FZ-N substrate formed with the p-layer in its shallow region and the n-layer in its deep region.

In the case of the activation of the pn-successive layers using the XeCl laser, as the delay time is gradually varied the activation ratios in both the p-layer and the n-layer show a high value exceeding 50% for the delay time between 0 ns and 2500 ns, but fall below 50% at the delay time of 5000 ns, as shown in FIG. 14. In addition, as in the case of the activation of the pn-successive layers using the YAG2ω laser the activation ratios in both the p-layer and the n-layer show a high value exceeding 50% for the delay time between 0 ns and 5000 ns, but are below 50% at the delay time of 10000 ns, as shown in FIG. 15. The reason that the activation rate when the YAG2ω laser is used becomes higher compared with the rate when the XeCl laser is used is that, in contrast with the YAG2ω laser having a wavelength of 532 nm, the XeCl laser has a shorter wavelength of 308 nm.

When electric furnace annealing is carried out at a temperature of 400° C. the activation ratio in the p-layer is 2% and the activation ratio in the n-layer is 40%, as shown in FIG. 14 and FIG. 15. In the case of using the XeCl laser with a delay time within the range from 0 ns to 5000 ns, the activation ratios in both the p- and n-layers or that in either one of the layers can be brought above the activation ratio obtained by the electric furnace annealing, as shown in FIG. 14. Also in the case of using the YAG2ω laser, with a delay time within the range from 0 ns to 10000 ns, the activation ratios in both the p- and n-layers or that in either one of the layers can be brought above the activation ratio obtained by the electric furnace annealing, as shown in FIG. 15.

From the results shown in FIG. 14 and FIG. 15, it is known that the delay time for satisfying activation of the pn-successive layers in the FZ-N substrate is within the range of 0 ns to 5000 ns using either the XeCl laser or the YAG2ω laser. By carrying out the irradiation in this way so that the delay time between a plurality of pulsed beams is between 0 ns (no delay time) and 5000 ns, the pn-successive layers can be activated without lowering the substrate temperature below a temperature necessary for the activation.

As explained above, in the activation of the pn-successive layers using laser irradiation devices, with the pulse shape of the pulsed laser beam made approximately rectangular, each of the overlapping ratio, the irradiation energy density and the delay time in the laser irradiation is determined to be optimum. This can effectively and stably activate the pn-successive layers with a high activation ratio to make it possible to manufacture the FS type IGBTs having superior device characteristics.

In carrying out laser annealing by irradiation with the pulsed laser beam, use of a pulsed beam having a pulse shape close to a shape of a general Gaussian distribution sometimes leaves traces of work damage on the FZ-N substrate.

Figure 17:
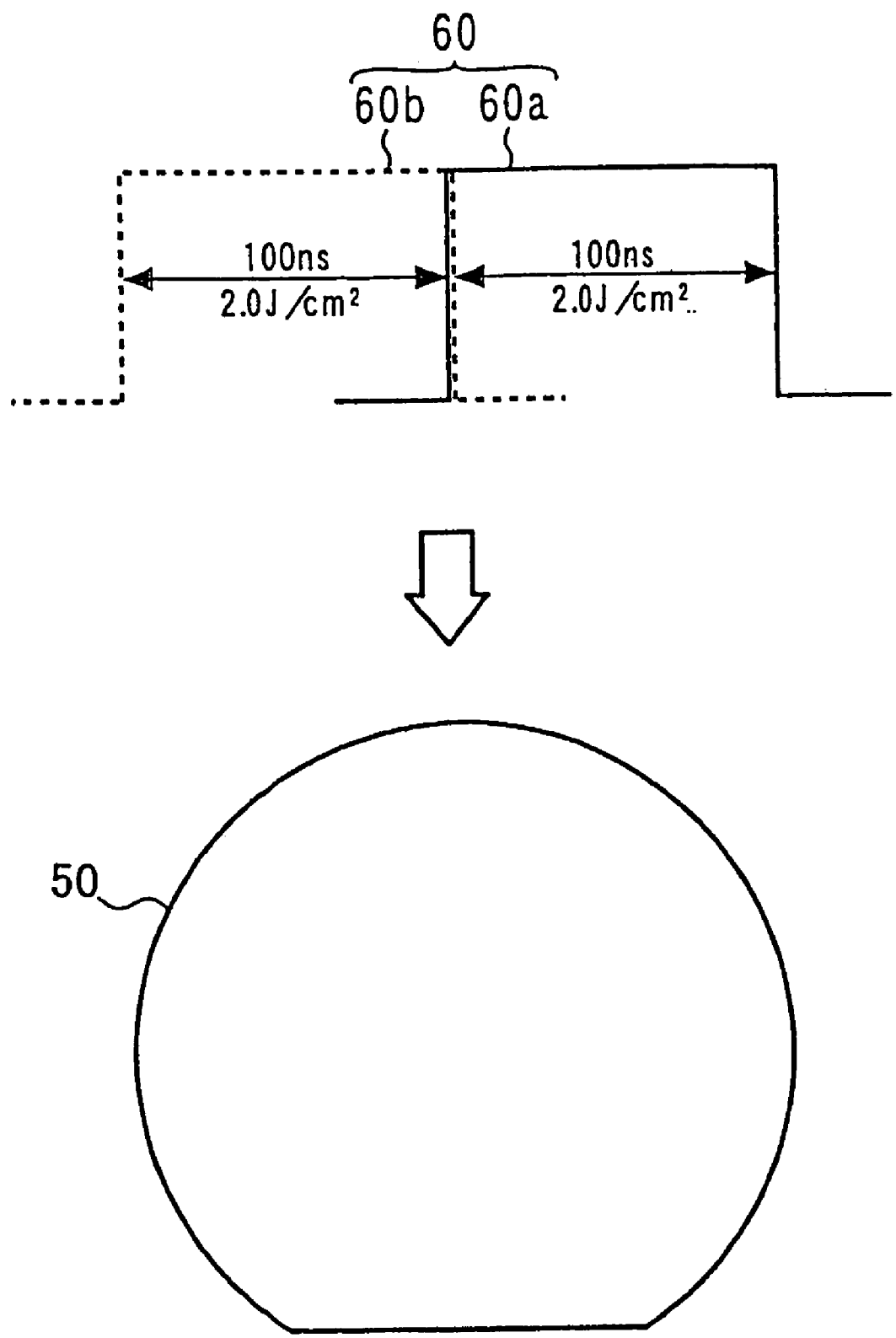
FIG. 17 is a schematic diagram showing a rectangular pulse shape and a state of the FZ N substrate when the pulsed laser beam with the pulse shape is used.

FIG. 16 is a schematic diagram showing a pulse shape of the Gaussian distribution and a state of an FZ-N substrate when a pulsed laser beam with the pulse shape is used. FIG. 17 is a schematic diagram showing a rectangular pulse shape and a state of the FZ-N substrate when a pulsed laser beam with this pulse shape is used. For example, when activation is carried out by the irradiation with a pulsed laser beam with a pulse shape 40 of the Gaussian distribution having a full-width at half maximum of 100 ns and an irradiation energy density of 4.0 J/cm$^2$, at a position on a FZ-N substrate corresponding to the position of the highest irradiation energy intensity of the pulsed laser beam, a trace of work damage 51 remains. Thus, a plurality of traces of work damage 51 is formed on a FZ-N substrate 50 according to the overlapping ratio of the pulsed laser beams.

Therefore, an optical adjustment is carried out in which a specified mask is used to form a rectangular pulse. Furthermore, an irradiation energy density shared by one laser irradiation device is lowered so that required irradiation energy is provided using a plurality of the laser irradiation devices. For example, laser irradiation is carried out using two laser irradiation devices to successively combine in time respective rectangular pulsed beams 60a and 60b, each having a full-width at half maximum of 100 ns and an irradiation energy density of 2.0 J/cm$^2$, into a pulsed beam 60 having a total full-width at half maximum of 200 ns and a total irradiation energy density of 4.0 J/cm$^2$, as shown in FIG. 17. This makes it possible to carry out irradiation which can prevent generation of traces of work damage on the FS-N substrate 50 while keeping an irradiation energy density necessary for annealing. As a result, it becomes possible to form the FS type IGBT, without carrying out any additional work to the FZ-N substrate for removing the traces of work damage.

In the above, the explanation was made about the case of using the XeCl laser or the YAG2ω laser as the laser for activating the pn-successive layers. Of the above, the YAG2ω laser, by which a pulsed beam with a large full-width at half maximum can be obtained, is preferably used in particular. It is easier to combine a plurality of YAG2ω laser as compared to a plurality of XeCl laser, and it provides a pulsed beam with a half-value as large as 100 ns with one device to necessitate a small number of devices sufficient for activation. Furthermore, the pulsed beam of the YAG2ω laser provides no spot irradiation as experienced in the irradiation with the pulsed beam of the YAG3ω laser used in the past, so that activation of one wafer can be completed in an even shorter time, which is advantageous in a practical aspect.

As explained above, according to the invention, by carrying out irradiation with a pulsed laser beam with an approximately rectangular pulse shape, an excellent FS type IGBT can be formed without any trace of work damage and with a stable impurity concentration distribution in the doped layer region.

In the foregoing, explanations were made with the case of instantaneously activating the pn-successive layers formed in the FS type IGBT taken as an example. The invention, however, can be also applied to activation of a single layer of a p-layer or an n-layer, or other pp-successive layers or nn-successive layers. Therefore, regardless of the top surface side or the bottom surface side of the FZ substrate in the FS type IGBT, the doped layer region such as the pn-successive layers can be activated within a short time on the order of nanoseconds. Furthermore, without any limitation to the FS type IGBT, the invention can be applied to a PT type IGBT, an NPT type IGBT, a reverse-blocking IGBT, a freewheeling diode (FWD) with the outermost surface layer becoming an n-layer, and various other semiconductor elements having doped layer regions to be activated by laser annealing.

Next, an explanation will be made about a second mode. In the second mode, a detailed explanation will be made with the following case taken as an example. In this case, on the p-layer in the pn-successive layers formed in the FZ-N substrate of the FS type IGBT, a surface contact layer (p-layer) is formed for providing ohmic contact with the bottom surface electrode. Such a surface contact layer is formed by implanting phosphorus ions and boron ions into the FZ-N substrate in this order before implanting boron fluoride ions ($BF^{2+}$) to carry out activation.

Figure 18:
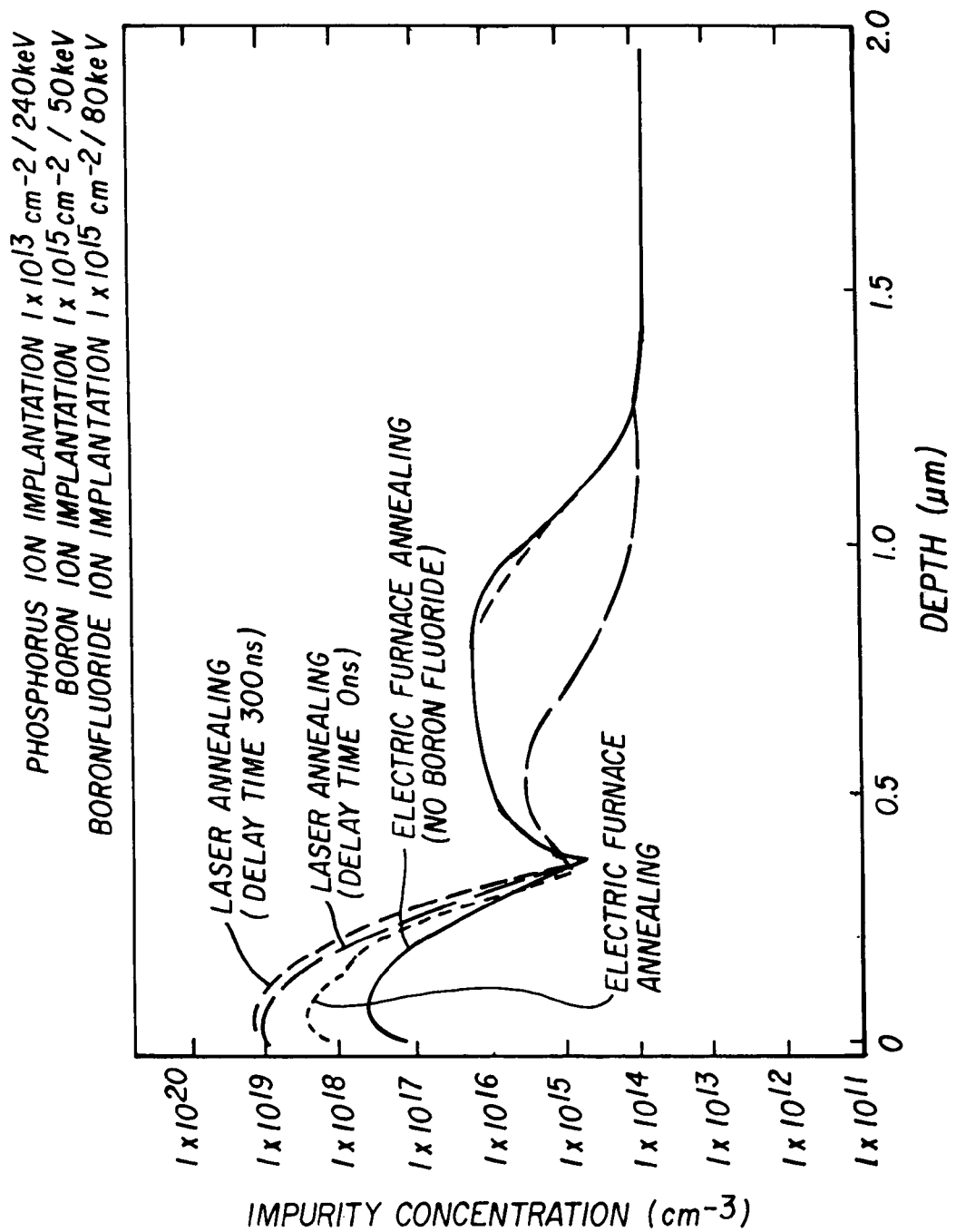
FIG. 18 is a diagram showing relationship of impurity concentration distributions with activation methods when forming a surface contact layer.

FIG. 18 is a diagram showing the relationship of impurity concentration distributions with activation methods when forming the surface contact layer. In FIG. 18, the horizontal axis represents the depth (μm) from the top surface of the FZ-N substrate and the vertical axis represents the impurity concentration ($cm^{-3}$). Phosphorus ions for the n-layer are implanted onto the FZ-N substrate with a dose of $1\times10^{13}$ $cm^{-2}$ and acceleration energy of 240 keV, boron ions for the p-layer are implanted with a dose of $1\times10^{15}$ $cm^{-2}$ and acceleration energy of 50 keV, and boron fluoride ions for the surface contact layer are implanted with a dose of $1\times10^{15}$ $cm^{-2}$ and acceleration energy of 80 keV. Impurity concentration distributions about the FZ-N substrate with such successive three layers being formed when electric furnace annealing was carried out and those when laser annealing was carried out are measured by the SR method. An impurity concentration distribution for the case where electric furnace annealing was carried out without implantation of boron fluoride ions also was measured for comparison. The electric furnace annealing is carried out at 400° C. for one hour and laser annealing is carried out using two laser irradiation devices of the YAG2ω laser with the irradiation energy density of the pulsed beam of each laser irradiation device at 2.0 J/cm², the total irradiation energy density at 4.0 J/cm², and the full-width at half maximum at 100 ns. Moreover, the delay time is 0 ns or 300 ns and the overlapping ratio in the laser irradiation is 90%.

In FIG. 18, the respective impurity concentration distributions in the case when the electric furnace annealing was carried out without implanting boron fluoride ions (a solid line), the case when the electric furnace annealing was carried out with boron fluoride ions implanted (a dotted line), the case when the laser annealing was carried out with boron fluoride ions implanted and the delay time was 0 ns (a chain double-dashed line), and the case when the laser annealing was carried out with boron fluoride ions implanted and the delay time was 300 ns (a chain line) are shown.

As shown in FIG. 18, the impurity concentration in the shallow region in the FZ-N substrate increases by implanting boron fluoride ions, even with the electric furnace annealing only. This is because the implantation of boron fluoride ions makes the boron fluoride ion implanted layer amorphous, which accelerates diffusion of impurities. Moreover, by carrying out the activation with laser annealing instead of electric furnace annealing, the impurity concentration in the shallow region is further increased. For keeping contact with the bottom surface electrode well, the boron concentration in the surface contact layer is more preferably $1\times10^{18}$ $cm^{-3}$ or more. By laser annealing, the shallow region from the surface of the FZ-N substrate can be doped with further higher concentration of impurities.

Furthermore, when the delay time is 300 ns in the activation carried out by laser annealing, the p-layer and the n-layer on the side deeper than the surface contact layer also can be doped with high impurity concentration at a level equivalent to that obtained by electric furnace annealing. This is because heat absorbed in the surface contact layer at the laser irradiation is transmitted to the p-layer provided beneath and further transmitted to the n-layer provided beneath to be absorbed therein.

In the laser annealing carried out here, the pulsed beams are projected with an adequate delay time. Thus, the activation of impurities can be carried out by a pulsed beam equivalent to that with an increased full-width at half maximum as described above. Along with this, the time of heat transmission becomes longer than that in laser irradiation with single pulsed beam, so that the substrate can be activated in a short time to a deep region from the surface to be irradiated by the laser. Moreover, by carrying out irradiation with successively projected pulsed beams, an amorphous state or a state with remaining crystalline defects, caused by difficulty in recrystallizing the boron fluoride ions implanted layer only by a preceding pulsed beam, can be brought to a recrystallized state and lead to a further progressed recrystallized state by succeeding pulsed beams. This makes it possible to make the shallow region from the surface doped with high concentration of boron.

The reason that the deep region is not doped with high concentration of impurities when laser annealing is carried out with the delay time of 0 ns is that the pulsed beams simultaneously projected make it difficult to obtain the recrystallization effect, and instantaneous irradiation of the surface side with simultaneously projected high energy laser beams makes it difficult to transmit heat to the deep region by ablation.

In this way, the invention is applied not only to the case of activating the pn-successive layers explained in the above first mode, but also to the case of activating the surface contact layer further formed on the pn-successive layers as explained in the second mode, by which both the shallow region and the deeper region from the substrate surface can be effectively activated.

Next, an explanation will be made about a third mode. In the third mode, a detailed explanation will be made about the case of activating successive layers with the same conductivity type.

For example, when particles are produced in the manufacturing process and attached to the substrate surface, impurity ions are prevented from being implanted in an area where such particles are presented even though ion implantation is carried out. This is liable to produce a variation in the impurity concentration after activation. Ion implantation carried out under a high acceleration voltage for the purpose of avoiding such an influence of the particle results in lowered impurity concentration in the shallow region and causes a problem of failing to provide contact with the bottom surface electrode. To avoid the influence of the particles to the utmost, it is preferable successively to form layers with the same conductivity type in the direction of depth and activate the layers. This makes it possible to activate impurities to a region with a depth more than the depth of the presented particles.

Figure 19:
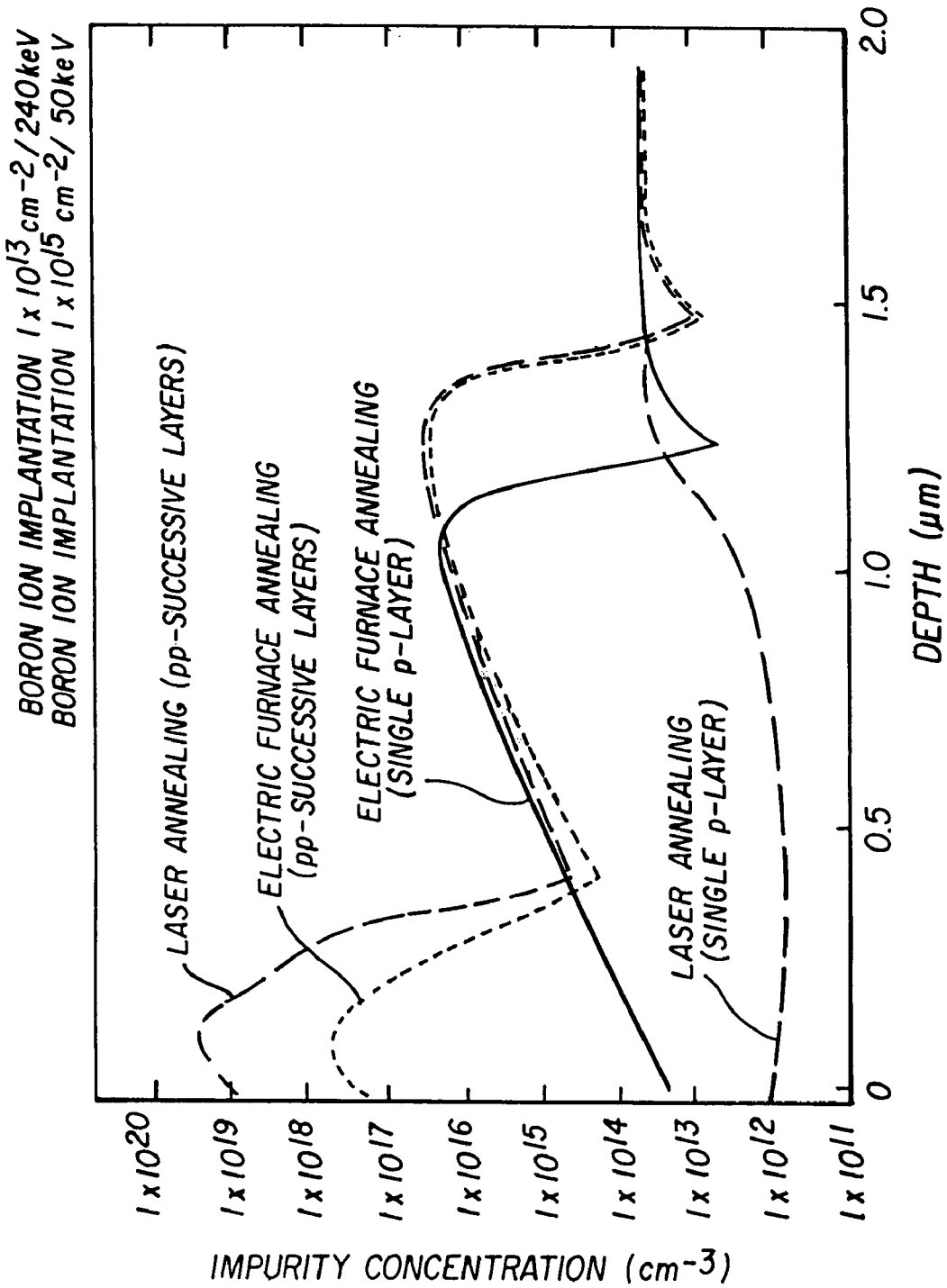
FIG. 19 is a diagram showing relationship of impurity concentration distributions with activation methods about pp-successive layers.

First, an explanation will be made about the activation of pp-successive layers in which p-layers are successively formed. FIG. 19 is diagram showing the relationship of impurity concentration distributions with activation methods for the pp-successive layers. In FIG. 19, the horizontal axis represents the depth (μm) from the top surface of the FZ-N substrate and the vertical axis represents the impurity concentration ($cm^{-3}$). Boron ions are implanted onto the FZ-N substrate with a dose of $1\times10^{13}$ $cm^{-2}$ and acceleration energy of 240 keV to form a single p-layer. Moreover, boron ions are implanted with a dose of $1\times10^{13}$ $cm^{-2}$ and acceleration energy of 240 keV onto the FZ-N substrate, and further boron ions are implanted with a dose of $1\times10^{15}$ $cm^{-2}$ and acceleration energy of 50 keV to form the pp-successive layers. Impurity concentration distribution about the thus formed single p-layer and pp-successive layers when electric furnace annealing or laser annealing was carried out is measured by the SR method. Electric furnace annealing is carried out at 400° C. for one hour and laser annealing is carried out using two laser irradiation devices of the YAG2ω laser with the irradiation energy density of the pulsed beam of each laser irradiation device being 2.0 $J/cm^2$, the total irradiation energy density being 4.0 $J/cm^2$, and the full-width at half maximum taken being 100 ns. Moreover, the delay time is 300 ns and the overlapping ratio in laser irradiation is 90%.

The respective impurity concentration distributions when electric furnace annealing was performed on the single p-layer (a solid line) or the pp-successive layers (a dotted line), and laser annealing was performed on the single p-layer (a chain double-dashed line) or the. pp-successive layers (a chain line) are shown in FIG. 19. As shown in FIG. 19, electric furnace annealing performed on the single p-layer, onto which ion implantation is carried out with high acceleration energy, provides impurity concentration that becomes lower corresponding to the range of the implanted ions in the shallow region on the top surface side of the substrate. Even with laser annealing performed on the single p-layer, the layer cannot be activated. Electric furnace annealing performed on the pp-successive layers increases the impurity concentration in the deep region, but provides insufficient impurity concentration in the shallow region. Contrary to this, laser annealing carried out about the pp-successive layers considerably increases the impurity concentration in the shallow region while the impurity concentration in a further deeper region also is maintained at a high level. This is because, in the same way as that explained about the second mode, the laser annealing carried out here accelerates activation of impurities with a pulsed beam having a large full-width at half maximum formed by successively projecting pulsed beams. Along with this, heat transmitted for a long time activates impurities to a deep region in a short time of the order of nanoseconds, and a layer made amorphous by the preceding pulsed beam is recrystallized by the succeeding pulsed beam.

Such activation of the pp-successive layers by laser annealing is particularly effective for a device such as an NPT type IGBT or a reverse-blocking IGBT in which only the p-layer is required to be activated, and for formation of the pp-successive layers that are made hard to be affected by the particles.

Figure 20:
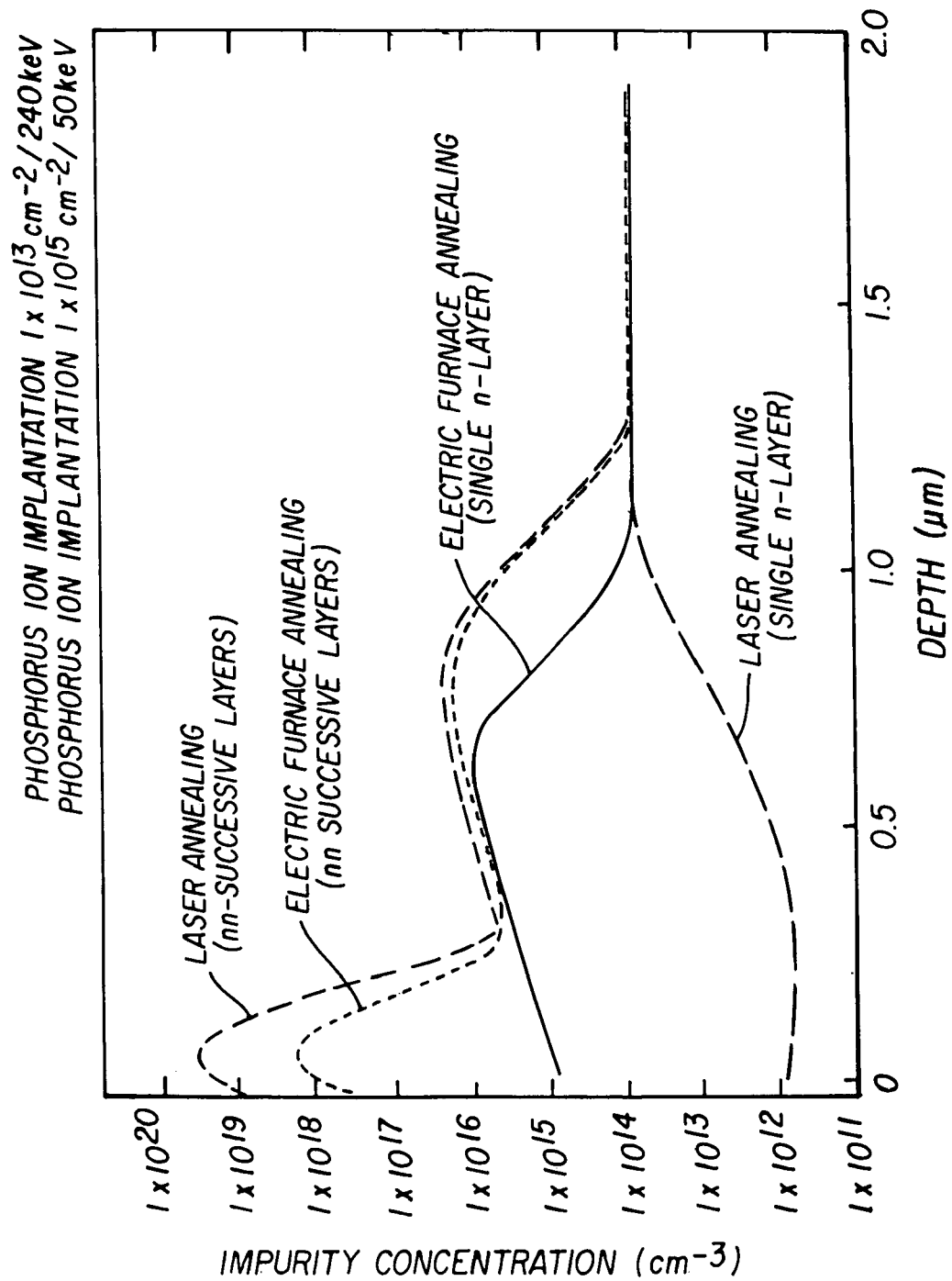
FIG. 20 is a diagram showing relationship of impurity concentration distributions with activation methods about nn-successive layers.

Next, an explanation will be made about the activation of an nn-successive layers in which n-layers are successively formed. FIG. 20 is a diagram showing the relationship of impurity concentration distributions with activation methods for the nn-successive layers. In FIG. 20, the horizontal axis represents the depth (μm) from the top surface of the FZ-N substrate and the vertical axis represents the impurity concentration ($cm^{-3}$). Phosphorus ions are implanted onto the FZ-N substrate with a dose of $1\times10^{13}$ $cm^{-2}$ and acceleration energy of 240 keV to form a single n-layer. Moreover, phosphorus ions are implanted onto the FZ-N substrate with a dose of $1\times10^{13}$ $cm^{-2}$ and acceleration energy of 240 keV, and further phosphorus ions are implanted with a dose of $1\times10^{15}$ $cm^{-2}$ and acceleration energy of 50 keV to form the nn-successive layers. Impurity concentration distribution about the thus formed single n-layer and nn-successive layers when electric furnace annealing or laser annealing was carried out is measured by the SR method. The conditions of the electric furnace annealing and the laser annealing are the same as those in the activation of the above pp-successive layers.

In FIG. 20, the respective impurity concentration distributions in the case when electric furnace annealing was performed on the single n-layer (a solid line) or the nn-successive layers (a dotted line), and laser annealing was performed on the single n-layer (a chain double-dashed line) or the nn-successive layers (a chain line), are shown. As shown in FIG. 20, electric furnace annealing performed on the single n-layer, onto which ion implantation is carried out with high acceleration energy, provides an impurity concentration that is decreased corresponding to the range of the implanted ions in the shallow region on the top surface side of the substrate. Even with laser annealing performed on the single n-layer, the layer cannot be activated. Electric furnace annealing performed on the nn-successive layers increases the impurity concentration in both the shallow region and the deep region. Moreover, laser annealing performed on the nn-successive layers considerably increases the impurity concentration in the shallow region. This is because, like in the case of the activation of the above pp-successive layers, the activation is performed by the pulsed beam with a large full-width at half maximum to make heat transmitted for a long time and to induce recrystallization of the amorphous layer at the laser irradiation.

Such activation of the nn-successive layers by laser annealing is particularly effective for a device such as an FWD in which only the n-layer is required to be activated, and for formation of the nn-successive layers that are made hard to be affected by the particles.

As explained in the third mode, also in the case of forming the pp-successive layers or the nn-successive layers, both the shallow region and the deeper region from the substrate surface can be effectively activated by applying the invention.

Next, an explanation will be made about a fourth mode. In the fourth mode, an explanation will be made about the case of activating successive layers of an argon induced layer (Ar layer), onto which argon ions ($Ar^+$) are implanted as impurity ions, and a p-layer, and successive layers of an Ar layer and an n-layer. This, like in the above third mode, is also effective for avoiding the effect of particles when impurity ions are implanted to a region with a depth more than the depth of the presented particles. In the fourth mode, however, only the p-layer or the n-layer which is successively provided to the Ar layer is activated.

Figure 21:
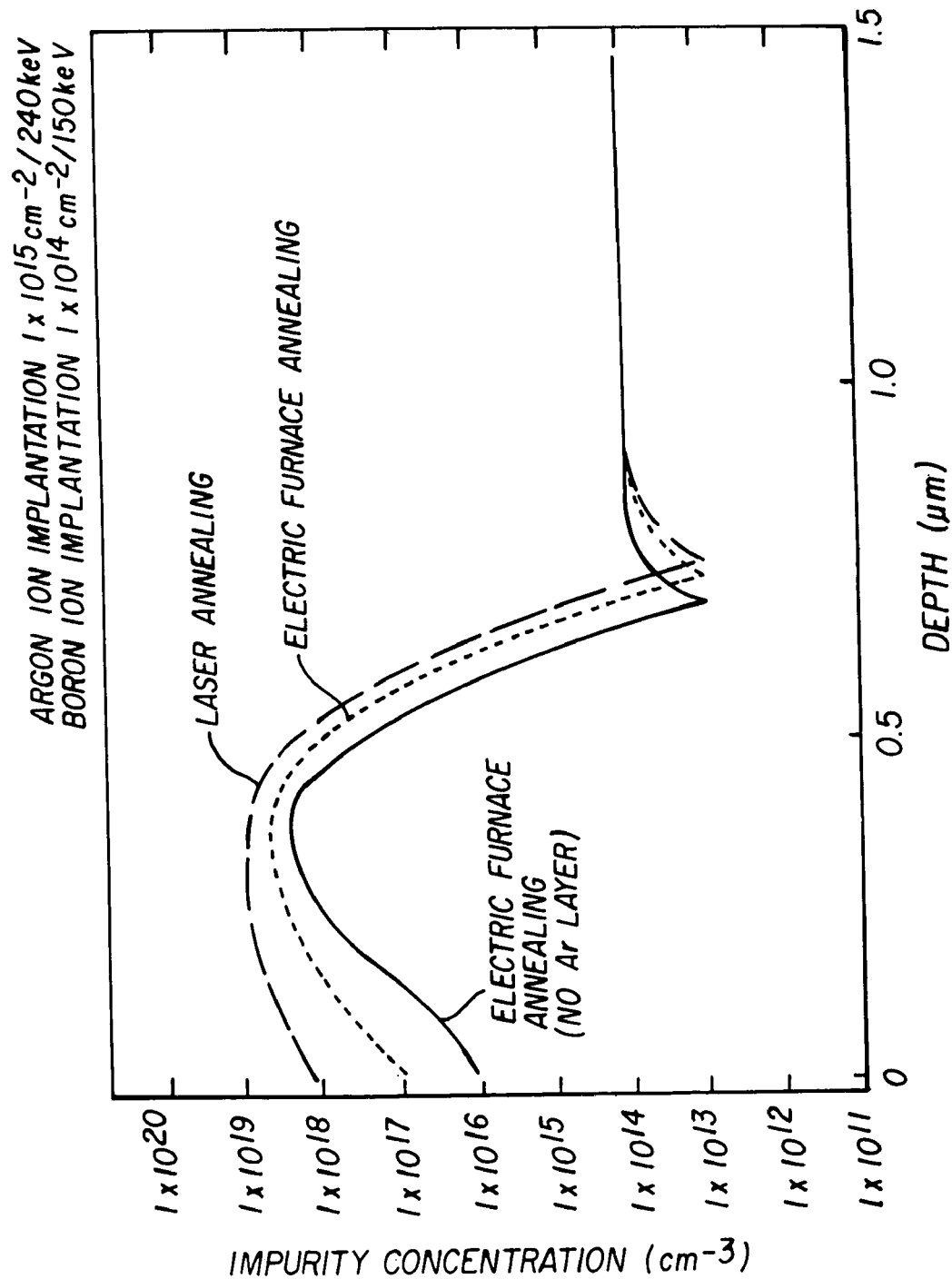
FIG. 21 is a diagram showing relationship of impurity concentration distributions with activation methods about a p-layer in successive layers of an Ar layer and the p-layer.

First, an explanation will be made about the case of activating the p-layer in a shallow region of the successive layers of the Ar layer and the p-layer. First argon ions and then boron ions are implanted into these successive layers. FIG. 21 is a diagram showing the relationship of impurity concentration distributions with activation methods for the p-layer in the successive layers of the Ar layer and the p-layer. In FIG. 21, the horizontal axis represents the depth ($\mu$m) from the top surface of the FZ-N substrate and the vertical axis represents the impurity concentration ($cm^{-3}$). Argon ions are first implanted onto the FZ-N substrate with a dose of $1\times10^{15}$ $cm^2$ and acceleration energy of 240 keV, and then boron ions are implanted with a dose of $1\times10^{14}$ $cm^{-2}$ and acceleration energy of 150 keV to form the successive layers of the Ar layer and the p-layer. Impurity concentration distribution about the thus formed successive layers of the Ar layer and the p-layer when electric furnace annealing or laser annealing was carried out is measured by the SR method. Electric furnace annealing is carried out at 400° C. for one hour and laser annealing is carried out using two laser irradiation devices of the YAG2$\omega$ laser with the irradiation energy density of the pulsed beam of each laser irradiation device being 2.0 $J/cm^2$, the total irradiation energy density being 4.0 $J/cm^2$, and the full-width at half maximum being 100 ns. Moreover, the delay time was 300 ns and the overlapping ratio in laser irradiation was 90%.

In FIG. 21, the respective impurity concentration distributions in the case of electric furnace annealing (a dotted line) and laser annealing (a chain double-dashed line) are shown. Moreover, an impurity concentration distribution (solid line) in the case when electric furnace annealing was carried out with only the p-layer formed by implanting impurity ions under the above conditions (a dose of $1\times10^{14}$ $cm^{-2}$ and acceleration energy of 150 keV) without forming the Ar layer also is shown in FIG. 21 for the purpose of comparison.

By carrying out electric furnace annealing with the Ar layer formed, impurity concentration can be increased as compared with the case of forming no Ar layer. By carrying out the laser annealing with the Ar layer formed, impurity concentrations in both the shallow region and the deep region from the substrate surface can be further increased. Therefore, impurity atoms implanted in the shallow region can be activated to the deeper region by laser annealing. Furthermore, activation in a short time of the order of nanoseconds is possible by laser annealing.

Figure 22:
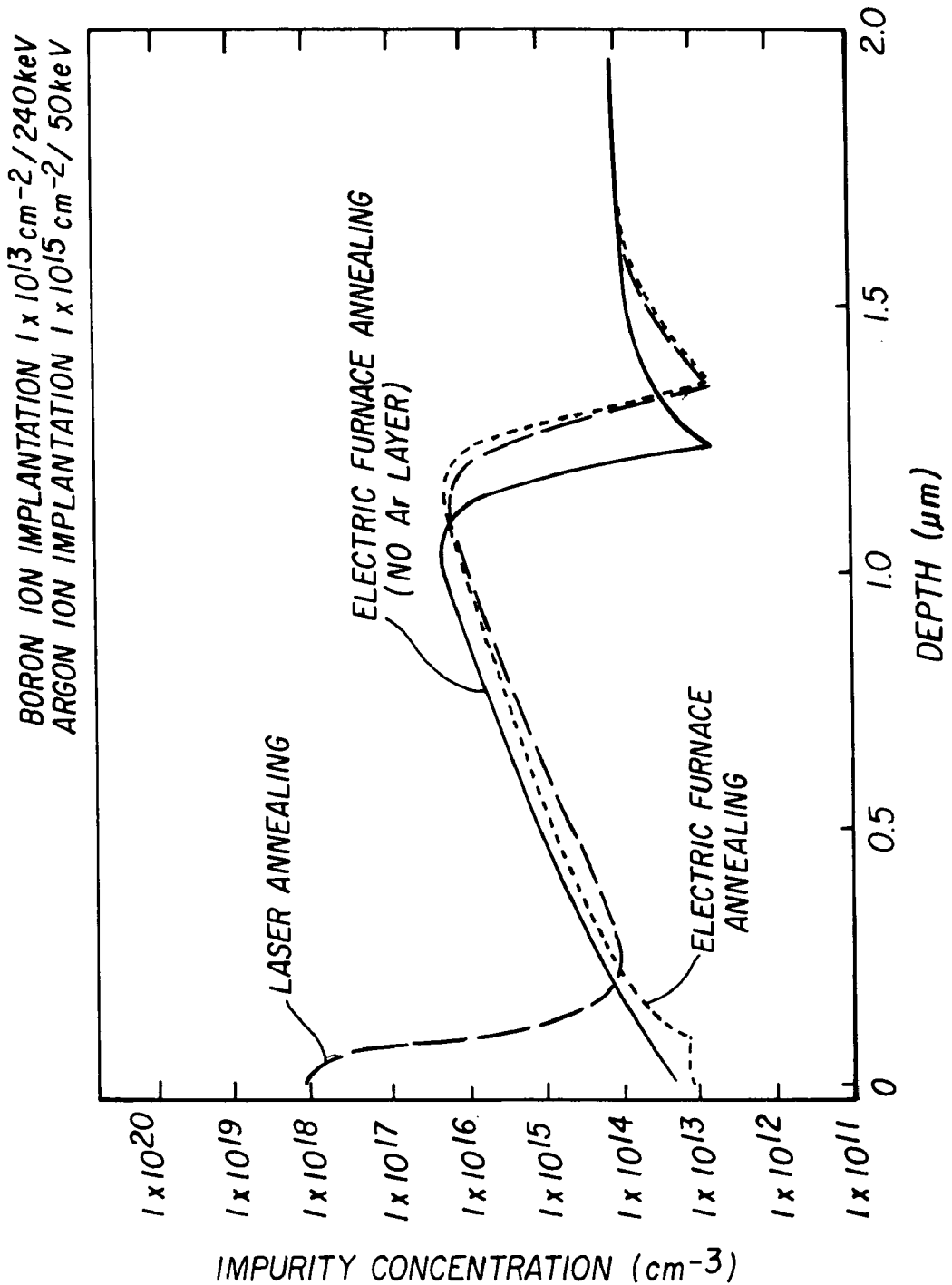
FIG. 22 is a diagram showing relationship of impurity concentration distributions with activation methods about a p-layer in successive layers of the p-layer and an Ar layer.

Next, an explanation will be made about the case of activating the p-layer in a deep region of the successive layers of the p-layer and the Ar layer into which successive layers boron ions are first implanted and then argon ions are implanted. FIG. 22 is a diagram showing the relationship of impurity concentration distributions with activation methods for the p-layer in the successive layers of the p-layer and the Ar layer. In FIG. 22, the horizontal axis represents the depth ($\mu$m) from the top surface of the FZ-N substrate and the vertical axis represents the impurity concentration ($cm^{-3}$). Boron ions are first implanted onto the FZ-N substrate with a dose of $1\times10^{13}$ $cm^{-2}$ and acceleration energy of 240 keV, and then argon ions are implanted with a dose of $1\times10^{15}$ $cm^{-2}$ and acceleration energy of 50 keV to form the successive layers of the p-layer and the Ar layer. Impurity concentration distribution about the thus formed successive layers of the p-layer and the Ar layer when electric furnace annealing or laser annealing was carried out is measured by the SR method. The conditions of electric furnace annealing and laser annealing are the same as those in the above case of activating the above successive layers of the Ar layer and the p-layer.

In FIG. 22, the respective impurity concentration distributions in the case of electric furnace annealing (a dotted line) and laser annealing (a chain double-dashed line) are shown. Moreover, an impurity concentration distribution (solid line) in the case when electric furnace annealing was carried out with only the p-layer formed by implanting impurity ions under the above conditions (a dose of $1\times10^{13}$ $cm^{-2}$ and acceleration energy of 240 keV) without forming the Ar layer also are shown in FIG. 22 for the purpose of comparison.

The impurity concentration in the shallow region from the substrate surface is low when electric furnace annealing is performed, regardless of whether the Ar layer is formed or not, so that the region cannot be sufficiently activated. Contrary to this, when laser annealing is carried out with the deposited Ar layer, the impurity concentration in the shallow region increases and the impurity concentration in the deep region is also high. This is because the activation is carried out by the pulsed beam with a large full-width at half maximum to make a heat transmission time long and to induce recrystallization of the amorphous layer at the laser irradiation. The Ar layer is heated up to on the order of 1400° C. at the laser irradiation to cause the argon as an inert gas to evaporate so as to make the p-layer remain on the substrate surface side. Impurity atoms implanted in the deep region can be activated to the shallow region by laser annealing, and further, up to the substrate surface. Furthermore, activation in a short time of the order of nanoseconds is possible with laser annealing. Such activation by laser annealing is particularly effective for a device such as an NPT type IGBT or a reverse-blocking IGBT in which only the p-layer is required to be activated, and for formation of the p-layer that is hard to be affected by the particles.

Figure 23:
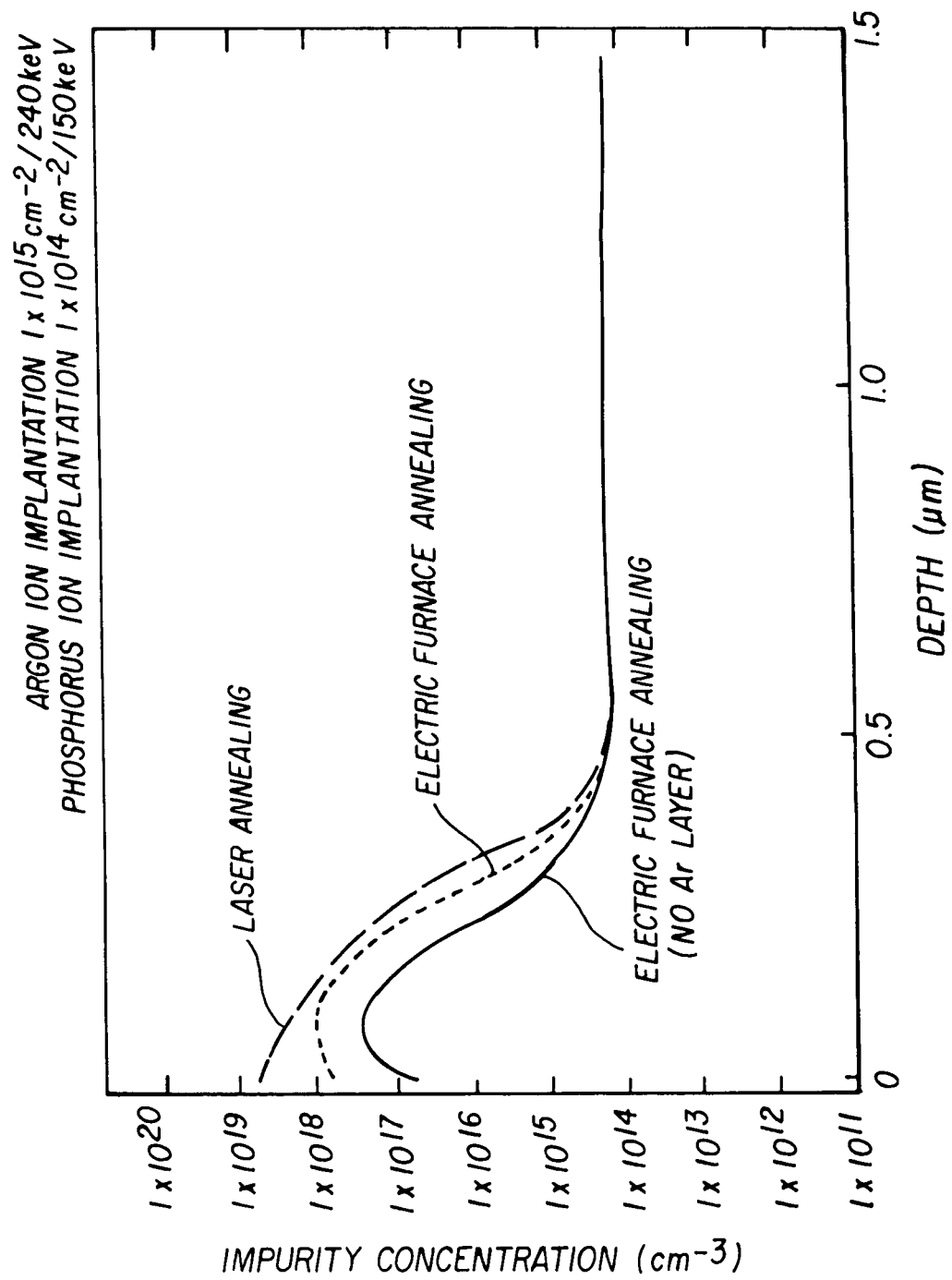
FIG. 23 is a diagram showing relationship of impurity concentration distributions with activation methods about an n-layer in successive layers of the Ar layer and the n-layer.

Next, an explanation will be made about the case of activating the n-layer in a shallow region of the successive layers of the Ar layer and the n-layer into which successive layers the argon ions are first implanted and then phosphorus ions are implanted. FIG. 23 is a diagram showing the relationship of impurity concentration distributions with activation methods for the n-layer in the successive layers of the Ar layer and the n-layer. In FIG. 23, the horizontal axis represents the depth ($\mu$m) from the top surface of the FZ-N substrate and the vertical axis represents the impurity concentration ($cm^{-3}$). Argon ions are first implanted onto the FZ-N substrate with a dose of $1\times10^{15}$ $cm^{-2}$ and acceleration energy of 240 keV, and then phosphorus ions are implanted with a dose of $1\times10^{14}$ $cm^{-2}$ and acceleration energy of 150 keV to form the successive layers of the Ar layer and the n-layer. Impurity concentration distribution about the thus formed successive layers of the Ar layer and the n-layer when electric furnace annealing or laser annealing was carried out is measured by the SR method. The conditions of the electric furnace annealing and the laser annealing are the same as those in the case of activating the above successive layers of the Ar layer and the p-layer.

In FIG. 23, the respective impurity concentration distributions in the case of electric furnace annealing (a dotted line) and laser annealing (a chain double-dashed line) are shown. Moreover, an impurity concentration distribution (solid line) in the case when electric furnace annealing was carried out with only the n-layer formed by implanting impurity ions under the above conditions (a dose of $1\times10^{14}$ cm$^{-2}$ and acceleration energy of 150 keV) without forming the Ar layer also is shown in FIG. 23, for the purpose of comparison.

Impurity concentration when using electric furnace annealing with the Ar layer formed is higher compared with the case of forming no Ar layer. However, by carrying out laser annealing with the Ar layer formed, impurity concentrations in both the shallow region and the deep region from the substrate surface can be further increased. Therefore, impurity atoms implanted in the shallow region can be activated to the deeper region by laser annealing. Furthermore, activation in a short time of the order of nanoseconds is possible by laser annealing.

Figure 24:
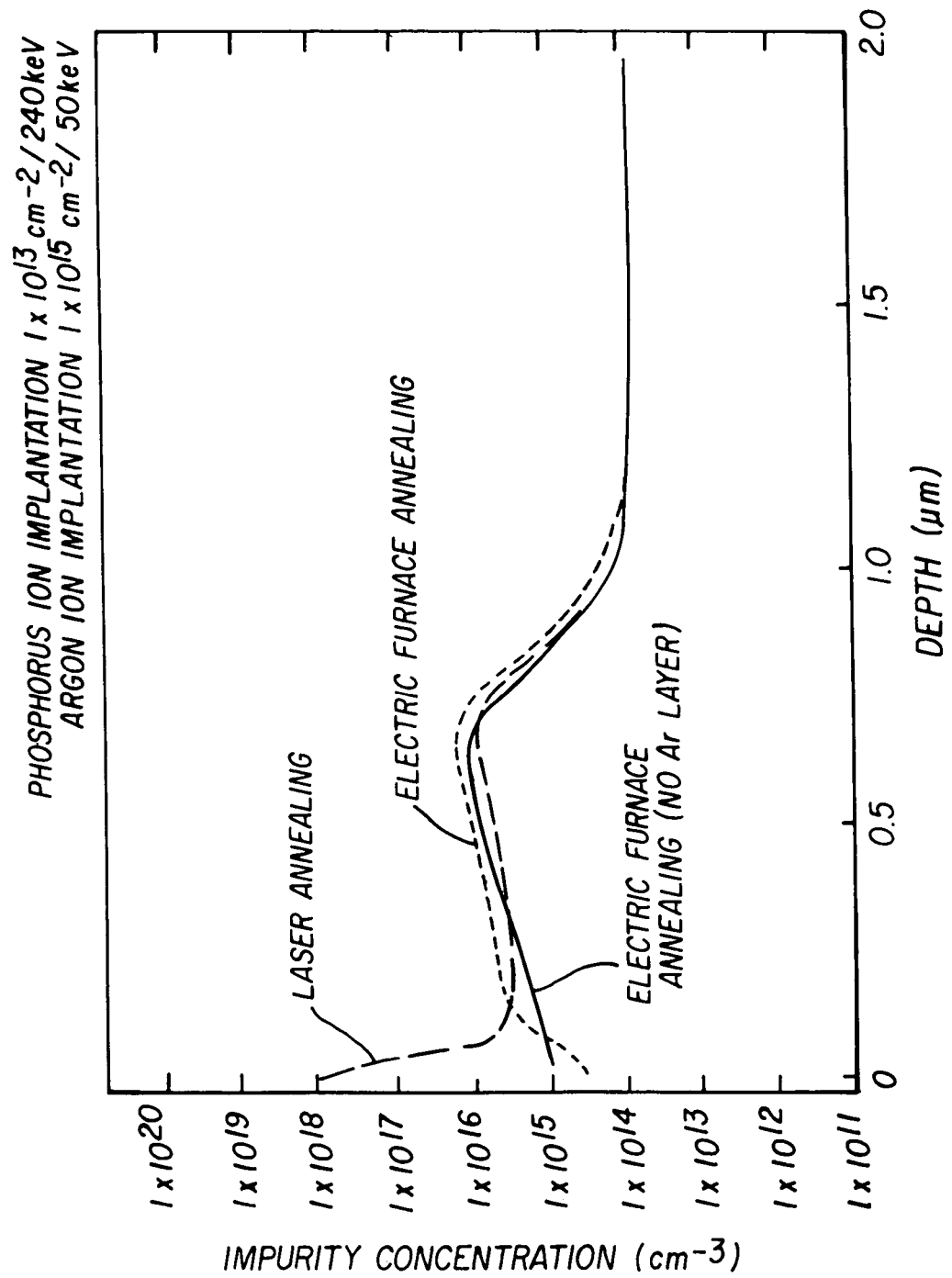
FIG. 24 is a diagram showing relationship of impurity concentration distributions with activation methods about an n-layer in successive layers of the n-layer and an Ar layer.

Next, an explanation will be made about the case of activating the n-layer in a deep region of the successive layers of the n-layer and the Ar layer into which successive layers phosphorus ions are first implanted and then argon ions are implanted. FIG. 24 is a diagram showing the relationship of impurity concentration distributions with activation methods for the n-layer in the successive layers of the n layer and the Ar layer. In FIG. 24, the horizontal axis represents the depth (μm) from the top surface of the FZ-N substrate and the vertical axis represents the impurity concentration (cm$^{-3}$). Phosphorus ions are first implanted onto the FZ-N substrate with a dose of $1 \times 10^{13}$ cm$^{-2}$ and acceleration energy of 240 keV, and then argon ions are implanted with a dose of $1 \times 10^{15}$ cm$^{-2}$ and acceleration energy of 50 keV to form the successive layers of the n-layer and the Ar layer. Impurity concentration distribution about thus formed successive layers of the n-layer and the argon layer when electric furnace annealing or laser annealing was carried out is measured by the SR method. The conditions of the electric furnace annealing and the laser annealing are the same as those in the case of activating the p-layer in the shallow region of the above successive layers of the Ar layer and the p-layer.

In FIG. 24, the respective impurity concentration distributions in the case of electric furnace annealing (a dotted line) and laser annealing (a chain double-dashed line) are shown. Moreover, an impurity concentration distribution (solid line) in the case when electric furnace annealing was carried out with only the n-layer formed by implanting impurity ions under the above conditions (a dose of $1 \times 10^{13}$ cm$^{-2}$ and acceleration energy of 240 keV) without forming the Ar layer also is shown in FIG. 24, for the purpose of comparison.

Regardless of whether the Ar layer is formed or not, the impurity concentration in the shallow region from the substrate surface when using electric furnace annealing is low, so that the region cannot be sufficiently activated. Contrary to this, when laser annealing is carried out with the deposited Ar layer, the impurity concentration in the shallow region increases and the impurity concentration in the deep region is also high. This is because the activation is carried out by the pulsed beam with a large full-width at half maximum to make a heat transmission time long and to induce recrystallization of the amorphous layer at the laser irradiation. The argon evaporates at the laser irradiation to make the p-layer remain on the substrate surface side. Impurity atoms implanted in the deep region can be activated to the shallow region by the laser annealing. Furthermore, activation in a short time of the order of nanoseconds is possible by laser annealing. Such activation by laser annealing is particularly effective for a device such as an FWD in which only the n-layer is required to be activated and for formation of the n-layer that is hard to be affected by the particles.

Phosphorus, being an element heavier than boron, exhibits less segregation effect than boron. Thus, with the same dose and acceleration energy, the impurity concentration on the surface side becomes lower and the diffusion depth also becomes shallower in the case when phosphorus is used than in the case when boron is used.

As explained above, by first implanting argon ions and thereafter implanting boron ions or phosphorus ions, or by first implanting boron ions or phosphorus ions and thereafter implanting argon ions, the p-layer and the n-layer can be activated. This is because the region where argon ions are implanted becomes an amorphous layer and the amorphous Ar layer functions at annealing to accelerate activation of the p-layer and the n-layer into which the respective impurity ions are implanted before or after the argon ions are implanted. Moreover, this is very effective in that the p-layer and the n-layer can be activated in a short time of the order of nanoseconds by carrying out the annealing with the laser pulsed beam successively projected. More particularly, along with the activation in the layer on the deep side, the impurity concentration in the shallow region on the substrate surface side can be increased.

As explained in the fourth mode, also in the case of activating the successive layers of the Ar layer and the p-layer, and the successive layers of the Ar layer and the n-layer, both the shallow region and the deeper region from the substrate surface can be effectively activated by applying the invention.

Next, an explanation will be made about a fifth mode. In the fifth mode, an explanation will be made about the case of activating successive layers of an silicon induced layer (Si layer), onto which silicon ions (Si$^+$) are implanted as impurity ions, and a p-layer, and successive layers of the Si layer and an n-layer. This, like in the above fourth mode, is also effective when impurity ions are implanted to a region with a depth more than the depth of the presented particles, and only the p-layer or the n-layer in the successive layers is activated.

Figure 25:
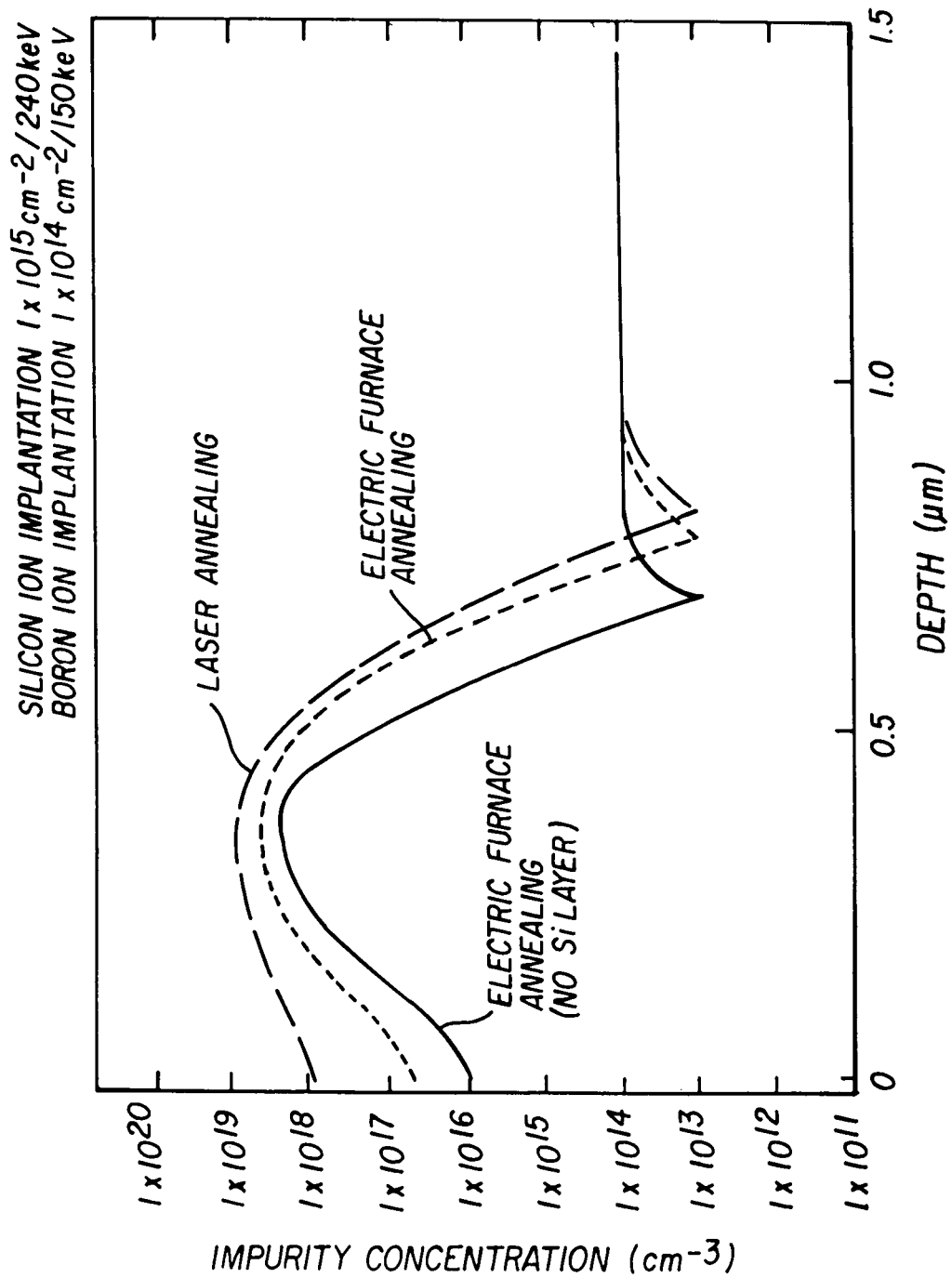
FIG. 25 is a diagram showing relationship of impurity concentration distributions with activation methods about a p-layer in successive layers of a Si layer and the p-layer.

First, an explanation will be made about the case of activating the p-layer becoming a shallow region of the successive layers of the Si layer and the p-layer into which successive layers the silicon ions are first implanted and then boron ions are implanted. FIG. 25 is a diagram showing the relationship of impurity concentration distributions with activation methods about the p-layer in the successive layers of the Si layer and the p-layer. In FIG. 25, the horizontal axis represents the depth (μm) from the top surface of the FZ-N substrate and the vertical axis represents the impurity concentration (cm$^{-3}$). Silicon ions are first implanted onto the FZ-N substrate with a dose of $1 \times 10^{15}$ cm$^{-2}$ and acceleration energy of 240 keV, and then boron ions are implanted with a dose of $1 \times 10^{14}$ cm$^{-2}$ and acceleration energy of 150 keV to form the successive layers of the Si layer and the p-layer. Impurity concentration distribution about the thus formed successive layers of the Si layer and the p-layer when electric furnace annealing or laser annealing was carried out is measured by the SR method. The conditions of the electric furnace annealing and the laser annealing are the same as those in the above fourth mode. Namely, electric furnace annealing is carried out at 400° C. for one hour and laser annealing is carried out using two laser irradiation devices of the YAG2ω laser with the irradiation energy density of the pulsed beam of each laser irradiation device being 2.0 J/cm$^2$, the total irradiation energy density being 4.0 J/cm$^2$, and the fill-width at half maximum taken being 100 ns. Moreover, the delay time was 300 ns and the overlapping ratio in laser irradiation was 90%.

In FIG. 25, the respective impurity concentration distributions in the case of electric furnace annealing (a dotted line) and laser annealing (a chain double-dashed line) are shown. Moreover, an impurity concentration distribution (solid line) in the case when electric furnace annealing was carried out with only the p-layer formed by implanting impurity ions under the above conditions (a dose of 1×1014 cm-2 and acceleration energy of 150 keV) without forming the Si layer also is shown in FIG. 25, for the purpose of comparison.

Impurity concentration can be increased compared with the case of forming no Si layer by carrying out electric furnace annealing with the Si layer formed. However, impurity concentrations in both the shallow region and the deep region from the substrate surface can be further increased by carrying out laser annealing with the Si layer formed. Therefore, impurity atoms implanted in the shallow region can be activated to the deeper region by laser annealing. Furthermore, activation in a short time of the order of nanoseconds is possible by laser annealing.

Figure 26:
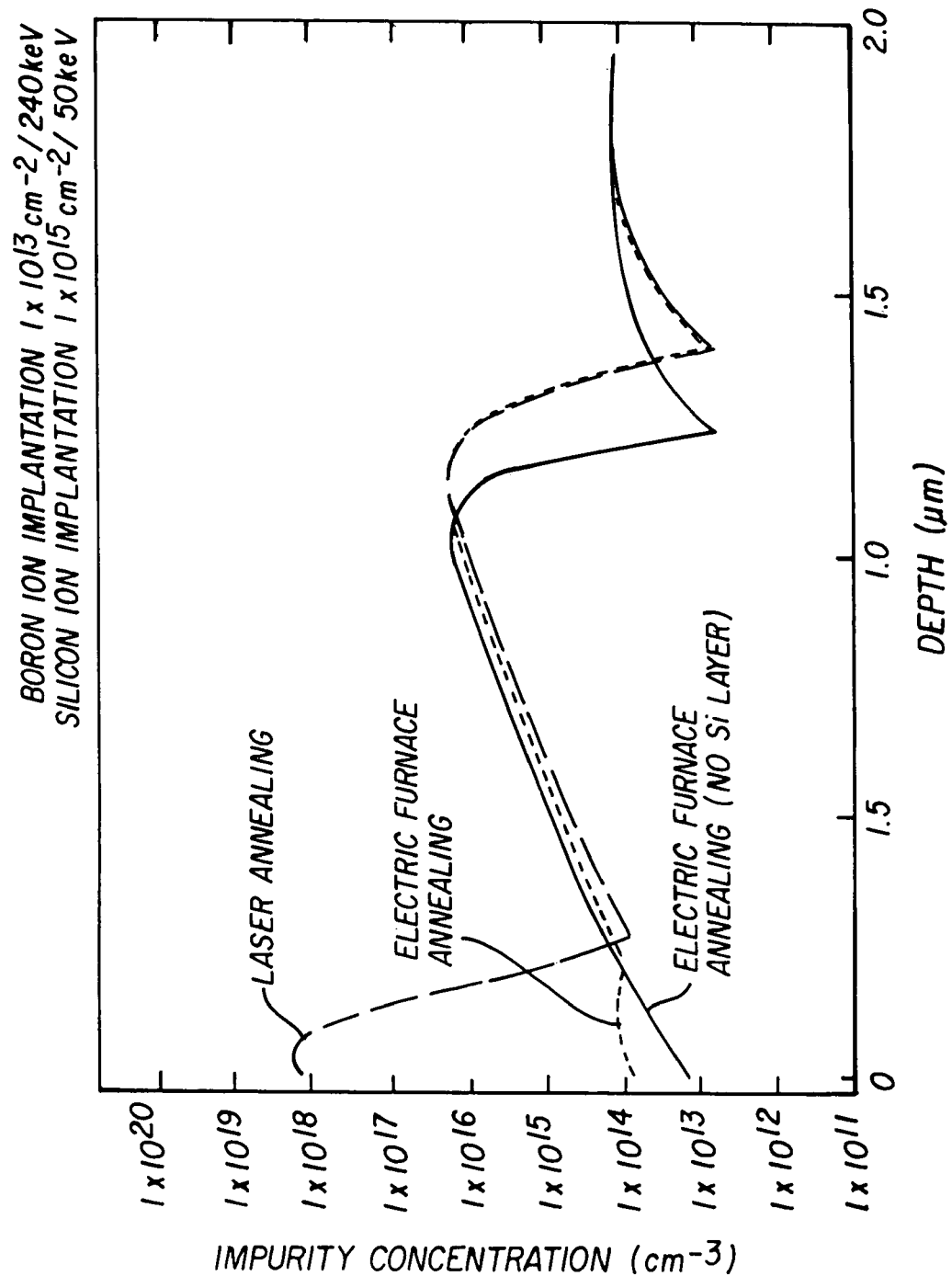
FIG. 26 is a diagram showing relationship of impurity concentration distributions with activation methods about a p-layer in successive layers of the p-layer and a Si layer.

Next, an explanation will be made about the case of activating the p-layer in a deep region of the successive layers of the p-layer and the Si layer into which successive layers boron ions are first implanted and then silicon ions are implanted. FIG. 26 is a diagram showing the relationship of impurity concentration distributions with activation methods for the p-layer in the successive layers of the p-layer and the Si layer. In FIG. 26, the horizontal axis represents the depth (μm) from the top surface of the FZ-N substrate and the vertical axis represents the impurity concentration ($cm^{-3}$). Boron ions are first implanted onto the FZ-N substrate with a dose of $1×10^{13}$ $cm^{-2}$ and acceleration energy of 240 keV, and then silicon ions are implanted with a dose of $1×10^{15}$ $cm^{-2}$ and acceleration energy of 50 keV to form the successive layers of the p-layer and the Si layer. Impurity concentration distribution about the thus formed successive layers of the p-layer and the Si layer when electric furnace annealing or laser annealing was carried out is measured by the SR method. The conditions of the electric furnace annealing and the laser annealing are the same as those in the above case of activating the above successive layers of the Si layer and the p-layer.

In FIG. 26, the respective impurity concentration distributions in the case of electric furnace annealing (a dotted line) and laser annealing (a chain double-dashed line) are shown. Moreover, an impurity concentration distribution (solid line) in the case when electric furnace annealing was carried out with only the p-layer formed by implanting impurity ions under the above conditions (a dose of $1×10^{13}$ $cm^{-2}$ and acceleration energy of 240 keV) without forming the Si layer also are shown in FIG. 26, for the purpose of comparison.

The impurity concentration in the shallow region from the substrate surface is low when using electric furnace annealing, so that the region cannot be sufficiently activated regardless of whether the Si layer is formed or not. Contrary to this, when laser annealing is carried out with the deposited Si layer, the impurity concentration in the shallow region increases and the impurity concentration in the deep region is also high. This is because the activation is carried out by the pulsed beam with a large full-width at half maximum to make a heat transmission time long and to induce recrystallization of the amorphous layer at the laser irradiation. Impurity atoms implanted in the deep region can be activated to the shallow region by laser annealing. Furthermore, activation can be carried out in a short time of the order of nanoseconds. Such activation by laser annealing is particularly effective for a device such as an NPT type IGBT or a reverse-blocking IGBT in which only the p-layer is required to be activated, and for formation of the p-layer that is hard to be affected by the particles.

Figure 27:
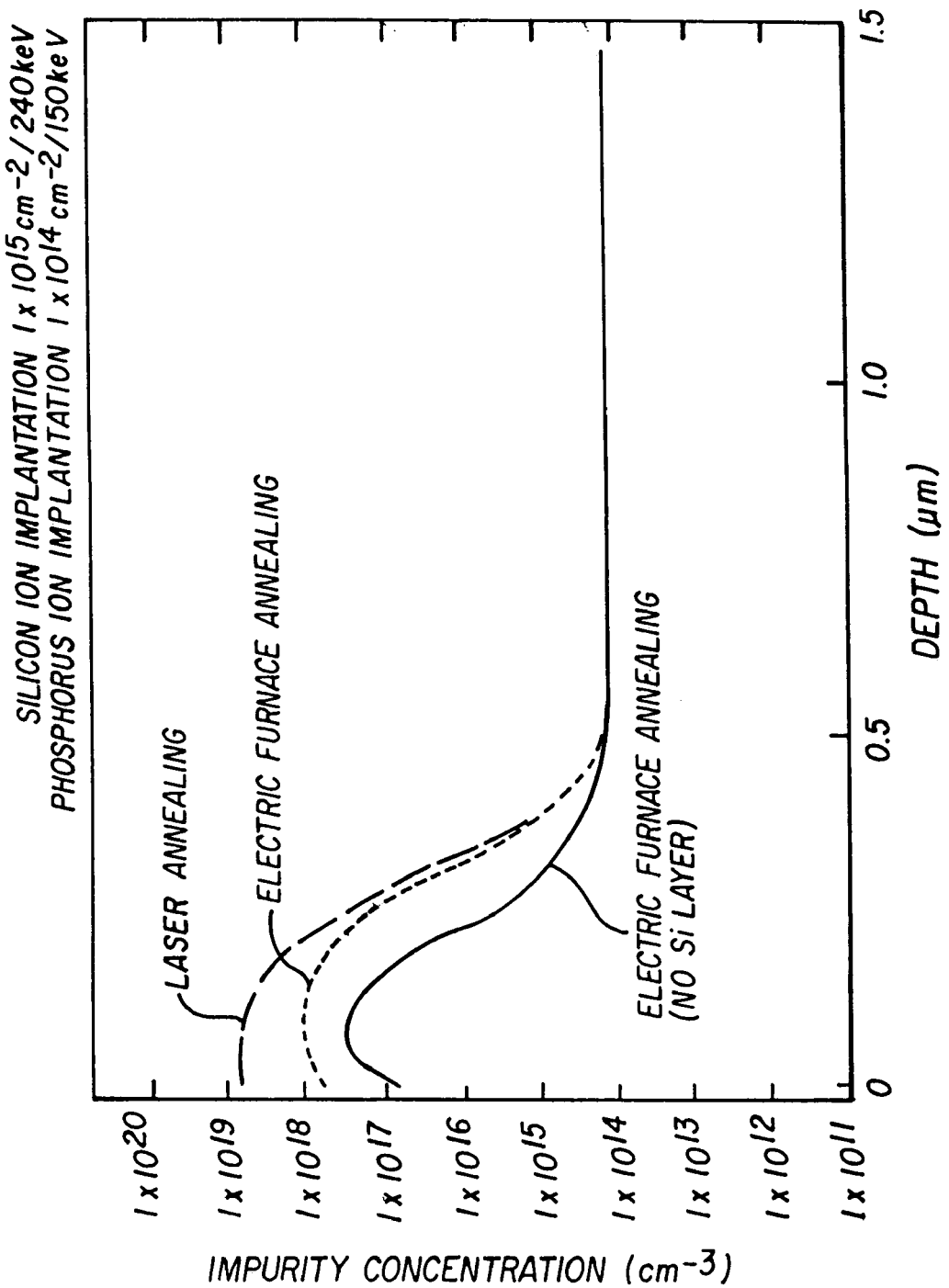
FIG. 27 is a diagram showing relationship of impurity concentration distributions with activation methods about an n-layer in successive layers of a Si layer and the n-layer.

Next, an explanation will be made about the case of activating the n-layer in a shallow region of the successive layers of the Si layer and the n-layer into which successive layers the silicon ions are first implanted and then phosphorus ions are implanted. FIG. 27 is a diagram showing the relationship of impurity concentration distributions with activation methods about the n-layer in the successive layers of the Si layer and the n-layer. In FIG. 27, the horizontal axis represents the depth (μm) from the top surface of the FZ-N substrate and the vertical axis represents the impurity concentration ($cm^{-3}$). Silicon ions are first implanted onto the FZ-N substrate with a dose of $1×10^{15}$ $cm^{-2}$ and acceleration energy of 240 keV, and then phosphorus ions are implanted with a dose of $1×10^{14}$ $cm^{-2}$ and acceleration energy of 150 keV to form the successive layers of the Si layer and the n-layer. Impurity concentration distribution about the thus formed successive layers of the Si layer and the n-layer when electric furnace annealing or laser annealing was carried out is measured by the SR method. The conditions of the electric furnace annealing and the laser annealing are the same as those in the case of activating the above successive layers of the Si layer and the p-layer.

In FIG. 27, the respective impurity concentration distributions in the case of the electric furnace annealing (a dotted line) and laser annealing (a chain double-dashed line) are shown. Moreover, an impurity concentration distribution (solid line) in the case when electric furnace annealing was carried out with only the n-layer formed by implanting impurity ions under the above conditions (a dose of $1×10^{14}$ $cm^{-2}$ and acceleration energy of 150 keV) without forming the Si layer also is shown in FIG. 27, for the purpose of comparison.

Impurity concentration can be increased compared with the case of forming no Si layer by carrying out the electric furnace annealing with the Si layer formed. However, impurity concentrations particularly in the shallow region from the substrate surface can be further increased by carrying out laser annealing with the Si layer formed. Therefore, impurity atoms implanted in the shallow region can be activated to the deeper region by the laser annealing. Furthermore, activation can be carried out in a short time of the order of nanoseconds.

Figure 28:
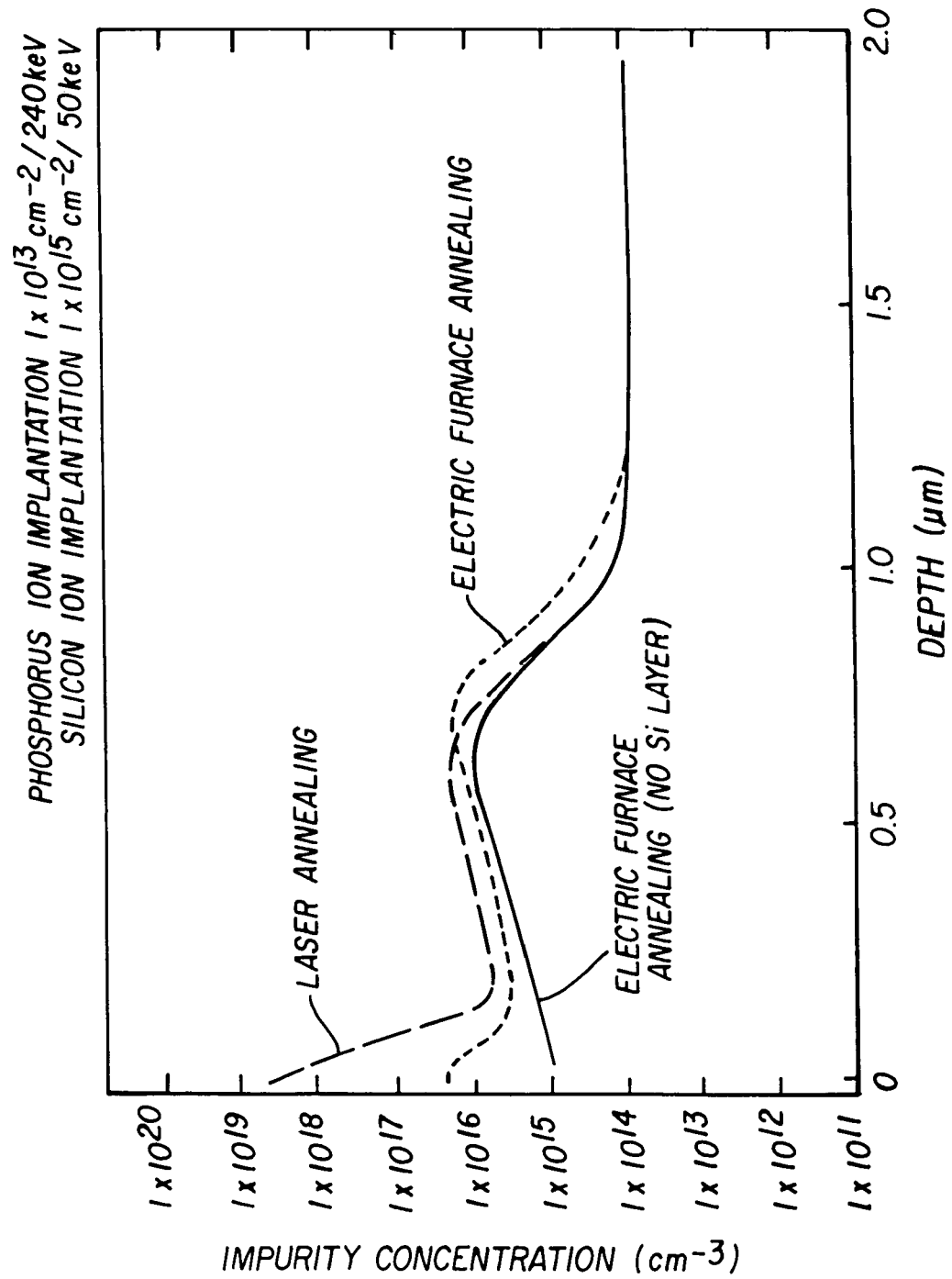
FIG. 28 is a diagram showing relationship of impurity concentration distributions with activation methods about an n-layer in successive layers of the n-layer and a Si layer.

Next, an explanation will be made about the case of activating the n-layer in a deep region of the successive layers of the n-layer and the Si layer into which successive layers phosphorus ions are first implanted and then silicon ions are implanted. FIG. 28 is a diagram showing the relationship of impurity concentration distributions with activation methods about the n-layer in the successive layers of the n-layer and the Si layer. In FIG. 28, the horizontal axis represents the depth (μm) from the top surface of the FZ-N substrate and the vertical axis represents the impurity concentration ($cm^{-3}$). Phosphorus ions are first implanted onto the FZ-N substrate with a dose of $1×10^{13}$ $cm^{-2}$ and acceleration energy of 240 keV, and then silicon ions are implanted with a dose of $1×10^{15}$ $cm^{-2}$ and acceleration energy of 50 keV to form the successive layers of the n-layer and the Si layer. Impurity concentration distribution about the thus formed successive layers of the n-layer and the Si layer when electric furnace annealing or laser annealing was carried out is measured by the SR method. The conditions of the electric furnace annealing and the laser annealing are the same as those in the case of activating the above successive layers of the Si layer and the p-layer.

In FIG. 28, the respective impurity concentration distributions in the case of electric furnace annealing (a dotted line) and laser annealing (a chain double-dashed line) are shown. Moreover, an impurity concentration distribution (solid line) in the case when electric furnace annealing was carried out with only the n-layer formed by implanting impurity ions under the above conditions (a dose of $1 \times 10^{13}$ cm$^{-2}$ and acceleration energy of 240 keV) without forming the Si layer also is shown in FIG. 28, for the purpose of comparison.

The impurity concentration in the shallow region from the substrate surface when using electric furnace annealing is low, so that the region cannot be sufficiently activated regardless of whether the Si layer is formed or not. Contrary to this, the impurity concentration in the shallow region increases and the impurity concentration in the deep region is also high when laser annealing is carried out with the deposited Si layer. This is because the activation is carried out by the pulsed beam with a large full-width at half maximum to make a heat transmission time long and to induce recrystallization of the amorphous layer at the laser irradiation. Impurity atoms implanted in the deep region can be activated to the shallow region by laser annealing. Furthermore, activation in a short time of the order of nanoseconds is possible. Such activation by laser annealing is particularly effective for a device such as an FWD in which only the n-layer is required to be activated and for formation of the n-layer that is hard to be affected by the particles.

As explained above, by implanting silicon ions first and thereafter implanting boron ions or phosphorus ions, or by implanting boron ions or phosphorus ions first and thereafter implanting silicon ions, the p-layer and the n-layer can be activated. This is for the same reason as that for the activation when the Ar layer is used which was explained with respect to the fourth mode. Thus, this is very effective in that the shallow region can be activated along with the deep region in a short time of the order of nanoseconds.

The effect of implanting silicon ions has been already reported (Nakada et al., J. Appl. Phys., 81 (6), 15 Mar. 1997). However, laser annealing according to the invention makes it possible to activate a shallow region and a deeper region on the substrate surface side in a short time of the order of nanoseconds, without carrying out multi-step implantation and long time annealing as were reported.

As explained in the fifth mode, also in the case of activating the successive layers of the Si layer and the p-layer, and the successive layers of the Si layer and the n-layer, both the shallow region and the deeper region from the substrate surface can be effectively activated by applying the invention.

The conditions of the laser annealing, explained above with respect to second to fifth modes, can be modified within the range explained above for the first mode. With the conditions within the range, the same results as those explained for the second to fifth modes can be obtained.

In the same way as explained above for the first mode, also in the second to fifth modes, the activation of the p-layer and the n-layer can be realized in a very short time of the order of nanoseconds in the technology of forming a thin wafer by the method of securing a wafer on a supporting substrate by an adhesive sheet. Moreover, in forming a semiconductor element such as an IGBT, a deep doped layer can be formed in an FZ substrate without using an epitaxial substrate. Furthermore, in forming the FS type IGBT, the p-layer and the n-layer formed on the bottom surface side can be activated without exerting any thermal effect on the top surface side, on which element structures such as transistors are already formed. When no adhesive sheet is used, laser annealing can be also carried out together with electric furnace annealing. In this case, electric furnace annealing can be carried out regardless of whether it is carried out before or after the laser annealing.

Next, further detailed explanations will be made in the following sixth and seventh modes about the delay time and the overlapping ratio of the pulsed beams at the activation of the doped layer region by the laser annealing.

First, an explanation will be made about a sixth mode. Here, a detailed explanation about the delay time of the pulsed beam will be made with the following case taken as an example. In this case, successive three layers are activated in which, like in the above second mode, a p-layer as a surface contact layer is formed on pn-successive layers by implanting phosphorus ions, boron ions and boron fluoride ions onto the FZ-N substrate of the FS type IGBT.

Figure 29:
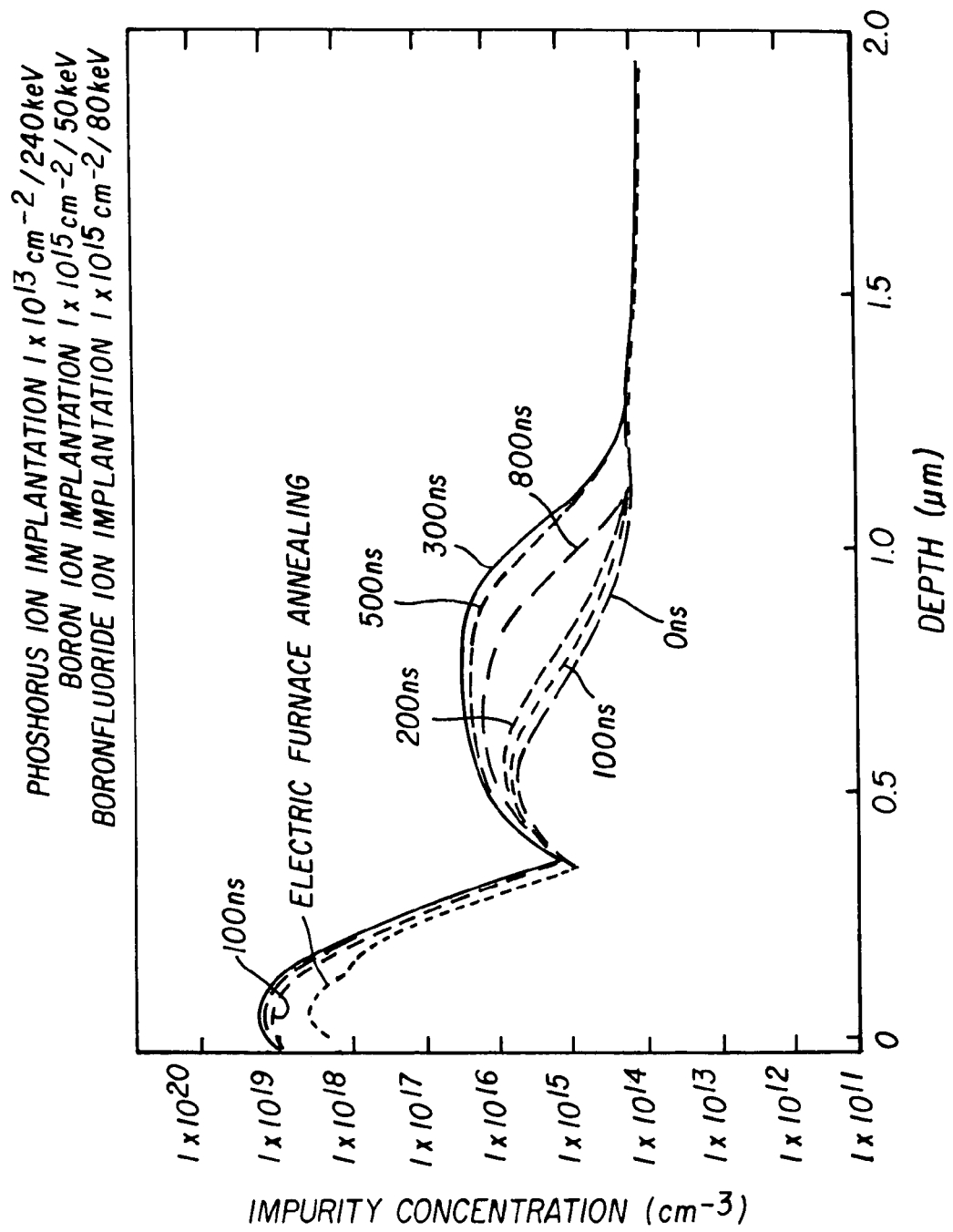
FIG. 29 is a diagram showing relationship of impurity concentration distributions with delay times of pulsed beams in activation of three successive layers.

FIG. 29 is a diagram showing the relationship of impurity concentration distributions with delay times of the pulsed beams in the activation of the three successive layers. In FIG. 29, the horizontal axis represents the depth (μm) from the top surface of the FZ-N substrate and the vertical axis represents the impurity concentration (cm$^{-3}$). Phosphorus ions for the n-layer are implanted onto the FZ-N substrate with a dose of $1 \times 10^{13}$ cm$^{-2}$ and acceleration energy of 240 keV, boron ions for the p-layer are implanted with a dose of $1 \times 10^{15}$ cm$^{-2}$ and acceleration energy of 50 keV, and boron fluoride ions for the surface contact layer are implanted with a dose of $1 \times 10^{15}$ cm$^{-2}$ and acceleration energy of 80 keV. Impurity concentration distributions about the FZ-N substrate with such successive three layers being formed when laser annealing is carried out with the delay time of the pulsed beam varied are measured by the SR method. In addition, an impurity concentration distribution for the case when electric furnace annealing was carried out is also measured for comparison.

The laser annealing is carried out using two laser irradiation devices of the YAG2ω laser with the irradiation energy density of the pulsed beam of each laser irradiation device being 2.0 J/cm$^2$, the total irradiation energy density being 4.0 J/cm$^2$, and the full-width at half maximum being 100 ns. FIG. 29 shows respective impurity concentration distributions when laser irradiation is carried out using such YAG2ω laser irradiation devices with the delay times of the pulsed beams being none (0 ns), equal to the full-width at half maximum (100 ns), two times the full-width at half maximum (200 ns), three times the full-width at half maximum (300 ns), five times the full-width at half maximum (500 ns) and eight times the full-width at half maximum (800 ns).

Figure 30:
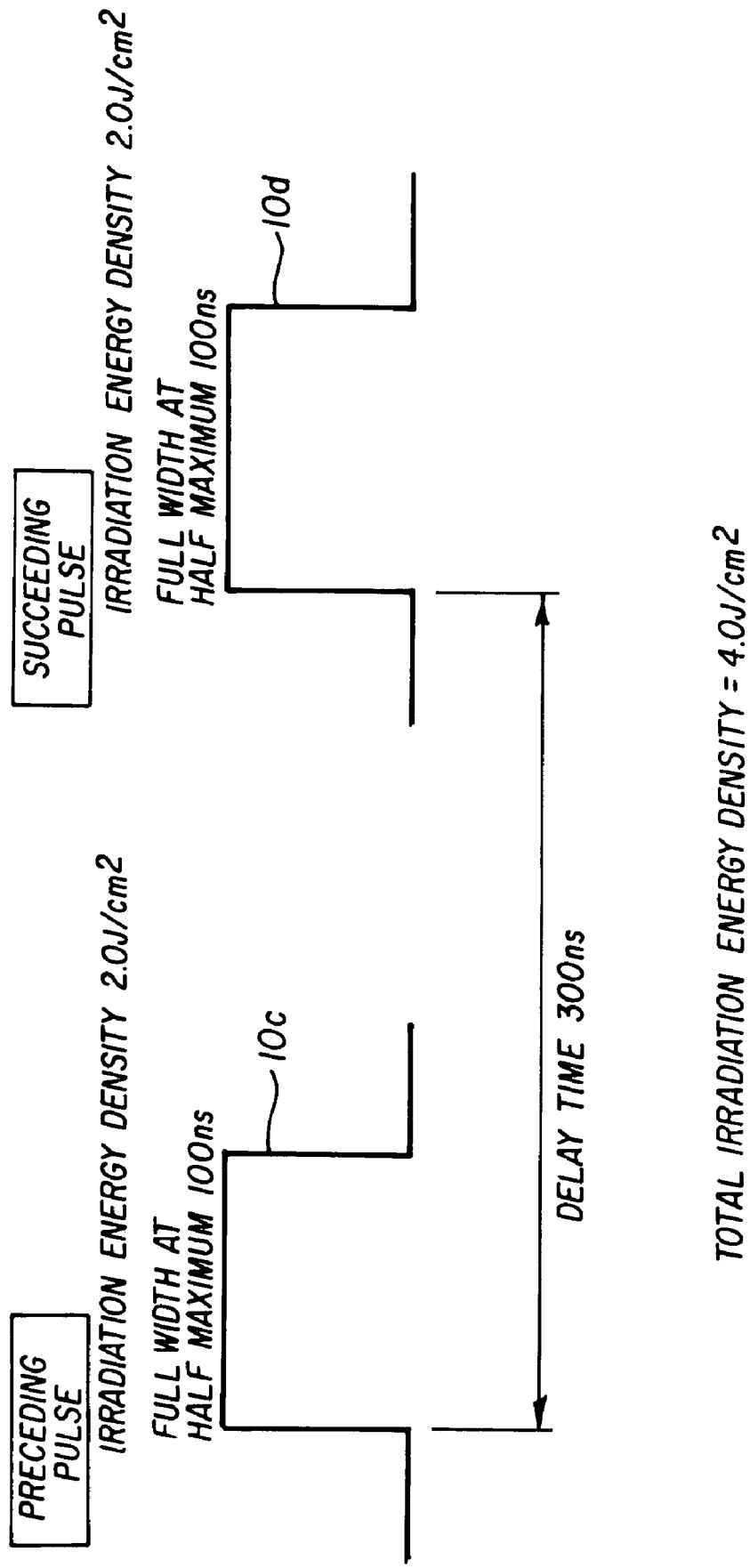
FIG. 30 is a view showing relationship between irradiation energy densities and a delay time about two pulsed beams.

For example, in the case in which the pulsed beam of the YAG2ω laser projected from each of the two laser irradiation devices has an irradiation energy density of 2.0 J/cm$^2$, a full-width at half maximum of 100 ns and a delay time of 300 ns, a preceding pulsed beam 10c and a succeeding pulsed beam 10d, projected from the respective laser irradiation devices, are offset to each other by a time of 300 ns with total irradiation energy density becoming 4.0 J/cm$^2$, as shown in FIG. 30.

In the impurity concentration measurements shown in FIG. 29, the overlapping ratio of the pulsed beams of the respective laser irradiation devices was 90% and was constant. As to the electric furnace annealing, the impurity concentration distribution is shown which was obtained when the annealing was carried out at 400° C. for an hour.

From FIG. 29, it is known that the n-layer in the deep region from the surface is activated more with the delay times of 0 ns, 100 ns, 200 ns, 800 ns, 500 ns and 300 ns in that order. In particular, enhancement of the impurity concentration is enhanced when the delay times are 500 ns and 300 ns. This shows that heat can be most effectively transmitted to the deep region when the delay times are as above. Namely, heat generated in and absorbed into the surface contact layer is transmitted to the p-layer provided beneath and further to the n-layer provided beneath to be absorbed therein.

Compared with this, enhancement of the impurity concentration in the n-layer in the deep region is not as enhanced when the delay times are 0 ns and 100 ns. This is because the delay times between pulsed beams in the cases are shorter compared with the delay times of 500 ns and 300 ns in the above cases. Namely, such shorter delay times make it difficult to obtain the effect of recrystallizing the amorphous layer by laser irradiation. Moreover, ablation also functions to make it difficult to transmit heat to the deep region. Furthermore, the delay time increased up to 800 ns makes it impossible to maintain the substrate temperature necessary for activation to results in suppression of enhancement of the impurity concentration in the deep region. Thus, when the delay time of the projected pulsed beam is within the range of 300 ns to 500 ns in laser annealing of the successive three layers formed in the FS type IGBT, an effect of enhancing impurity concentration becomes remarkable.

Next, a detailed explanation will be made about the delay time of the pulsed beam, with the following case taken as an example. In this case, a single p-layer formed on the bottom surface side of an NPT type IGBT or a reverse-blocking IGBT is activated.

Figure 31:
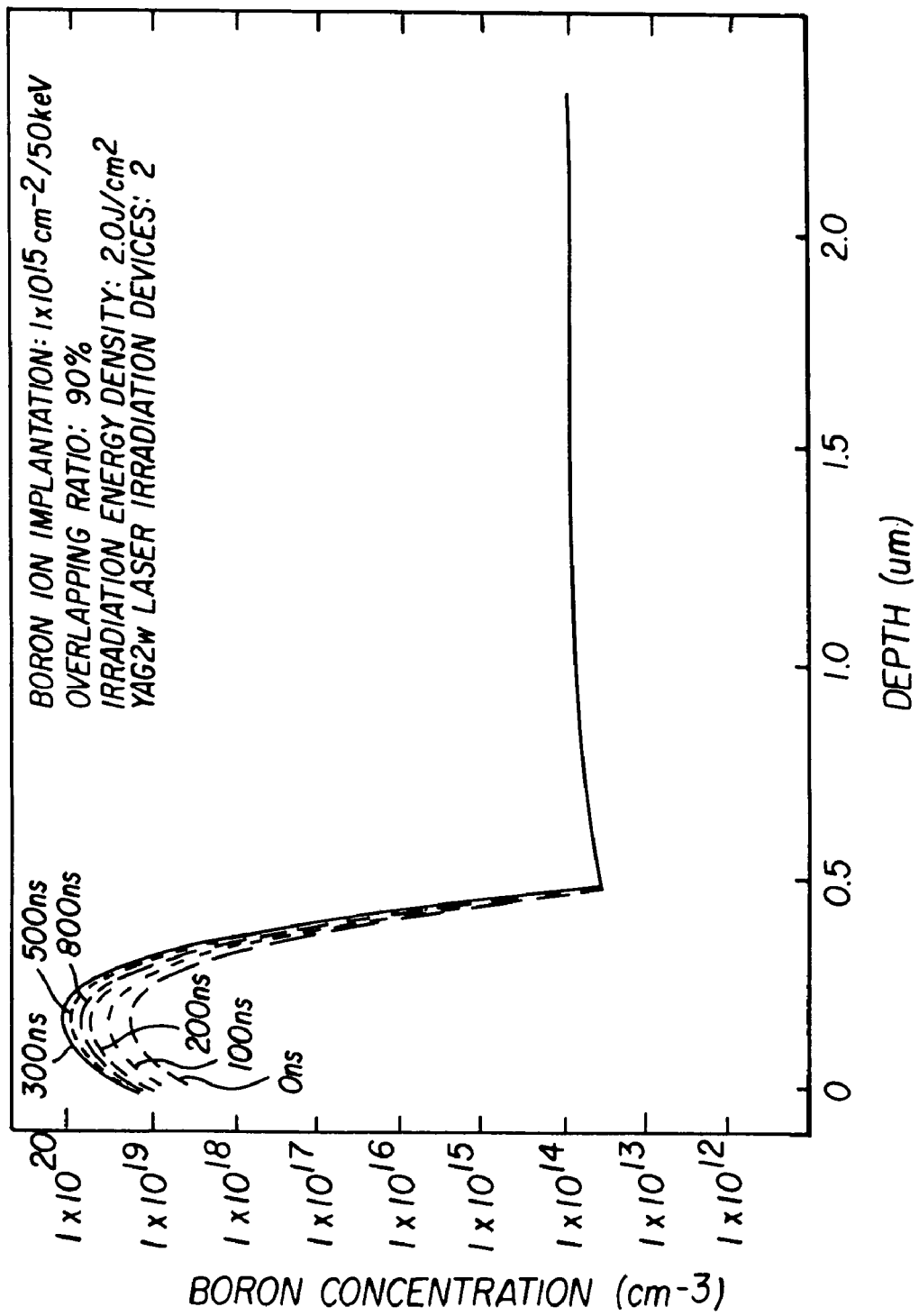
FIG. 31 is a diagram showing relationship of boron concentration distributions with delay times of the pulsed beams in activation of a single p-layer.

FIG. 31 is a diagram showing the relationship of boron concentration distributions with delay times of the pulsed beams in the activation of the single p-layer. In FIG. 31, the horizontal axis represents the depth ($\mu$m) from the top surface of the FZ-N substrate and the vertical axis represents boron concentration ($cm^{-3}$). Boron ions are implanted onto the FZ-N substrate with a dose of $1 \times 10^{15}$ $cm^{-2}$ and acceleration energy of 50 keV. About the FZ-N substrate with such single p-layer being formed, impurity concentration distributions when laser annealing was carried out with the delay time of the pulsed beam varied are measured by the SR method.

The laser annealing is carried out using two laser irradiation devices of the YAG2$\omega$ laser with the irradiation energy density of the pulsed beam of each laser irradiation device being 1.0 $J/cm^2$, the total irradiation energy density taken being 2.0 $J/cm^2$, and the full-width at half maximum being 100 ns. FIG. 31 shows respective impurity concentration distributions when laser irradiation is carried out using YAG2$\omega$ laser irradiation devices with the delay times of the pulsed beams being none (0 ns), equal to the full-width at half maximum (100 ns), two times the full-width at half maximum (200 ns), three times (300 ns), five times (500 ns) and eight times (800 ns). The overlapping ratio of the pulsed beams of the respective laser irradiation devices was 90% and was constant.

From FIG. 31, like from the above FIG. 29, it is known that the n-layer in the deep region from the surface is activated more with the delay times of 0 ns, 100 ns, 200 ns, 800 ns, 500 ns and 300 ns, in that order. In particular, enhancement of the impurity concentration is enhanced when the delay times are 500 ns and 300 ns. In such a single p-layer, the rate of activation usually becomes 70% or more irrespective of the delay time. Furthermore, with the delay time of 500 ns, the activation ratio becomes 91%, and with the delay time of 300 ns, the activation ratio becomes 92%. Thus, with both of these delay times, it becomes possible to obtain high activation ratios of 90% or more. When the delay times are 0 ns and 100 ns, the short delay time between pulsed beams causes the amorphous layer to remain in the p-layer irradiated by the laser. However, by carrying out laser irradiation with adequate delay times provided as 300 ns and 500 ns, recrystallization of the amorphous layer is accelerated to make it possible to form a p-layer with few defects. Moreover, like in the case as shown in the above FIG. 29, the delay time increased up to 800 ns makes it impossible to maintain the substrate temperature necessary for activation to results in suppression of enhancement of the impurity concentration in the deep region.

In this way, in the laser annealing of the single p-layer formed in the NPT type IGBT or the reverse-blocking IGBT, when the delay time of the projected pulsed beam is within the range of 300 ns to 500 ns, an effect of enhancing impurity concentration becomes remarkable.

In the sixth mode, although the explanation was made about the case in which the YAG2$\omega$ laser was used, the effect of enhancing impurity concentration in the doped layer region similarly is particularly remarkable when the delay time of the projected pulsed beam is within the range of 150 ns to 250 ns when XeCl laser is used with pulsed beams having a full-width at half maximum of 50 ns for one pulse.

Therefore, in the activation by laser annealing using the XeCl laser or the YAG2$\omega$ laser, the range of the delay time is desirably three times to five times the half width of the pulsed beam. This can satisfy requirements such as sufficient heat transmission from the substrate surface to the deep region, recrystallization in the doped layer region and maintenance of the substrate temperature.

Next, an explanation will be made about a seventh mode. A detailed explanation will be made about the overlapping ratio of the pulsed beam, with the following case first taken as an example. In this case, successive three layers are activated in which, like in the above sixth mode, a p-layer as a surface contact layer is formed on pn-successive layers by implanting phosphorus ions, boron ions and boron fluoride ions onto the FZ-N substrate of the FS type IGBT.

Figure 32:
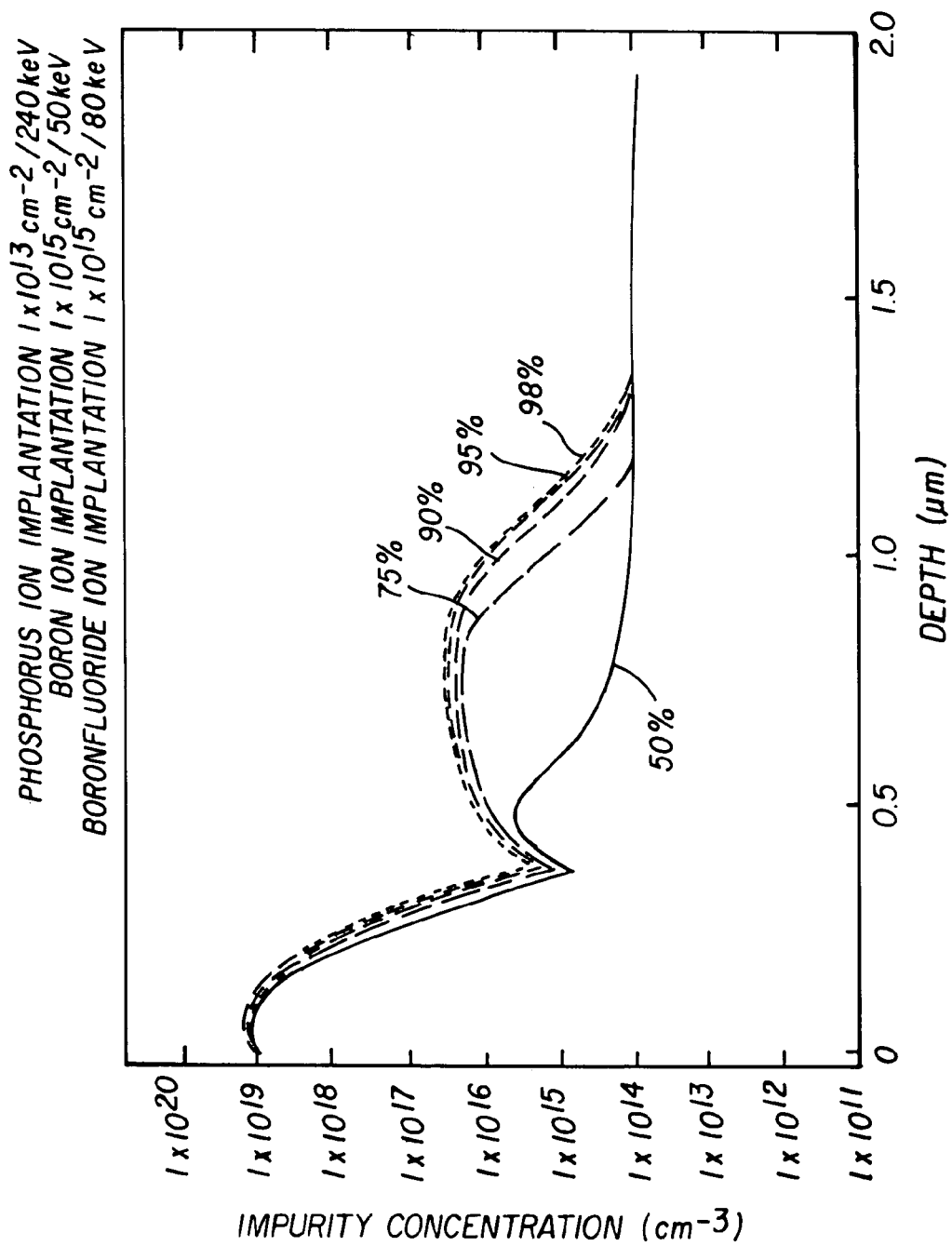
FIG. 32 is a diagram showing relationship of impurity concentration distributions with overlapping ratios of the pulsed beams in activation of three successive layers.

FIG. 32 is a diagram showing the relationship of impurity concentration distributions with overlapping ratios of the pulsed beams in the activation of the three successive layers. In FIG. 32, the horizontal axis represents the depth ($\mu$m) from the top surface of the FZ-N substrate and the vertical axis represents the impurity concentration ($cm^{-3}$). Phosphorus ions for the n-layer are implanted onto the FZ-N substrate with a dose of $1 \times 10^{13}$ $cm^{-2}$ and acceleration energy of 240 keV, boron ions for the p-layer are implanted with a dose of $1 \times 10^{15}$ $cm^{-2}$ and acceleration energy of 50 keV, and boron fluoride ions for the surface contact layer are implanted with a dose of $1 \times 10^{15}$ $cm^{-2}$ and acceleration energy of 80 keV. Impurity concentration distributions about the FZ-N substrate with such successive three layers being formed when laser annealing is carried out with the overlapping ratio of the pulsed beams varied are measured by the SR method.

Laser annealing is carried out using two laser irradiation devices of the YAG2$\omega$ laser with the irradiation energy density of the pulsed beam of each laser irradiation device being 2.0 $J/cm^2$, the total irradiation energy density being 4.0 $J/cm^2$, and the full-width at half maximum being 100 ns. FIG. 32 shows respective impurity concentration distributions when laser irradiation is carried out using such YAG2$\omega$ laser irradiation devices with the overlapping ratios of the pulsed beams being 50%, 75%, 90%, 95% and 98%, respectively. In the impurity concentration distribution measurement shown in FIG. 32, the delay time between the pulsed beams of the respective laser irradiation devices was 300 ns, which was held constant.

From FIG. 32, it is known that the activation of the deep region begins at an overlapping ratio of 50%. Moreover, as the overlapping ratio is increased, enhancement of the impurity concentration in the n-layer in the deep region is advanced. This is because the number of irradiations to the same region is increased with an increase in the overlapping ratio to make heat easily transmitted also to the deep region. Heat is not yet effectively transmitted to the deep region at an overlapping ratio of 50%, but can be effectively transmitted to the deep region at an overlapping ratio of 75% or more.

Therefore, in the laser annealing of the successive three layers formed in the FS type IGBT, when the overlapping ratio of the projected pulsed beams is in the range between 75% and 98%, an effect of enhancing impurity concentration becomes remarkable. At an overlapping ratio of 98%, the impurity concentration shows little variation from that with the overlapping ratio at 95%, indicating a saturated state. The larger the overlapping ratio is made, the longer the time for processing a wafer becomes. Therefore, there is little merit in increasing the overlapping ratio up to 98%.

Next, a detailed explanation will be made about the overlapping ratio of the pulsed beams, with the following case taken as an example. In this case, a single p-layer is activated which is, like in the above sixth mode, formed on the bottom surface side of an NPT type IGBT or a reverse-blocking IGBT.

Figure 33:
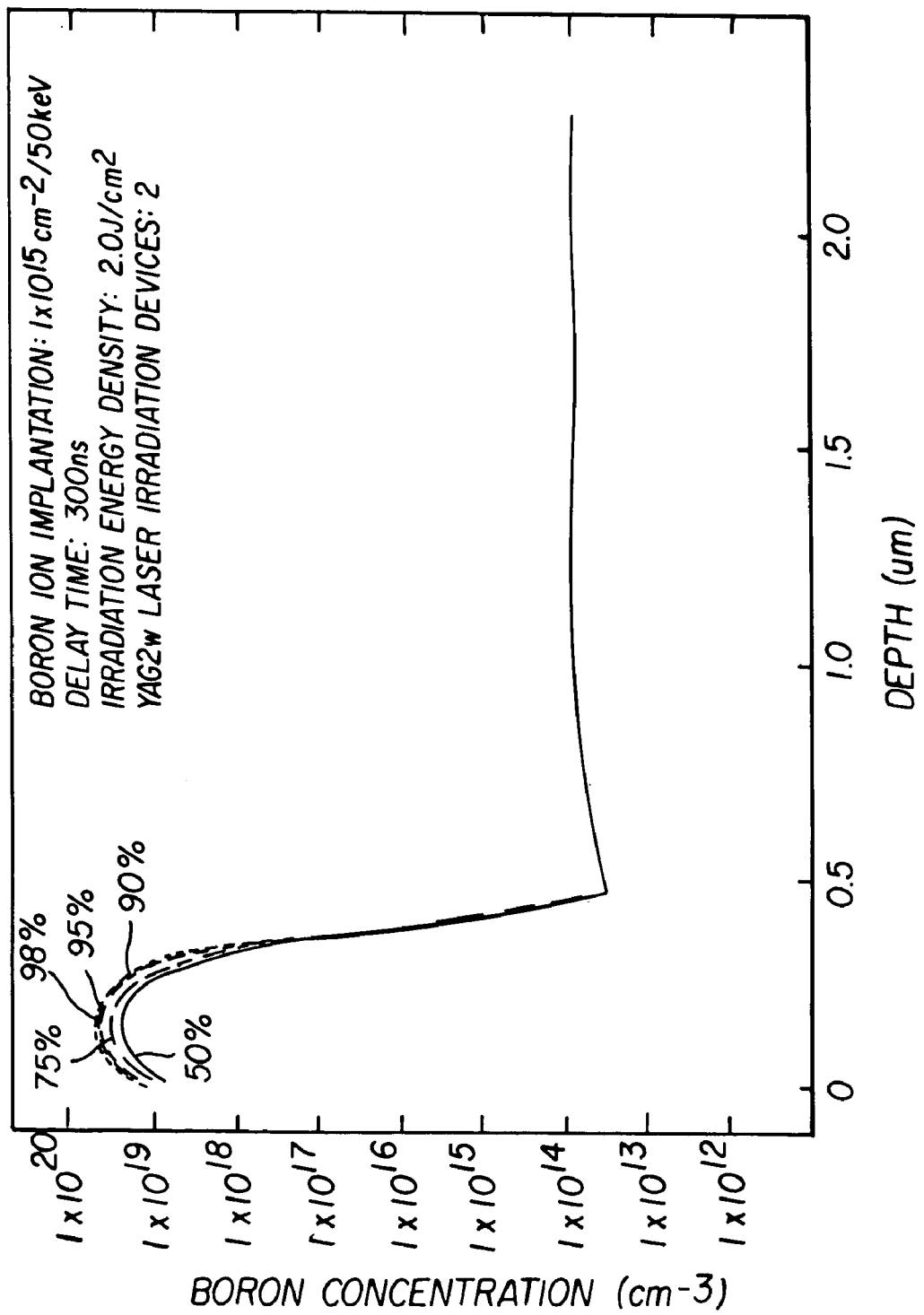
FIG. 33 is a diagram showing relationship of boron concentration distributions with overlapping ratios of the pulsed beams in activation of a single p-layer.
Figure 34:
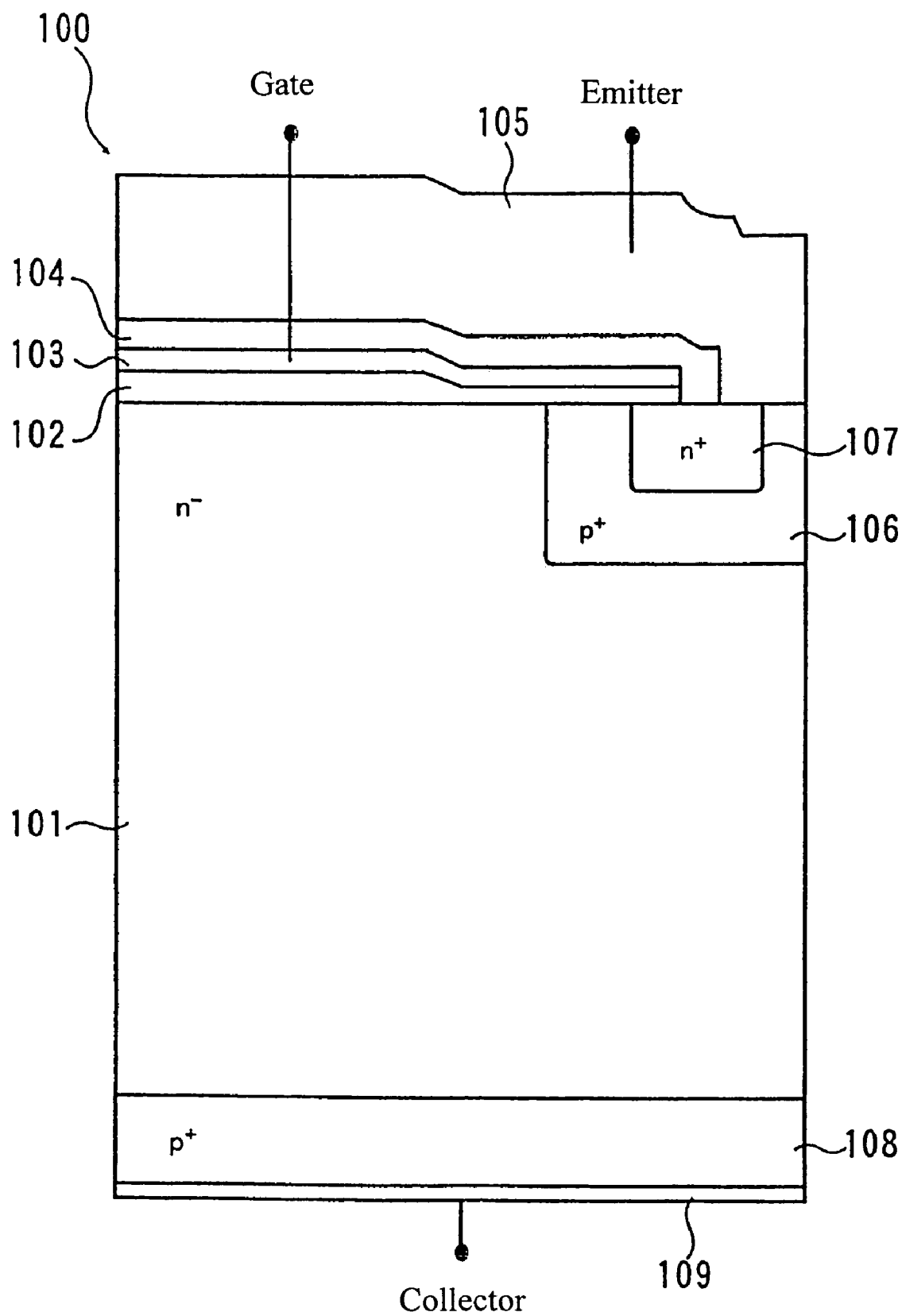
FIG. 34 is a view showing an example of a cross sectional structure of an NPT type IGBT.
Figure 35:
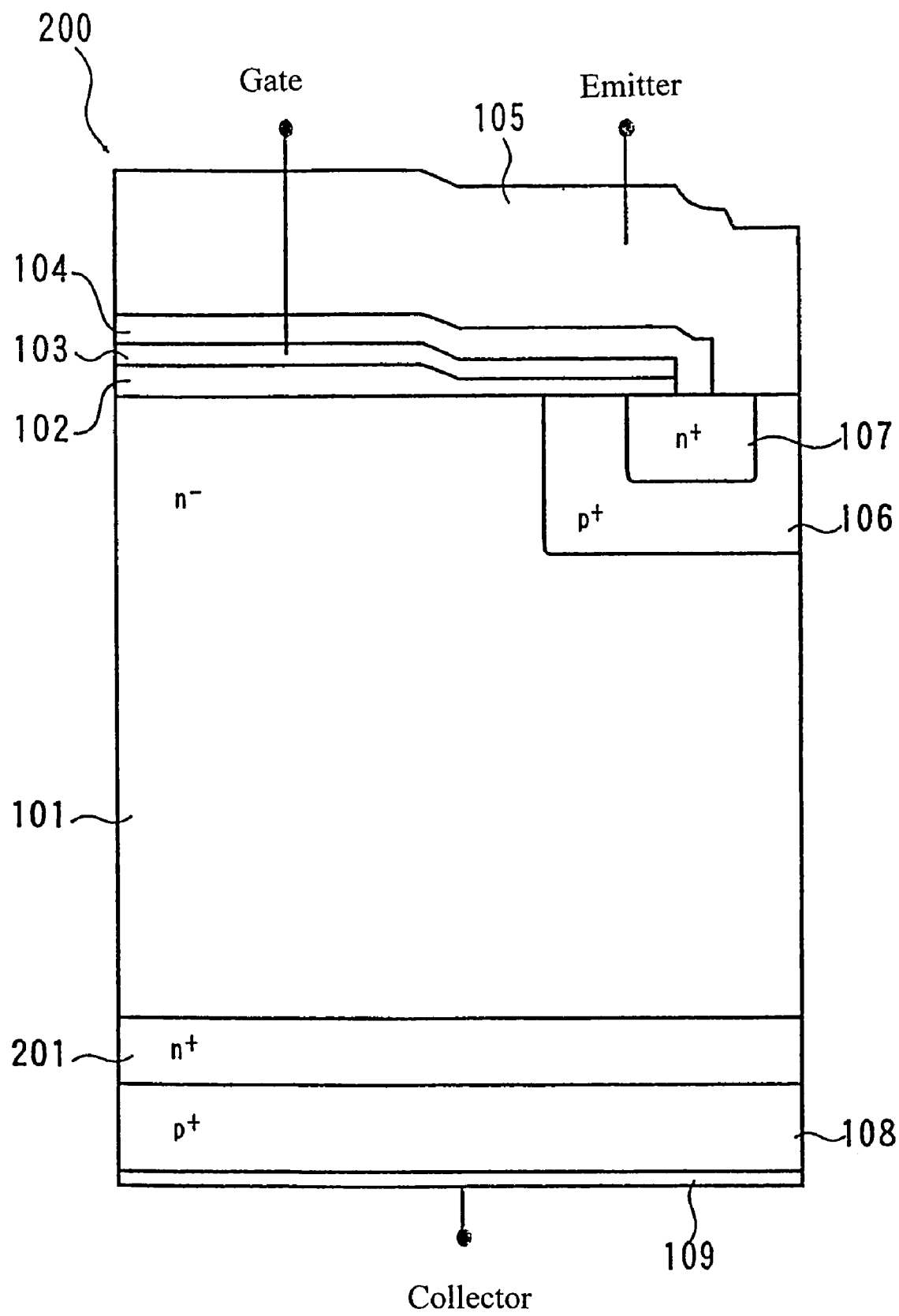
FIG. 35 is a view showing an example of a cross sectional structure of an FS type IGBT.
Figure 36:
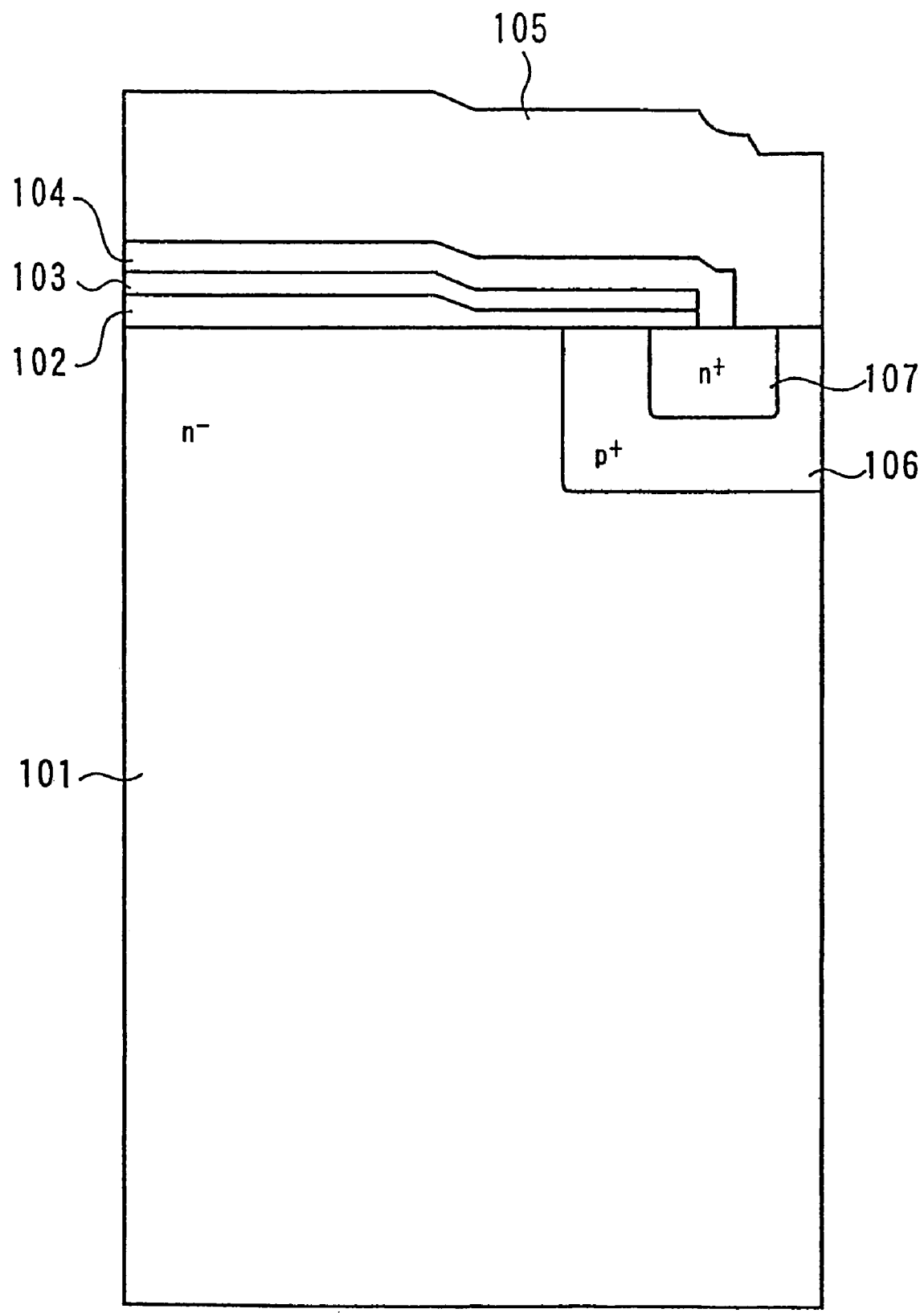
FIG. 36 is a cross sectional view showing a state after a top surface side process has been completed.
Figure 37:
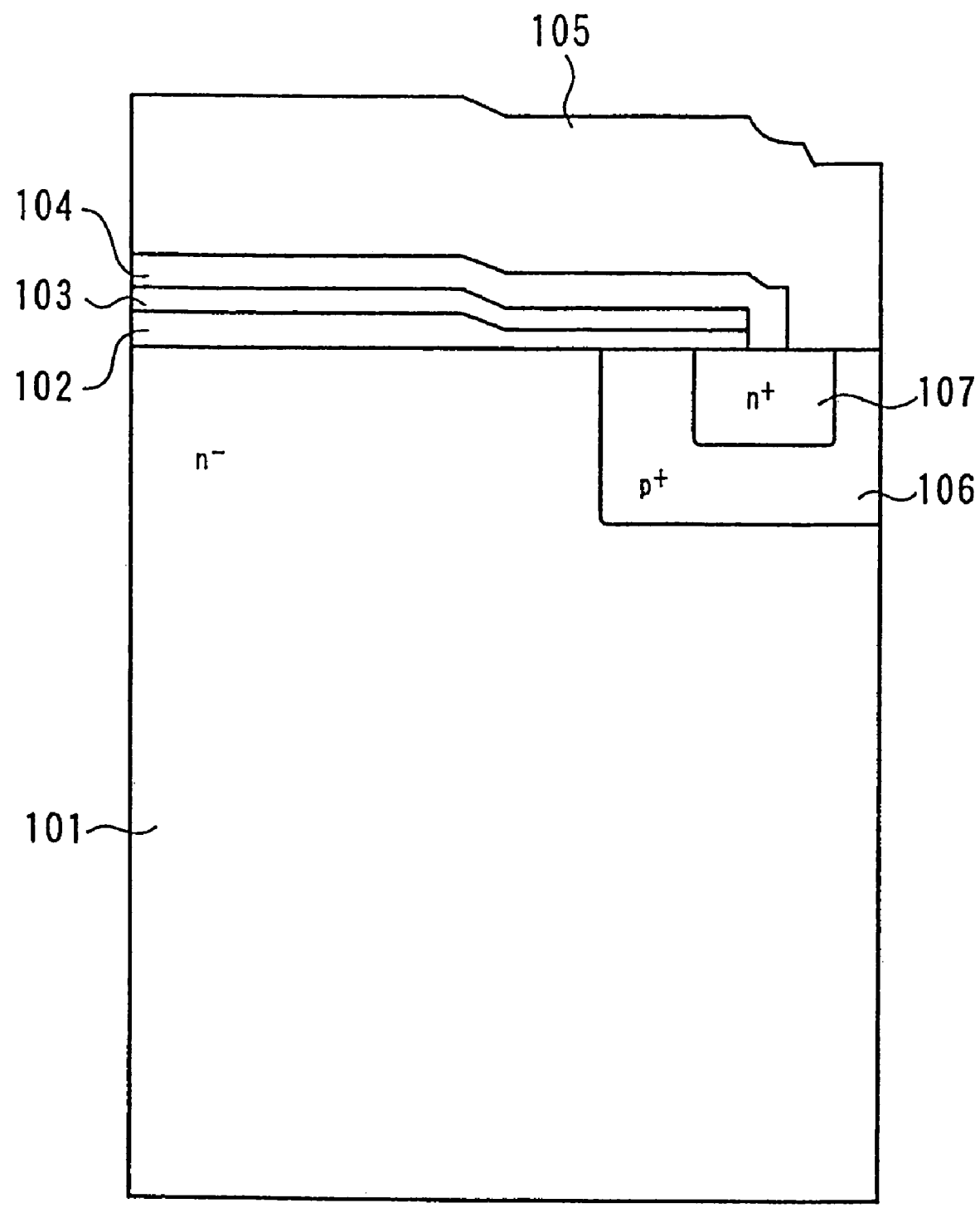
FIG. 37 is a cross sectional view showing a state in a substrate grinding process.
Figure 38:
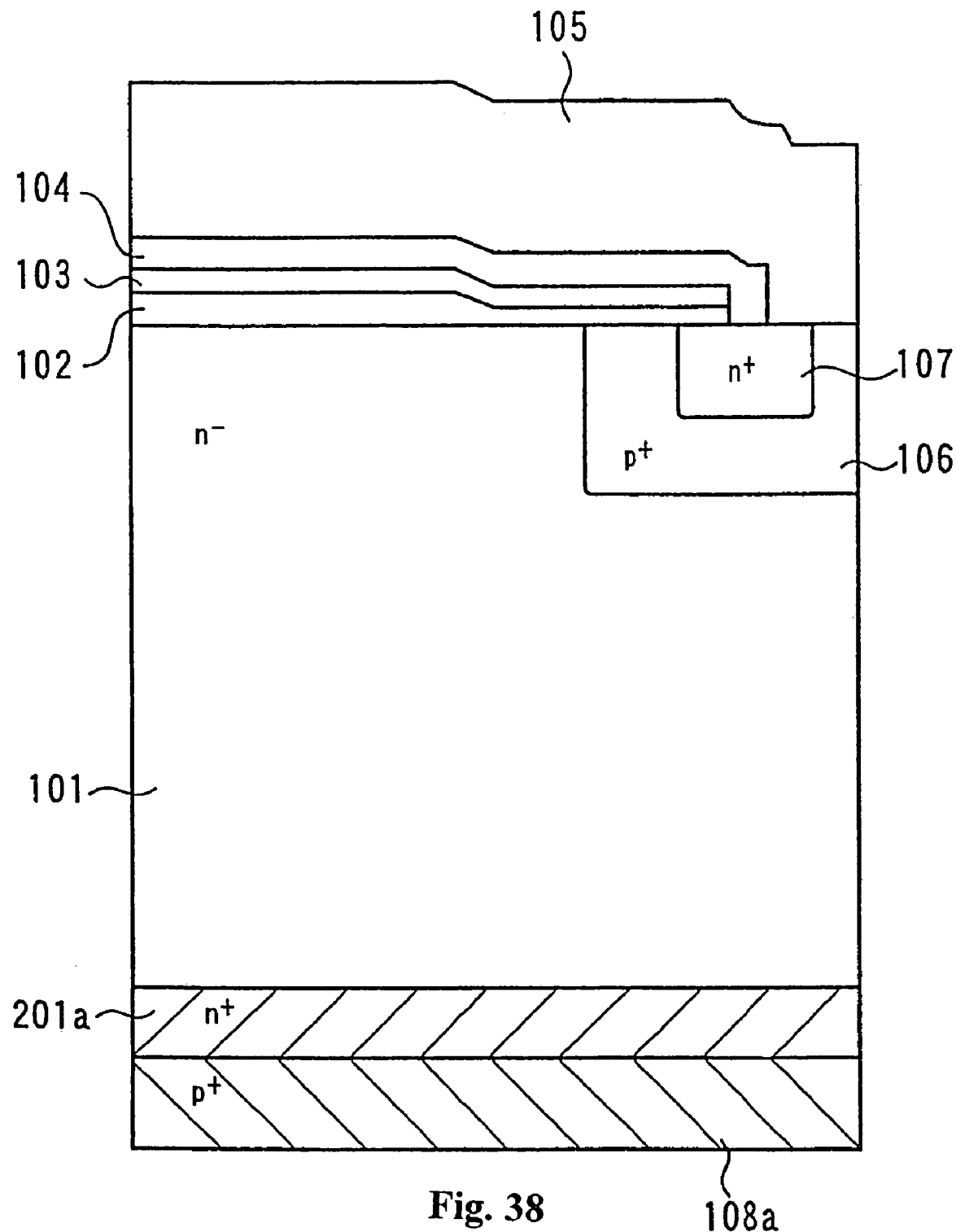
FIG. 38 is a cross sectional view showing a state in a bottom surface side ion implantation process.
Figure 39:
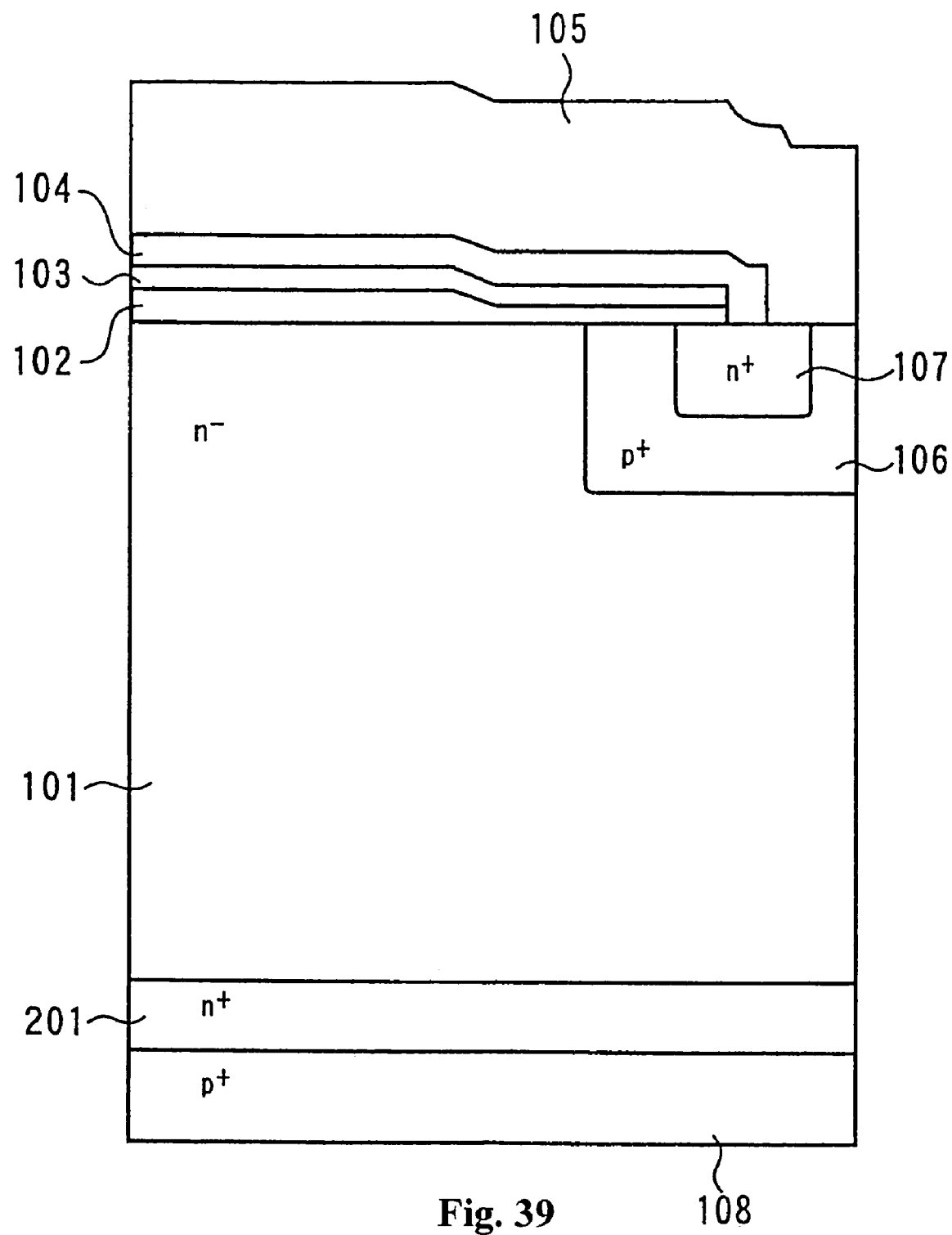
FIG. 39 is a cross sectional view showing a state in a bottom surface annealing process.
Figure 40:
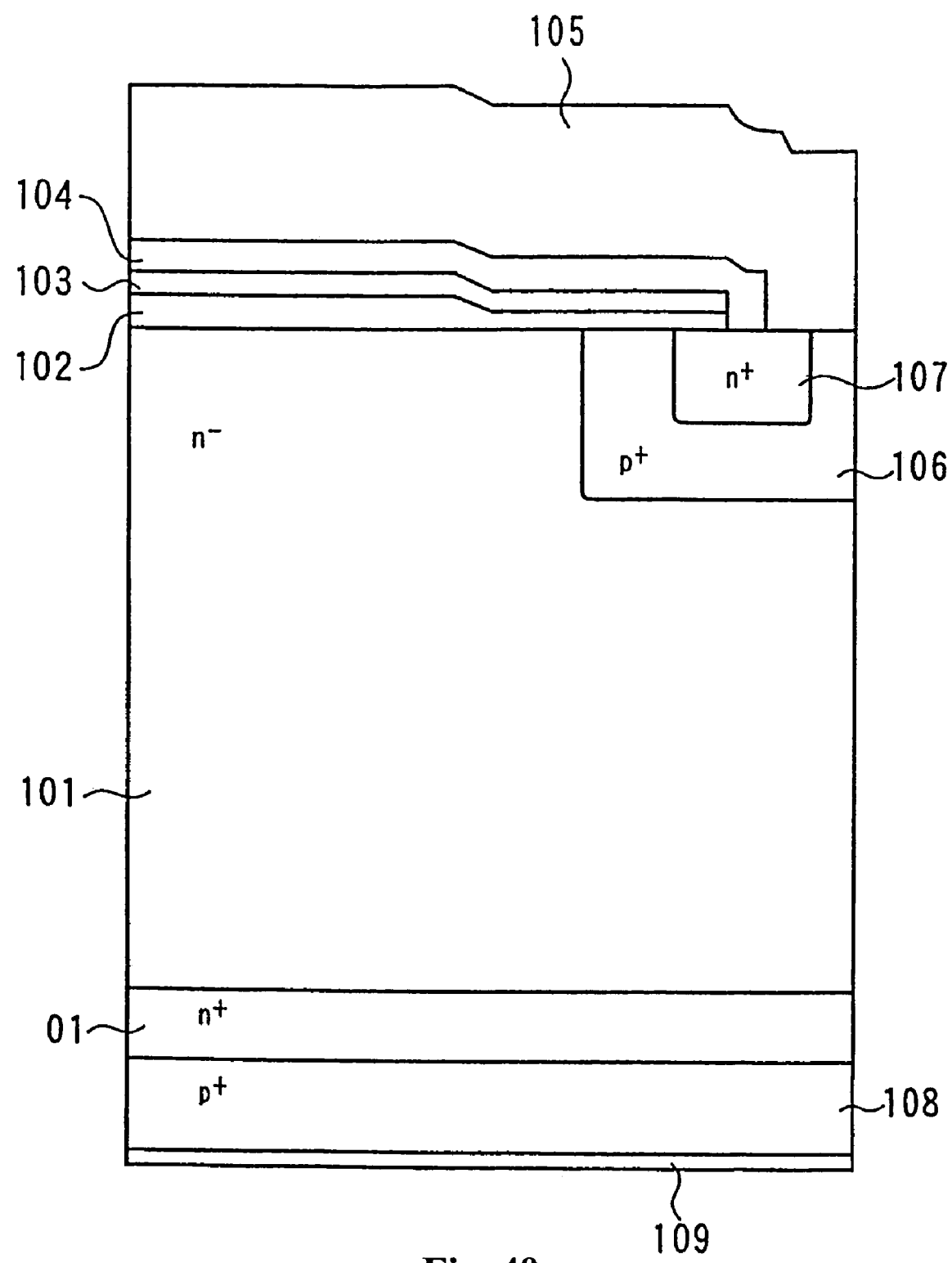
FIG. 40 is a cross sectional view showing a state in a top surface electrode film forming process.
Figure 41:
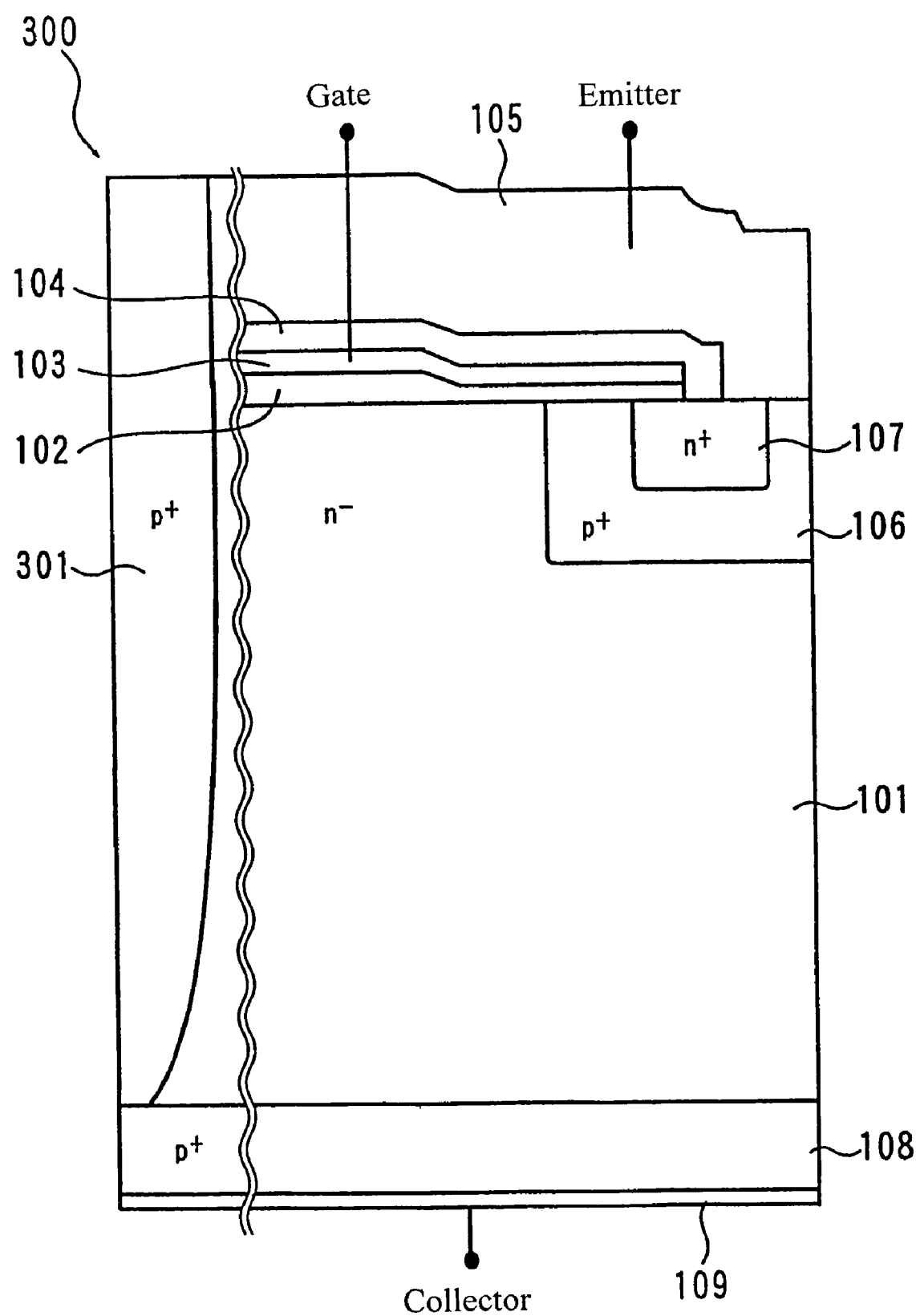
FIG. 41 is a view showing an example of a cross sectional structure of a reverse-blocking IGBT.

FIG. 33 is a diagram showing the relationship of boron concentration distributions with overlapping ratios of the pulsed beams in the activation of the single p-layer. In FIG. 33, the horizontal axis represents the depth (μm) from the top surface of the FZ-N substrate and the vertical axis represents the impurity concentration ($cm^{-3}$). Boron ions are implanted onto the FZ-N substrate with a dose of $1 \times 10^{15}$ $cm^{-2}$ and acceleration energy of 50 keV. Impurity concentration distributions about the FZ-N substrate with such single p-layer being formed by laser annealing with various overlapping ratios for the pulsed beams are measured by the SR method.

The laser annealing is carried out using two laser irradiation devices of the YAG2ω laser with the irradiation energy density of the pulsed beam of each laser irradiation device being 1.0 $J/cm^2$, the total irradiation energy density being 2.0 $J/cm^2$, and the full-width at half maximum being 100 ns. FIG. 33 shows respective boron concentration distributions when laser irradiation is carried out using such YAG2ω laser irradiation devices with the overlapping ratios of the pulsed beams being 50%, 75%, 90%, 95% and 98%, respectively. The delay time between the pulsed beams of the respective laser irradiation devices was 300 ns, which was held constant.

It is known from FIG. 33 that enhancement of concentration of boron is enhanced and little variation is observed in the boron concentration distribution at an overlapping ratio of 75% or more. This is because the doped layer region as an object of activation is a single layer. The activation ratio becomes 80% even at an overlapping ratio of 50%. Furthermore, at an overlapping ratio of 75% or more, the activation ratio becomes 90% or more. Moreover, with the overlapping ratio made larger, recrystallization of the amorphous layer is accelerated to make it possible to form a p-layer with few defects. Thus, in the laser annealing of the single p-layer formed in the NPT type IGBT or the reverse-blocking IGBT, when the overlapping ratio of the projected pulsed beams is within the range between 50% and 98%, an effect of enhancing the boron concentration becomes remarkable.

In the seventh mode, although the explanation was made about the case in which the YAG2ω laser was used, the effect of enhancing impurity concentration in the doped layer region was similarly remarkable when the overlapping ratio of the projected pulsed beams is within the range between 50% and 98%, and in particular, between 75% and 95%, in the case where XeCl laser was used. From the above explanation, in the activation by laser annealing using the XeCl laser or the YAG2ω laser, the overlapping ratio of the pulsed beams desirably is within the range between 50% and 98%, and more preferably, between 75% and 95%.

The "overlapping ratio" in the above explanations means the rate of making the pulsed beams overlapped in the scanning direction of the pulsed beams in the laser irradiation. For example, in the usual laser annealing, when the scanning direction is the X direction, the pulsed beams are made overlapped at a proper overlapping ratio in the X direction while being overlapped by a slight amount (of the order of 0.5 mm) in the Y direction. When there is no particular limitation in a time required for the laser annealing, the annealing can be carried out with the overlapping ratios in both X and Y directions being large.

Moreover, in the same way as explained about the above first to fifth modes, also in the sixth and seventh modes, the activation of the p-layer and the n-layer can be realized in a very short time of the order of nanoseconds in the technology of forming a thin wafer by the method of securing a wafer on a supporting substrate by an adhesive sheet. Also in the case when no adhesive sheet is used, the laser annealing can be of course also carried out together with the electric furnace annealing. Furthermore, the laser annealing conditions (the delay times and the overlapping ratios) explained in the sixth and seventh modes can be applied to the laser annealing in the above first to fifth modes.

In the above, explanations were made with the IGBT taken as an example. The invention, however, is not limited to the IGBT but can be widely applied to all of ICs for activating pn-successive layers, pp-successive layers, nn-successive layers, or a p-layer or an n-layer provided from a deep region to a shallow region in a short time of the order of nanoseconds regardless of whether the layer is provided on the top surface side or the bottom surface side. Thus, many modifications and variations may be made to the techniques and structures described and illustrated herein without departing from the spirit and scope of the invention. Accordingly, it should be understood that the methods described herein are illustrative only and are not limiting upon the scope of the invention.

What is claimed is:

1. A method of activating, in a semiconductor element, impurity layers in which a different conductivity type impurity has been introduced, comprising irradiating successively and with a delay time, areas in the doped layer region with a plurality of laser irradiation devices each carrying out irradiation with a pulsed laser beam, thereby to activate the doped layer region wherein each pulsed beam has an energy distribution that is approximately rectangular and wherein the pulsed beams are overlapped so that each irradiation area in the doped layer region is irradiated with approximately the same irradiation energy density, in order to activate deep regions of said semiconductor element without increasing the laser energy of an individual pulsed beam and causing damage to the surface.

2. The method of activating a doped layer region as claimed in claim 1, wherein the doped layer region comprises pn-successive layers, in which a p-type doped layer into which p-type impurities have been introduced and an n-type doped layer into which n-type impurities have been introduced have been successively formed.

3. The method of activating a doped layer region as claimed in claim 1, wherein the doped layer region comprises successive layers of the same conductivity type into which the same conductivity type impurity ions have been introduced with differing doses and amounts of acceleration energy.

4. The method of activating a doped layer region as claimed in claim 1, wherein the doped layer region comprises successive layers of an argon introduced layer into which argon has been introduced and a p-type doped layer into which p-type impurities have been introduced.

5. The method of activating a doped layer region as claimed in claim 1, wherein the doped layer region comprises successive layers of an argon introduced layer into which argon has been introduced and an n-type doped layer into which n-type impurities have been introduced.

6. The method of activating a doped layer region as claimed in claim 1, wherein the doped layer region comprises successive layers of a silicon introduced layer into which silicon has been introduced and a p-type doped layer into which p-type impurities have been introduced.

7. The method of activating a doped layer region as claimed in claim 1, wherein the doped layer region comprises successive layers of a silicon introduced layer into which silicon has been introduced and an n-type doped layer into which n-type impurities have been introduced.

8. The method of activating a doped layer region as claimed in claim 1, wherein the pulsed beams are overlapped with an overlapping ratio between 50% and 98%.

9. The method of activating a doped layer region as claimed in claim 1, wherein the pulsed beams are overlapped with an overlapping ratio between 75% and 95%.

10. The method of activating a doped layer region as claimed in claim 1, wherein the pulsed laser beam has a wavelength between 300 nm and 600 nm.

11. The method of activating a doped layer region as claimed in claim 1, wherein the doped layer region is successively irradiated with pulsed beams with a total irradiation energy density between about 1.2 $J/cm^2$ and 4.0 $J/cm^2$.

12. The method of activating a doped layer region as claimed in claim 1, wherein the doped layer region is successively irradiated with pulsed beams with a delay time between about 0 ns and 5000 ns.

13. The method of activating a doped layer region as claimed in claim 1, wherein the doped layer region is successively irradiated with pulsed beams with a delay time in the range from three times to five times a full-width at half maximum of the pulsed beam.

14. The method of activating a doped layer region as claimed in claim 1, wherein the pulsed laser beam is a second haronic of a YAG laser.

* * * * *